United States Patent
Lin

(10) Patent No.: US 6,908,788 B1
(45) Date of Patent: *Jun. 21, 2005

(54) METHOD OF CONNECTING A CONDUCTIVE TRACE TO A SEMICONDUCTOR CHIP USING A METAL BASE

(75) Inventor: Charles W. C. Lin, Singapore (SG)

(73) Assignee: Bridge Semiconductor Corporation, Taipei (TW)

( * ) Notice: Subject to any disclaimer, the term of this patent is extended or adjusted under 35 U.S.C. 154(b) by 0 days.

This patent is subject to a terminal disclaimer.

(21) Appl. No.: 10/639,990

(22) Filed: Aug. 13, 2003

Related U.S. Application Data

(63) Continuation-in-part of application No. 09/962,754, filed on Sep. 24, 2001, now Pat. No. 6,673,710, which is a continuation-in-part of application No. 09/878,626, filed on Jun. 11, 2001, now Pat. No. 6,653,217, which is a continuation-in-part of application No. 09/687,619, filed on Oct. 13, 2000, now Pat. No. 6,440,835.

(51) Int. Cl.[7] .......................... H01L 21/44; H01L 21/48; H01L 21/50

(52) U.S. Cl. ...................... 438/106; 438/107; 438/110; 438/113

(58) Field of Search ................................. 438/113, 106, 438/107, 114, 110

(56) References Cited

U.S. PATENT DOCUMENTS

| | | | |
|---|---|---|---|
| 4,442,967 A | 4/1984 | van de Pas et al. | 228/159 |
| 4,661,192 A | 4/1987 | McShane | 156/292 |
| 4,717,066 A | 1/1988 | Goldenberg et al. | 228/179 |
| 4,750,666 A | 6/1988 | Neugebauer et al. | 228/160 |
| 4,807,021 A | 2/1989 | Okumura | 357/75 |
| 4,925,083 A | 5/1990 | Farassat et al. | 228/102 |

(Continued)

FOREIGN PATENT DOCUMENTS

| | | | |
|---|---|---|---|
| EP | 0 718 882 A1 | 6/1996 | H01L/23/057 |
| WO | WO 97/38563 | 10/1997 | H05K/1/03 |
| WO | WO 99/57762 | 11/1999 | H01L/23/48 |

OTHER PUBLICATIONS

Markstein et al., "Controlling the Variables in Stencil Printing," Electronic Packaging & Production, Feb. 1997, pp. 48–56.

Elenius, "Choosing a Flip Chip Bumping Supplier—Technology an IC Package contractor should look for," Advanced Packaging, Mar./Apr. 1998, pp. 70–73.

(Continued)

*Primary Examiner*—Matthew Smith
*Assistant Examiner*—Chuong Anh Luu
(74) *Attorney, Agent, or Firm*—David M. Sigmond

(57) ABSTRACT

A method of connecting a conductive trace to a semiconductor chip includes providing a semiconductor chip, a conductive trace and a metal base, wherein the chip includes a conductive pad, and the conductive trace is disposed between the metal base and the chip, then forming a through-hole that extends through the metal base and exposes the conductive trace and the pad, then forming a connection joint that contacts and electrically connects the conductive trace and the pad in the through-hole, and then etching the metal base, thereby reducing contact area between the metal base and another material. Preferably, the through-hole extends through an insulative adhesive that attaches the conductive trace to the chip, and etching the metal base reduces contact area between the metal base and the connection joint.

200 Claims, 79 Drawing Sheets

U.S. PATENT DOCUMENTS

| | | | |
|---|---|---|---|
| 4,937,653 A | 6/1990 | Blonder et al. ............... 357/68 |
| 4,955,523 A | 9/1990 | Calomagno et al. ........ 228/179 |
| 4,970,571 A | 11/1990 | Yamakawa et al. ........... 357/71 |
| 4,984,358 A | 1/1991 | Nelson ........................ 29/830 |
| 5,014,111 A | 5/1991 | Tsuda et al. .................. 357/68 |
| 5,060,843 A | 10/1991 | Yasuzato et al. ............ 228/179 |
| 5,074,947 A | 12/1991 | Estes et al. .............. 156/307.3 |
| 5,090,119 A | 2/1992 | Tsuda et al. ................. 29/843 |
| 5,106,461 A | 4/1992 | Volfson et al. ............. 205/125 |
| 5,116,463 A | 5/1992 | Lin et al. .................... 156/653 |
| 5,137,845 A | 8/1992 | Lochon et al. .............. 437/183 |
| 5,167,992 A | 12/1992 | Lin et al. .................... 427/437 |
| 5,172,851 A | 12/1992 | Matsushita et al. ......... 228/179 |
| 5,196,371 A | 3/1993 | Kulesza et al. ............. 437/183 |
| 5,209,817 A | 5/1993 | Ahmad et al. .............. 156/643 |
| 5,237,130 A | 8/1993 | Kulesza et al. ............. 174/260 |
| 5,260,234 A | 11/1993 | Long ........................... 437/203 |
| 5,261,593 A | 11/1993 | Casson et al. ......... 228/180.22 |
| 5,275,330 A | 1/1994 | Issacs et al. ............. 228/180.2 |
| 5,284,796 A | 2/1994 | Nakanishi et al. .......... 437/183 |
| 5,293,067 A | 3/1994 | Thompson et al. ......... 257/668 |
| 5,294,038 A | 3/1994 | Nakano et al. .......... 228/179.1 |
| 5,327,010 A | 7/1994 | Uenaka et al. .............. 257/679 |
| 5,334,804 A | 8/1994 | Love et al. .................. 174/267 |
| 5,346,750 A | 9/1994 | Hatakeyama et al. ....... 428/209 |
| 5,355,283 A | 10/1994 | Marrs et al. ................ 361/760 |
| 5,358,621 A | 10/1994 | Oyama ....................... 205/123 |
| 5,364,004 A | 11/1994 | Davidson ..................... 228/1.1 |
| 5,397,921 A | 3/1995 | Karnezos .................... 257/779 |
| 5,407,864 A | 4/1995 | Kim ............................ 437/203 |
| 5,424,245 A | 6/1995 | Gurtler et al. .............. 437/183 |
| 5,438,477 A | 8/1995 | Pasch .......................... 361/689 |
| 5,439,162 A | 8/1995 | George et al. ......... 228/180.22 |
| 5,447,886 A | 9/1995 | Rai ............................. 437/183 |
| 5,454,161 A | 10/1995 | Beilin et al. .................. 29/852 |
| 5,454,928 A | 10/1995 | Rogers et al. .............. 205/125 |
| 5,475,236 A | 12/1995 | Yoshizaki ..................... 257/48 |
| 5,477,933 A | 12/1995 | Nguyen ...................... 174/262 |
| 5,478,007 A | 12/1995 | Marrs ..................... 228/180.22 |
| 5,483,421 A | 1/1996 | Gedney et al. ............. 361/771 |
| 5,484,647 A | 1/1996 | Nakatani et al. ............ 428/209 |
| 5,485,949 A | 1/1996 | Tomura et al. .......... 228/180.5 |
| 5,487,218 A | 1/1996 | Bhatt et al. ................... 29/852 |
| 5,489,804 A | 2/1996 | Pasch .......................... 257/778 |
| 5,493,096 A | 2/1996 | Koh ........................ 219/121.71 |
| 5,508,229 A | 4/1996 | Baker .......................... 437/183 |
| 5,525,065 A | 6/1996 | Sobhani ........................ 439/67 |
| 5,536,973 A | 7/1996 | Yamaji ........................ 257/737 |
| 5,542,601 A | 8/1996 | Fallon et al. ................ 228/119 |
| 5,547,740 A | 8/1996 | Higdon et al. .............. 428/209 |
| 5,556,810 A | 9/1996 | Fujitsu ........................ 437/209 |
| 5,556,814 A | 9/1996 | Inoue et al. ................. 437/230 |
| 5,564,181 A | 10/1996 | Dineen et al. ................ 29/841 |
| 5,572,069 A | 11/1996 | Schneider ................... 257/690 |
| 5,576,052 A | 11/1996 | Arledge et al. ............... 427/98 |
| 5,583,073 A | 12/1996 | Lin et al. .................... 439/183 |
| 5,595,943 A | 1/1997 | Itabashi et al. ............. 437/230 |
| 5,599,744 A | 2/1997 | Koh et al. ................... 437/195 |
| 5,611,140 A | 3/1997 | Kulesza et al. ............... 29/832 |
| 5,611,884 A | 3/1997 | Bearinger et al. ........... 156/325 |
| 5,613,296 A | 3/1997 | Kurino et al. ................ 29/852 |
| 5,614,114 A | 3/1997 | Owen ..................... 219/121.66 |
| 5,615,477 A | 4/1997 | Sweitzer ....................... 29/840 |
| 5,619,791 A | 4/1997 | Lambrecht, Jr. et al. ...... 29/852 |
| 5,627,405 A | 5/1997 | Chillara ....................... 257/668 |
| 5,627,406 A | 5/1997 | Pace ............................ 257/700 |
| 5,633,204 A | 5/1997 | Tago et al. .................. 438/614 |
| 5,637,920 A | 6/1997 | Loo ............................. 257/700 |
| 5,641,113 A | 6/1997 | Somaki et al. ......... 228/180.22 |
| 5,645,628 A | 7/1997 | Endo et al. ................. 106/1.23 |
| 5,646,067 A | 7/1997 | Gaul ........................... 437/180 |
| 5,648,686 A | 7/1997 | Hirano et al. ............... 257/778 |
| 5,654,584 A | 8/1997 | Fujitsu ........................ 257/666 |
| 5,656,858 A | 8/1997 | Kondo et al. ............... 257/737 |
| 5,663,598 A | 9/1997 | Lake et al. .................. 257/737 |
| 5,665,652 A | 9/1997 | Shimizu ..................... 438/127 |
| 5,666,008 A | 9/1997 | Tomita et al. ............... 257/778 |
| 5,669,545 A | 9/1997 | Pham et al. .................. 228/1.1 |
| 5,674,785 A | 10/1997 | Akram et al. ............... 437/217 |
| 5,674,787 A | 10/1997 | Zhao et al. .................. 437/230 |
| 5,682,061 A | 10/1997 | Khandros et al. ........... 257/666 |
| 5,686,353 A | 11/1997 | Yagi et al. .................. 437/183 |
| 5,691,041 A | 11/1997 | Frankeny et al. ............ 428/209 |
| 5,722,162 A | 3/1998 | Chou et al. ................... 29/852 |
| 5,723,369 A | 3/1998 | Barber ........................ 438/106 |
| 5,731,223 A | 3/1998 | Padmanabhan ............. 437/183 |
| 5,736,456 A | 4/1998 | Akram ........................ 438/614 |
| 5,739,585 A | 4/1998 | Akram et al. ............... 257/698 |
| 5,744,859 A | 4/1998 | Ouchida ...................... 257/668 |
| 5,757,071 A | 5/1998 | Bhansali ..................... 257/697 |
| 5,757,081 A | 5/1998 | Chang et al. ................ 257/778 |
| 5,764,486 A | 6/1998 | Pendse ........................ 361/774 |
| 5,774,340 A | 6/1998 | Chang et al. ................ 361/771 |
| 5,789,271 A | 8/1998 | Akram .......................... 438/18 |
| 5,798,285 A | 8/1998 | Bentlage et al. ............ 438/108 |
| 5,801,072 A | 9/1998 | Barber ........................ 438/107 |
| 5,801,447 A | 9/1998 | Hirano et al. ............... 257/778 |
| 5,803,340 A | 9/1998 | Yeh et al. .................. 228/56.3 |
| 5,804,771 A | 9/1998 | McMahon et al. .......... 174/255 |
| 5,808,360 A | 9/1998 | Akram ........................ 257/738 |
| 5,811,879 A | 9/1998 | Akram ........................ 257/723 |
| 5,813,115 A | 9/1998 | Misawa et al. ............... 29/832 |
| 5,817,541 A | 10/1998 | Averkiou et al. ............ 438/107 |
| 5,822,856 A | 10/1998 | Bhatt et al. ................... 29/832 |
| 5,834,844 A | 11/1998 | Akagawa et al. ............ 257/734 |
| 5,861,666 A | 1/1999 | Bellaar ........................ 257/686 |
| 5,863,816 A | 1/1999 | Cho ............................ 438/123 |
| 5,870,289 A | 2/1999 | Tokuda et al. ............... 361/779 |
| 5,883,435 A | 3/1999 | Geffken et al. ............. 257/758 |
| 5,925,931 A | 7/1999 | Yamamoto .................. 257/737 |
| 5,994,222 A | 11/1999 | Smith et al. ................. 438/689 |
| 6,012,224 A | 1/2000 | DiStefano et al. ............ 29/840 |
| 6,013,877 A | 1/2000 | Degani et al. ............... 174/264 |
| 6,017,812 A | 1/2000 | Yonezawa et al. .......... 438/613 |
| 6,018,196 A | 1/2000 | Noddin ....................... 257/777 |
| 6,020,561 A | 2/2000 | Ishida et al. ................. 174/261 |
| 6,037,665 A | 3/2000 | Miyazaki .................... 257/773 |
| 6,046,909 A | 4/2000 | Joy ............................. 361/748 |
| 6,084,297 A | 7/2000 | Brooks et al. ............... 257/698 |
| 6,084,781 A | 7/2000 | Klein .......................... 361/771 |
| 6,088,236 A | 7/2000 | Tomura et al. .............. 361/783 |
| 6,103,552 A | 8/2000 | Lin ............................. 438/113 |
| 6,103,992 A | 8/2000 | Noddin .................. 219/121.71 |
| 6,127,204 A | 10/2000 | Isaacs et al. ................. 438/106 |
| 6,159,770 A | 12/2000 | Tetaka et al. ................ 438/112 |

OTHER PUBLICATIONS

Erickson, "Wafer Bumping: The Missing Link for DCA," Electronic Packaging & Production, Jul. 1998, pp. 43–46.

Kuchenmeister et al., "Film Chip Interconnection Systems Prepared By Wet Chemical Metallization," IEEE publication 0–7803–4526–6/98, Jun. 1998, 5 pages.

Ghaffarian, "Long Time BGA Assembly Reliability," Advancing Microelectronics, vol. 25, No. 6, Sep./Oct. 1998, pp. 20–23.

U.S. Appl. No. 09/465,024, filed Dec. 16, 1999, entitled "Bumpless Flip Chip Assembly With Solder Via".

U.S. Appl. No. 09/464,562, filed Dec. 16, 1999, entitled "Bumpless Flip Chip Assembly With Strips And Via–Fill".

U.S. Appl. No. 09/464,561, filed Dec. 16, 1999, entitled "Bumpless Flip Chip Assembly With Strips–In–Via And Plating".

U.S. Appl. No. 09/120,408, filed Jul. 22, 1998, entitled "Flip Chip Assembly With Via Interconnection".

U.S. Appl. No. 09/643,212, filed Aug. 22, 2000, entitled "Semiconductor Chip Assembley With Simultaneously Electroplated Contact Terminal and Connection Joint".

U.S. Appl. No. 09/643,214, filed Aug. 22, 2000, entitled "Semiconductor Chip Assembly with Simultaneously Electrolessly Plated Contact Terminal and Connection Joint".

U.S. Appl. No. 09/643,213, filed Aug. 22, 2000, entitled "Method of Making A Support Circuit For A Semiconductor Chip Assembly".

U.S. Appl. No. 09/643,445, filed Aug. 22, 2000, entitled "Method of Making A Semiconductor Chip Assembly".

U.S. Appl. No. 09/665,928, filed Sep. 20, 2000, entitled "Semiconductor Chip Assembly With Ball Bond Connection Joint".

U.S. Appl. No. 09/665,931, filed Sep. 20, 2000, entitled "Method Of Making A Support Circuit With A Tapered Through–Hole For A Semiconductor Chip Assembly".

U.S. Appl. No. 09/677,207, filed Oct. 2, 2000, entitled "Method Of Making A Semiconductor Chip Assembly With A Conductive Trace Subtractively Formed Before And After Chip Attachment".

U.S. Appl. No. 09/865,367, filed May 24, 2001, entitled "Semiconductor Chip Assembly With Simultaneously Electroplated Contact Terminal and Connection Joint".

U.S. Appl. No. 09/864,555, filed May 24, 2001, entitled "Semiconductor Chip Assembly with Simultaneously Electrolessly Plated Contact Terminal and Connection Joint".

U.S. Appl. No. 09/864,773, filed May 24, 2001, entitled "Semiconductor Chip Assembly With Ball Bond Connection Joint".

METHOD OF CONNECTING A CONDUCTIVE TRACE TO A SEMICONDUCTOR CHIP USING A METAL BASE

CROSS-REFERENCE TO RELATED APPLICATIONS

This application is a continuation-in-part of U.S. application Ser. No. 09/962,754 filed Sep. 24, 2001, now U.S. Pat. No. 6,373,710, which is a continuation-in-part of U.S. application Ser. No. 09/878,626 filed Jun. 11, 2001, now U.S. Pat. No. 6,653,217, which is a continuation-in-part of U.S. application Ser. No. 09/687,619 filed Oct. 13, 2000, now U.S. Pat. No. 6,440,835 each of which is incorporated by reference.

BACKGROUND OF THE INVENTION

1. Field of the Invention

The present invention relates to a semiconductor chip assembly, and more particularly to a method of connecting a conductive trace to a semiconductor chip.

2. Description of the Related Art

Semiconductor chips have input/output pads that must be connected to external circuitry in order to function as part of an electronic system. The connection media is typically an array of metallic leads (e.g., a lead frame) or a support circuit (e.g., a substrate), although the connection can be made directly to a circuit panel (e.g., a mother board). Several connection techniques are widely used. These include wire bonding, tape automated bonding (TAB) and flip-chip bonding.

Wire bonding is by far the most common and economical connection technique. In this approach, wires are bonded, one at a time, from the chip to external circuitry by thermocompression, thermosonic or ultrasonic processes. In thermocompression bonding, fine gold wire is fed from a spool through a clamp and a capillary. A thermal source is swept past an end of the wire to form a wire ball that protrudes from the capillary. The chip or capillary is then heated to about 200 to 300° C., the capillary is brought down over an aluminum pad, the capillary exerts pressure on the wire ball, and the wire ball forms a ball bond on the pad. The capillary is then raised and moved to a terminal on the support circuit, the capillary is brought down again, and the combination of force and temperature forms a wedge bond between the wire and the terminal. Thus, the connection between the pad and the terminal includes the ball bond (which only contacts the pad), the wedge bond (which only contacts the terminal) and the wire between the bonds. After raising the capillary again, the wire is ripped from the wedge bond, the thermal source is swept past the wire to form a new wire ball, and the process is repeated for other pads on the chip. Thermosonic bonding is similar to thermocompression bonding but adds ultrasonic vibration as the ball and wedge bonds are formed so that less heat is necessary. Ultrasonic bonding uses aluminum wire to form wedge bonds without applying heat. There are many variations on these basic methods.

TAB involves bonding gold-bumped pads on the chip to external circuitry on a polymer tape using thermocompression bonding. TAB requires mechanical force such as pressure or a burst of ultrasonic vibration and elevated temperature to accomplish metallurgical welding between the wires or bumps and the designated surface.

Flip-chip bonding involves providing pre-formed solder bumps on the pads, flipping the chip so that the pads face down and are aligned with and contact matching bond sites, and melting the solder bumps to wet the pads and the bond sites. After the solder reflows it is cooled down and solidified to form solder joints between the pads and the bond sites. Organic conductive adhesive bumps with conductive fillers in polymer binders have been used in place of solder bumps, but they do not normally form a metallurgical interface in the classical sense. A major advantage of flip-chip bonding over wiring bonding and TAB is that it provides shorter connection paths between the chip and the external circuitry, and therefore has better electrical characteristics such as less inductive noise, cross-talk, propagation delay and waveform distortion. In addition, flip-chip bonding requires minimal mounting area and weight which results in overall cost saving since no extra packaging and less circuit board space are used.

While flip-chip technology has tremendous advantages over wire bonding and TAB, its cost and technical limitations are significant. For instance, the cost of forming bumps on the pads is significant. In addition, an adhesive is normally underfilled between the chip and the support circuit to reduce stress on the solder joints due to thermal mismatch between the chip and the support circuit, and the underfilling process increases both manufacturing complexity and cost.

Other techniques besides wire bonding, TAB and flip-chip technologies have been developed to provide connection joints that electrically connect pads on chips to external conductive traces. These connection joints can be formed by electroplated metal, electrolessly plated metal, solder or conductive adhesive.

Electroplating provides deposition of an adherent metallic coating onto a conductive object placed into an electrolytic bath composed of a solution of the salt of the metal to be plated. Using the terminal as an anode (possibly of the same metal as the one used for plating), a DC current is passed through the solution affecting transfer of metal ions onto the cathode surface. As a result, the metal continually electroplates on the cathode surface. Electroplating using AC current has also been developed. Electroplating is relatively fast and easy to control. However, a plating bus is needed to supply current where electroplating is desired. The plating bus creates design constraints and must be removed after the electroplating occurs. Non-uniform plating may arise at the bottom of relatively deep through-holes due to poor current density distribution. Furthermore, the electrolytic bath is relatively expensive.

Electroless plating provides metal deposition by an exchange reaction between metal complexes in a solution and a catalytic metal that activates or initiates the reaction. As a result, the electroless metal continually plates (i.e., deposits or grows) on the catalytic metal. Advantageously, the reaction does not require externally applied electric current. Therefore, electroless plating can proceed without a plating bus. However, electroless plating is relatively slow. Furthermore, the electroless bath is relatively expensive.

Solder joints are relatively inexpensive, but exhibit increased electrical resistance as well as cracks and voids over time due to fatigue from thermo-mechanical stresses. Further, the solder is typically a tin-lead alloy and lead-based materials are becoming far less popular due to environmental concerns over disposing of toxic materials and leaching of toxic materials into ground water supplies.

Conductive adhesive joints with conductive fillers in polymer binders are relatively inexpensive, but do not normally form a metallurgical interface in the classical sense. Moisture penetration through the polymer binder may induce corrosion or oxidation of the conductive filler particles resulting in an unstable electrical connection. Furthermore, the polymer binder and the conductive filler may degrade leading to an unstable electrical connection. Thus, the conductive adhesive may have adequate mechanical strength but poor electrical characteristics.

Accordingly, each of these connection joint techniques has various advantages and disadvantages. The optimal approach for a given application depends on design, reliability and cost considerations.

In view of the various development stages and limitations in currently available connection joint techniques, there is a need for a method of connecting a conductive trace to a semiconductor chip that is cost-effective, manufacturable, versatile, and makes advantageous use the particular connection joint technique best suited for a given application.

SUMMARY OF THE INVENTION

An object of the present invention is to provide a semiconductor chip assembly with a chip and a conductive trace that provides a low cost, high performance, high reliability package.

Another object of the present invention is to provide a convenient, cost-effective method for manufacturing semiconductor chip assemblies as chip scale packages, chip size packages, grid arrays or other structures.

In accordance with an aspect of the invention, a method of connecting a conductive trace to a semiconductor chip includes providing a semiconductor chip, a conductive trace and a metal base, wherein the chip includes a conductive pad, and the conductive trace is disposed between the metal base and the chip, then forming a through-hole that extends through the metal base and exposes the conductive trace and the pad, then forming a connection joint that contacts and electrically connects the conductive trace and the pad in the through-hole, and then etching the metal base, thereby reducing contact area between the metal base and another material.

The method can include mechanically attaching the chip to the conductive trace using an insulative adhesive, and then forming the through-hole through the metal base and the adhesive.

The method can include forming the connection joint such that the connection joint contacts the metal base. Alternatively, the method can include forming the connection joint such that the connection joint is spaced from the metal base.

The method can include forming the connection joint by plating the connection joint on the conductive trace and the pad. For instance, the connection joint can be electroplated or electrolessly plated on the conductive trace and the pad. Alternatively, the method can include forming the connection joint by depositing a non-solidified material on the conductive trace and the pad and then hardening the non-solidified material. For instance, solder paste can be deposited on the conductive trace and the pad and then hardened by reflowing, or conductive adhesive can be deposited on the conductive trace and the pad and then hardened by curing.

The method can include etching the metal base, thereby reducing contact area between the metal base and the connection joint.

The method can include attaching the conductive trace to a metal base, and then disposing the adhesive between the conductive trace and the chip, thereby mechanically attaching the conductive trace to the chip. This approach can include providing a plating mask on the metal base, electroplating the conductive trace on an exposed portion of the metal base through an opening in the plating mask, and then removing the plating mask. This approach can also include initially electroplating the connection joint on the metal base and the conductive trace, and then electroplating the connection joint on the pad. This approach can also include etching the metal base, thereby reducing contact area between the metal base and the conductive trace.

The method can include providing a structure that includes the conductive trace, an insulative base and a metal base, wherein the conductive trace and the metal base are disposed on opposite sides of the insulative base, and then disposing the adhesive between the conductive trace and the chip, thereby mechanically attaching the conductive trace to the chip. This approach can include providing a metal layer that contacts the insulative base, forming an etch mask on the metal layer, and etching the metal layer using the etch mask to selectively protect the metal layer such that the conductive trace includes an unetched portion of the metal layer. This approach can also include forming the through-hole through the insulative base and the adhesive. This approach can also include initially electroplating the connection joint on the metal base, then electroplating the connection joint on the conductive trace, and then electroplating the connection joint on the pad. This approach can also include etching the metal base, thereby reducing contact area between the metal base and the insulative base.

An advantage of the present invention is that the semiconductor chip assembly can be manufactured conveniently and cost effectively. Another advantage is that the assembly can include a connection joint made from a wide variety of materials and processes, thereby making advantageous use of mature connection joint technologies in a unique and improved manufacturing approach. Another advantage is that the assembly need not include wire bonds or TAB leads, although the process is flexible enough to accommodate these techniques if desired. Another advantage is that the assembly can be manufactured using low temperature processes which reduces stress and improves reliability. A further advantage is that the assembly can be manufactured using well-controlled processes which can be easily implemented by circuit board, lead frame and tape manufacturers. Still another advantage is that the assembly can be manufactured using materials that are compatible with copper chip and lead-free environmental requirements.

These and other objects, features and advantages of the invention will be further described and more readily apparent from a review of the detailed description of the preferred embodiments which follows.

BRIEF DESCRIPTION OF THE DRAWINGS

The following detailed description of the preferred embodiments can best be understood when read in conjunction with the following drawings, in which.

DETAILED DESCRIPTION OF THE PREFERRED EMBODIMENTS

Figure 1A:
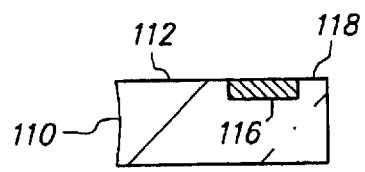
FIGS. 1A–1P are cross-sectional views showing a method of connecting a conductive trace to a semiconductor chip in accordance with a first embodiment of the present invention.
Figure 2A:
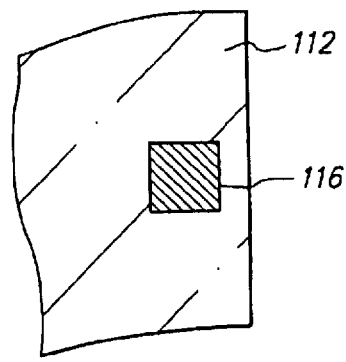
FIGS. 2A–2P are top plan views corresponding to FIGS. 1A–1P, respectively.
Figure 3A:
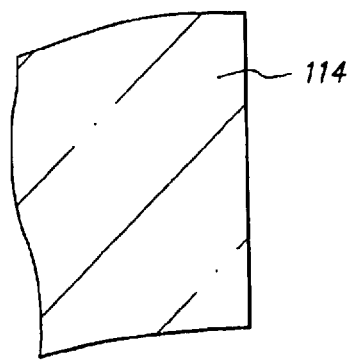
FIGS. 3A–3P are bottom plan views corresponding to FIGS. 1A–1P, respectively.
Figure 1B:
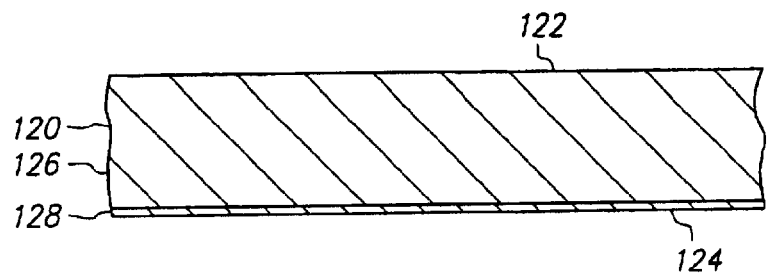
Figure 2B:
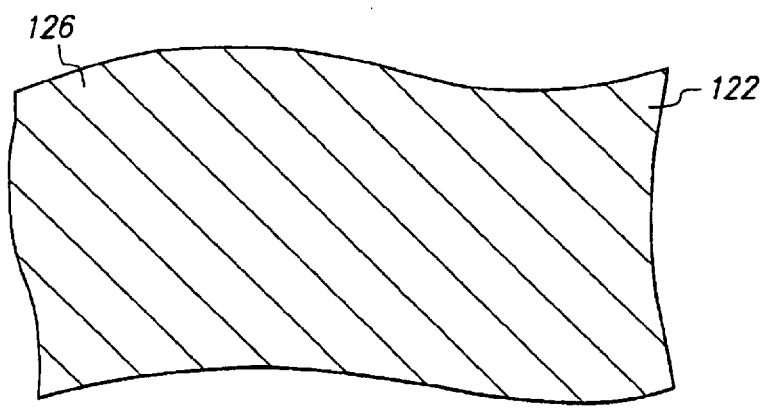
Figure 3B:
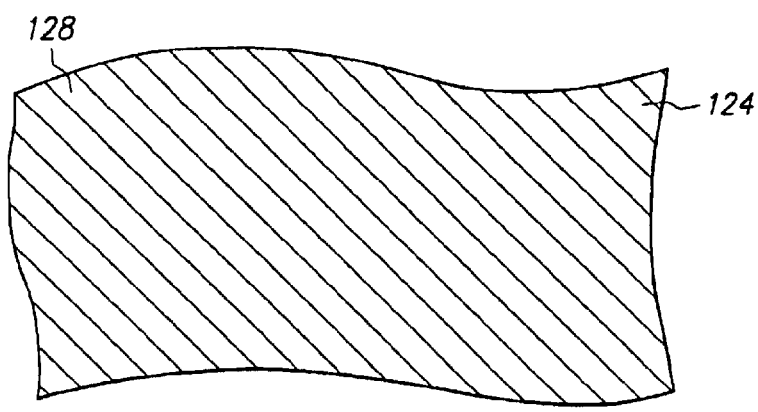
Figure 1C:
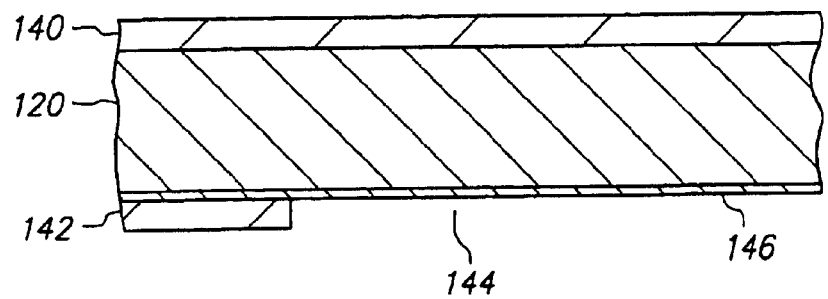
Figure 2C:
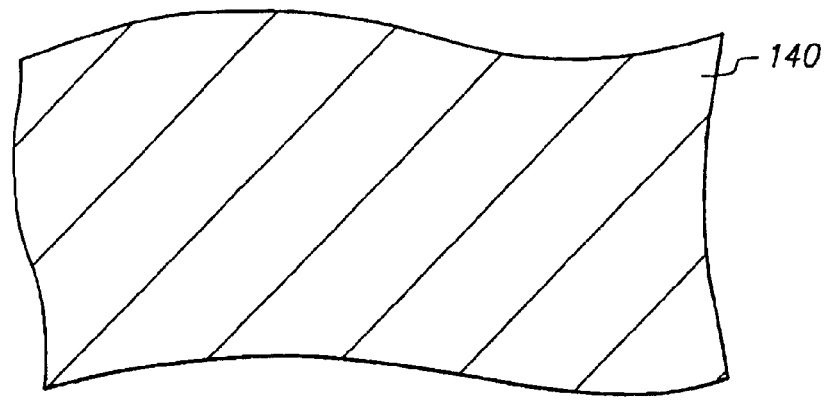
Figure 3C:
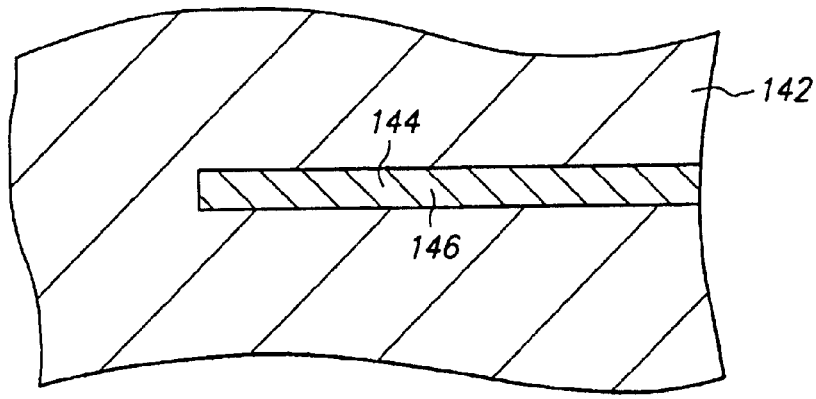
Figure 1D:
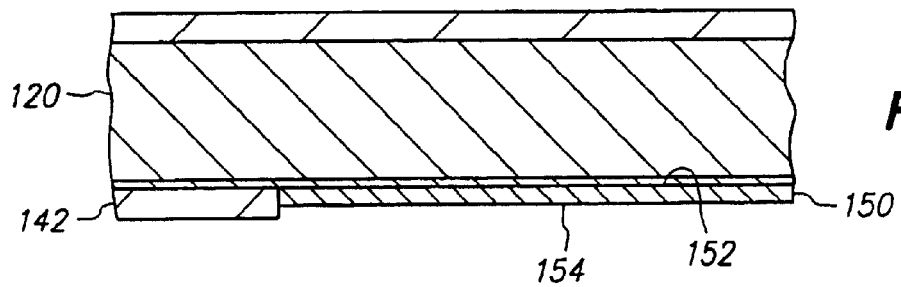
Figure 2D:
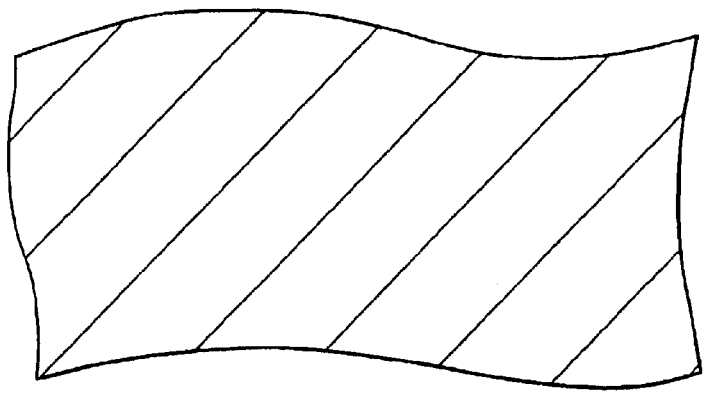
Figure 3D:
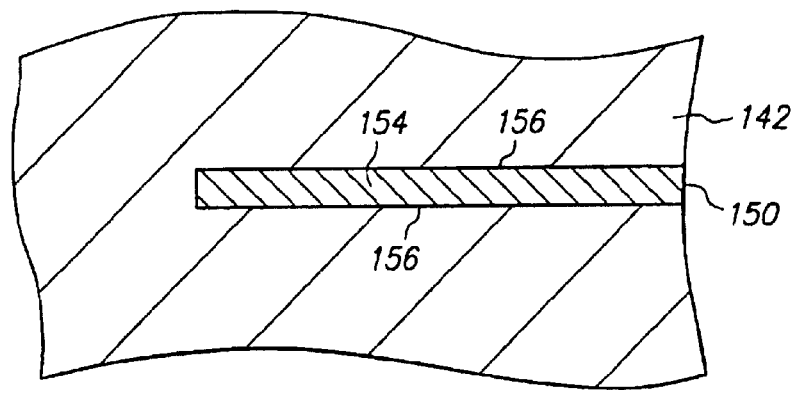
Figure 1E:
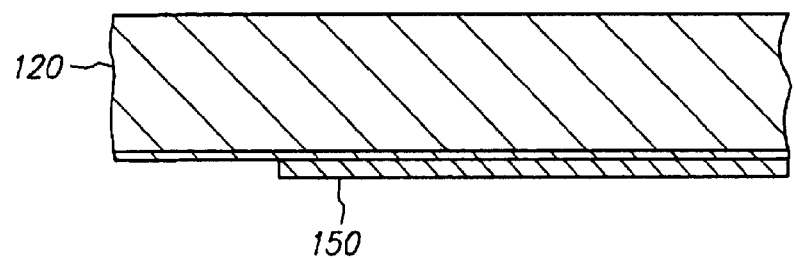
Figure 2E:
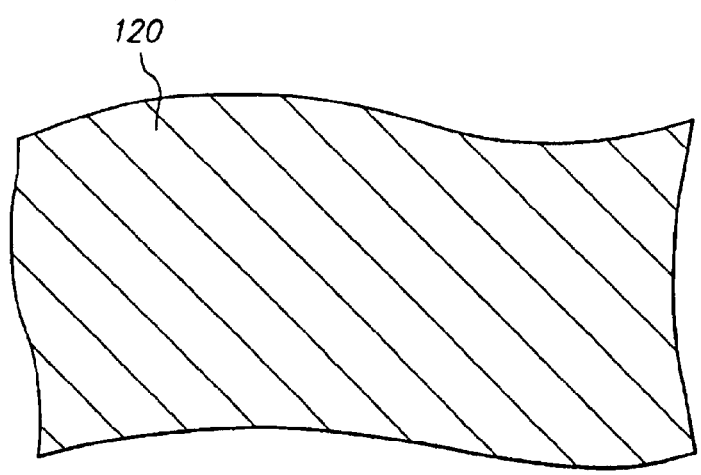
Figure 3E:
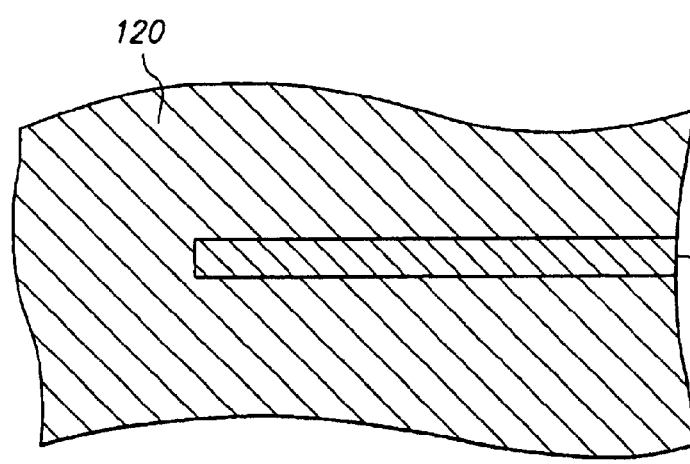
Figure 1F:
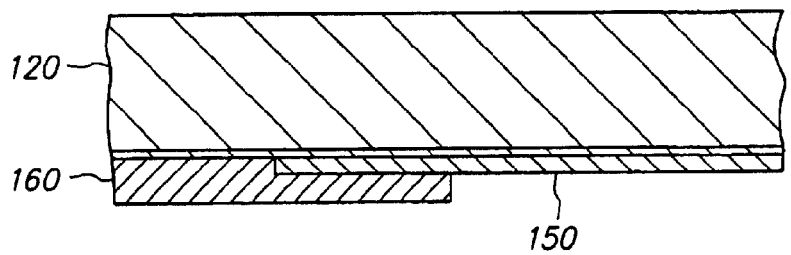
Figure 2F:
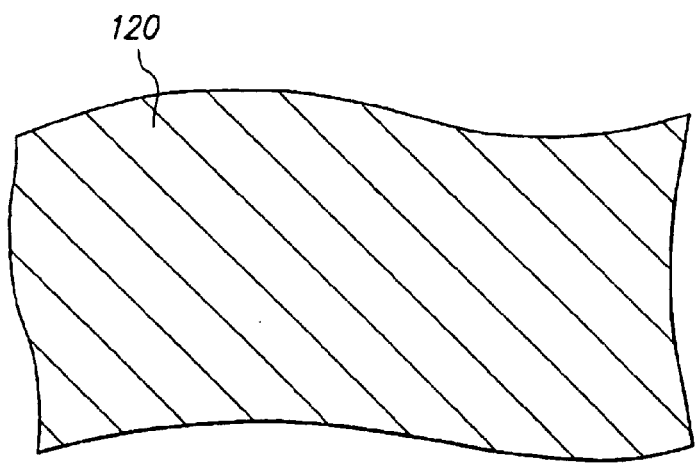
Figure 3F:
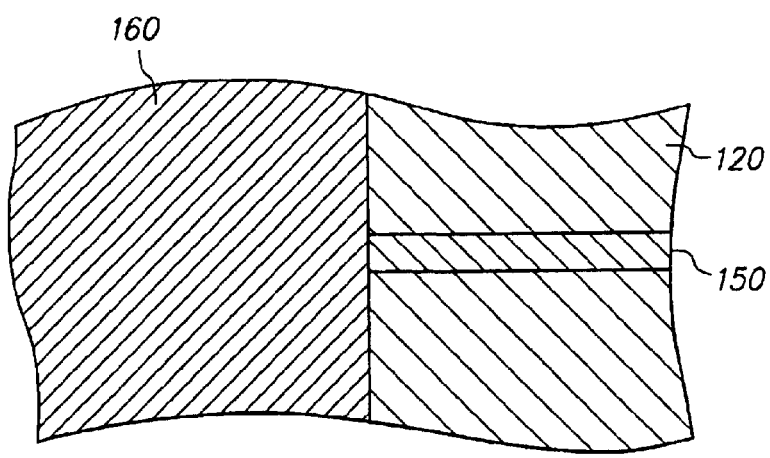
Figure 1G:
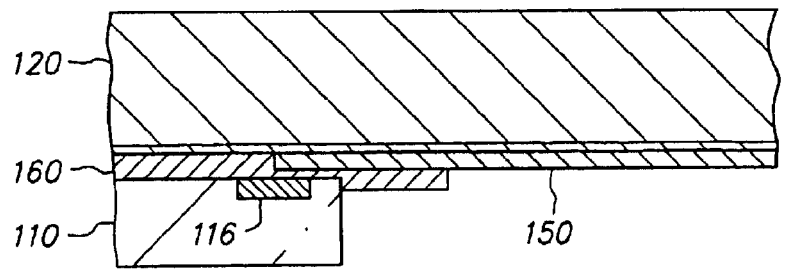
Figure 2G:
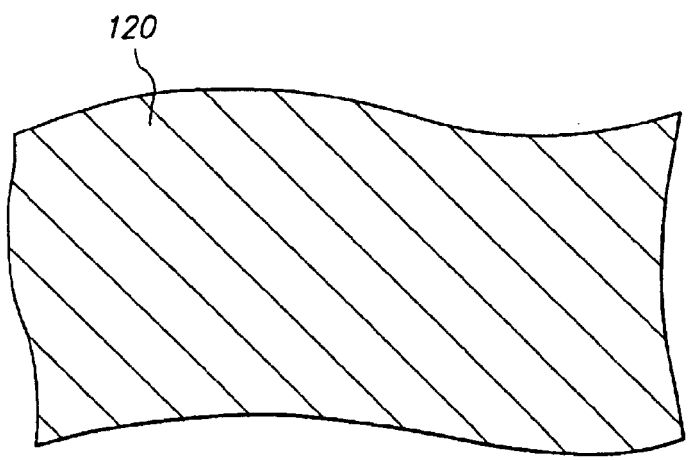
Figure 3G:
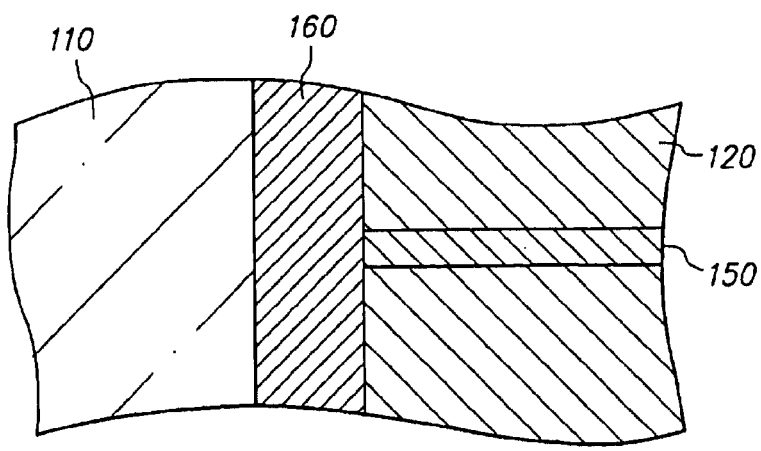
Figure 1H:
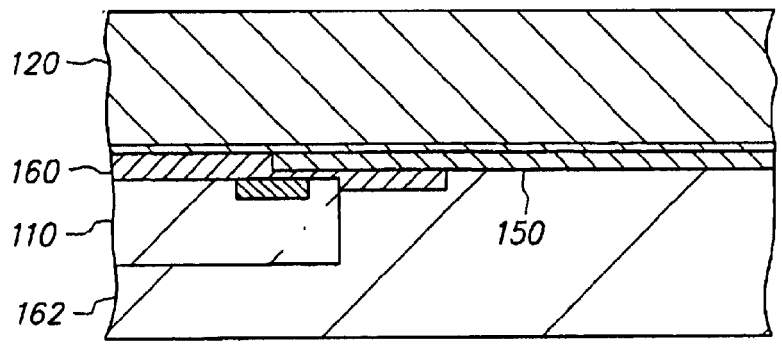
Figure 2H:
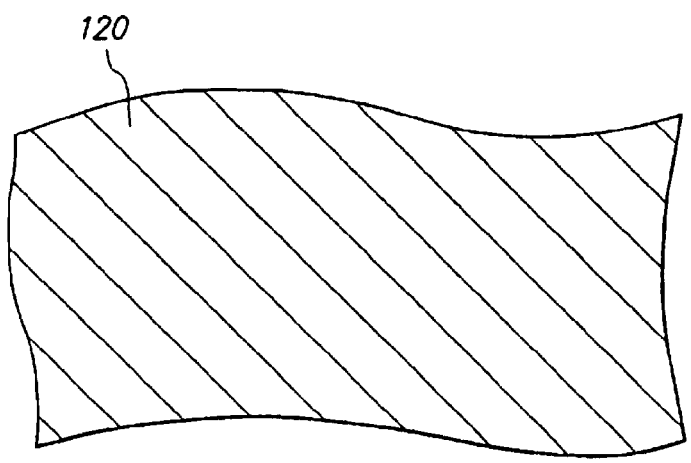
Figure 3H:
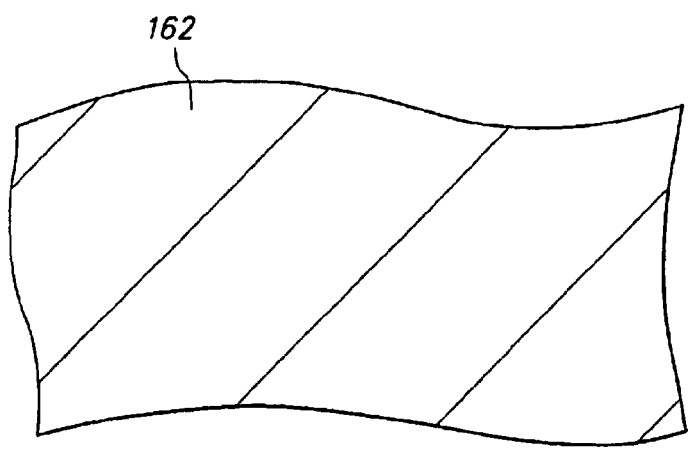
Figure 1L:
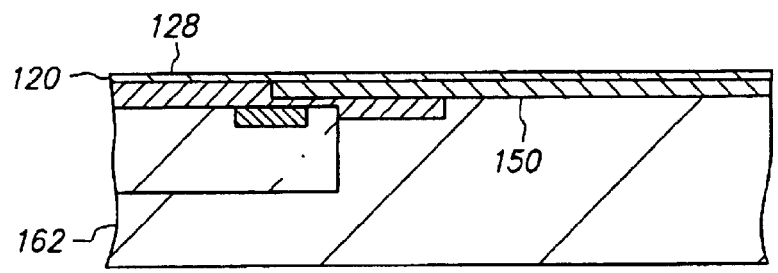
Figure 2L:
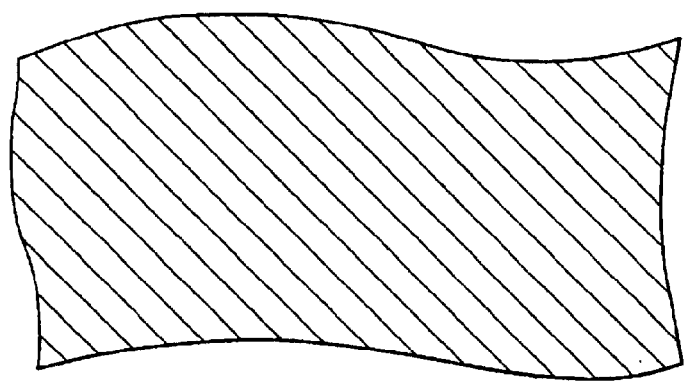
Figure 3L:
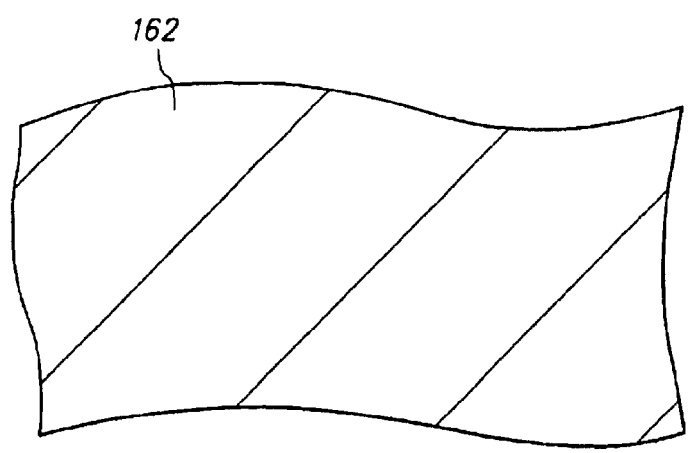
Figure 1J:
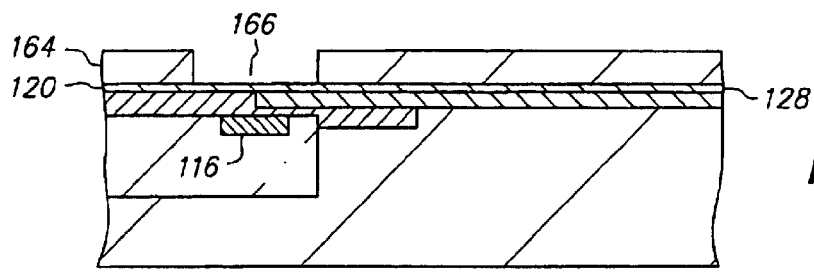
Figure 2J:
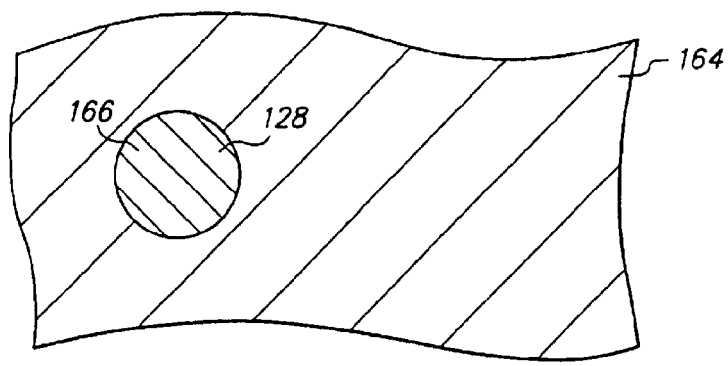
Figure 3J:
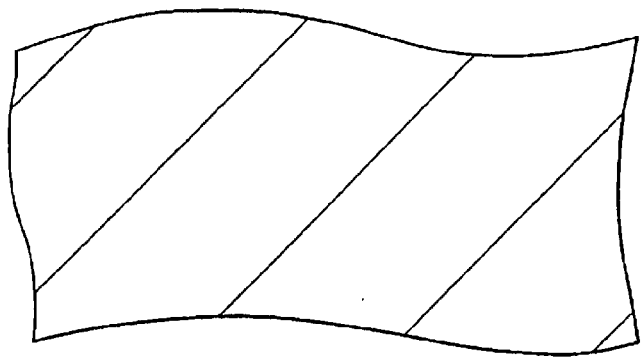
Figure 1K:
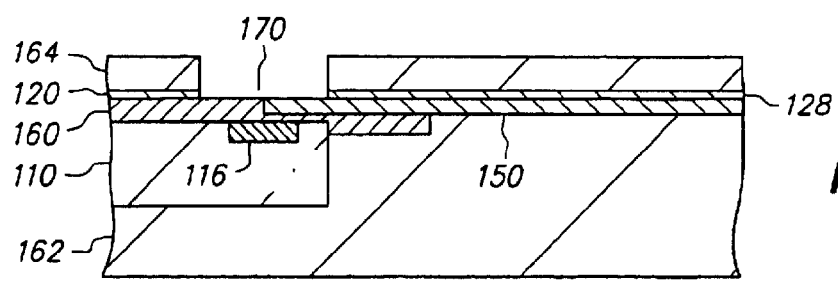
Figure 2K:
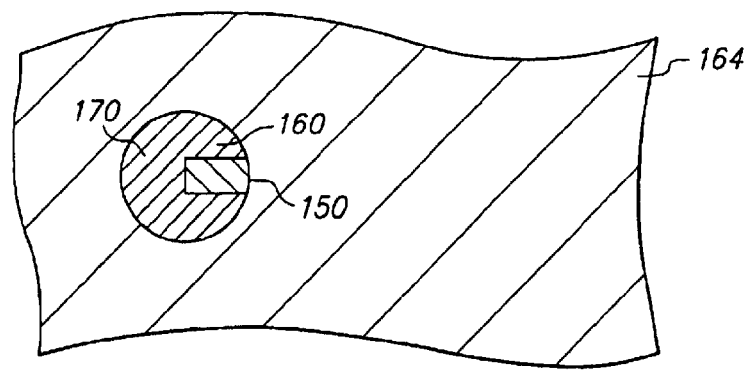
Figure 3K:
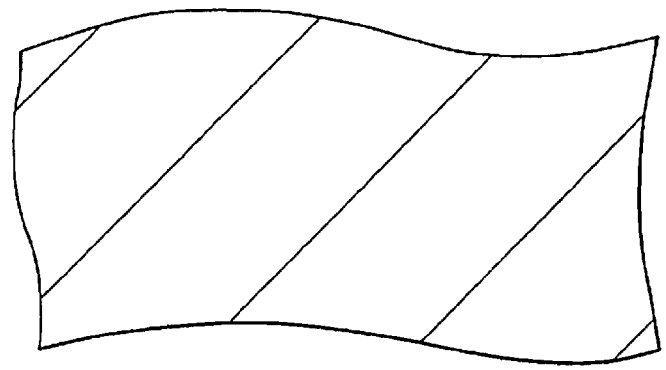
Figure 1L:
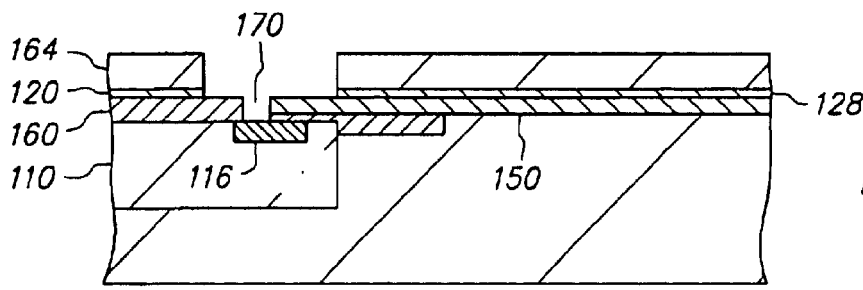
Figure 2L:
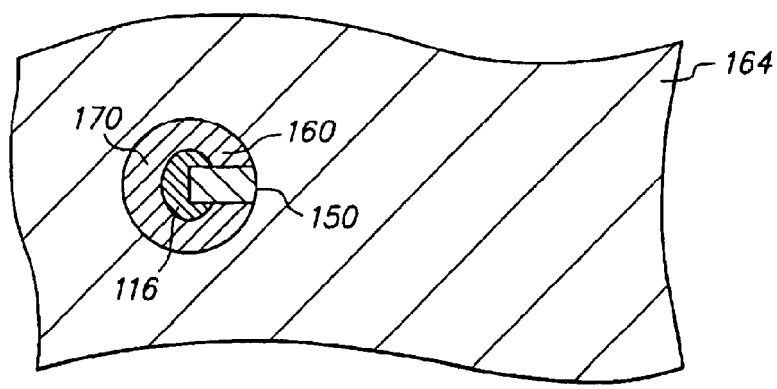
Figure 3L:
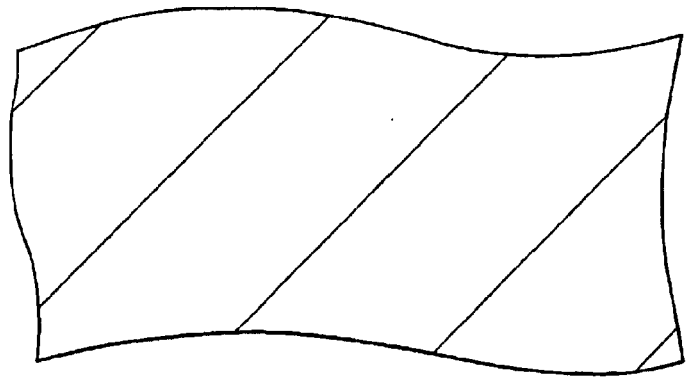
Figure 1M:
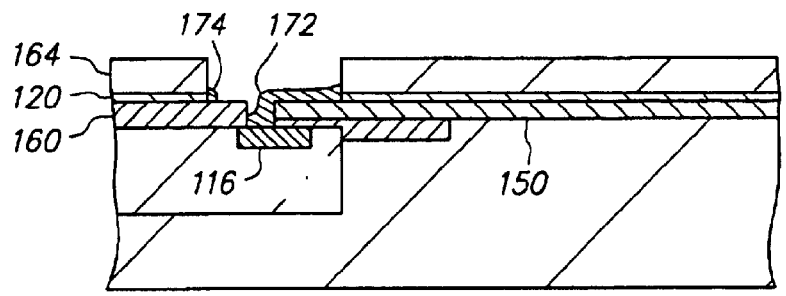
Figure 2M:
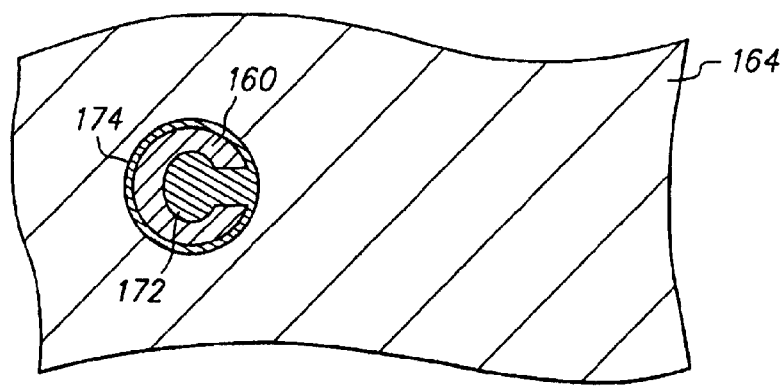
Figure 3M:
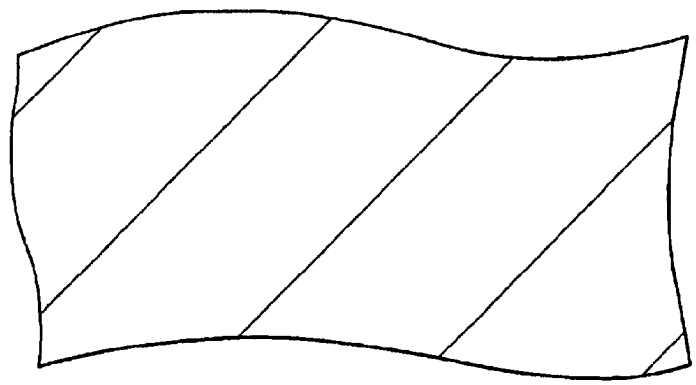
Figure 1N:
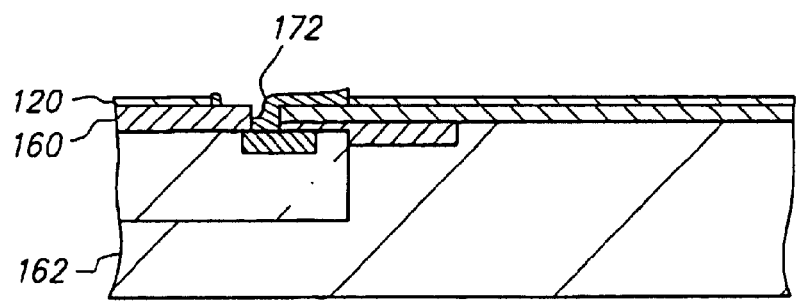
Figure 2N:
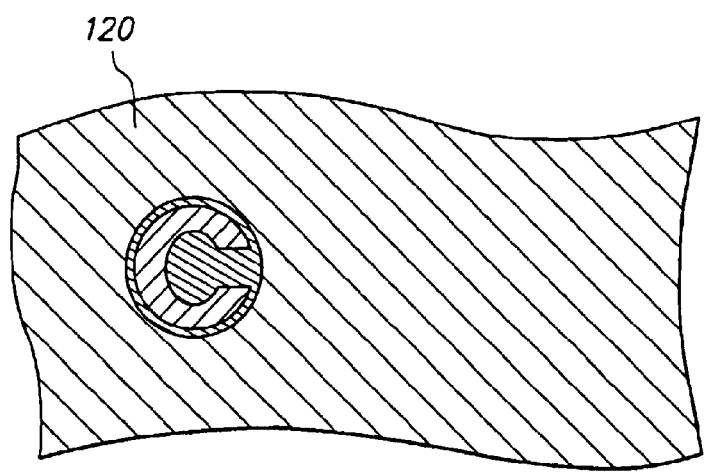
Figure 3N:
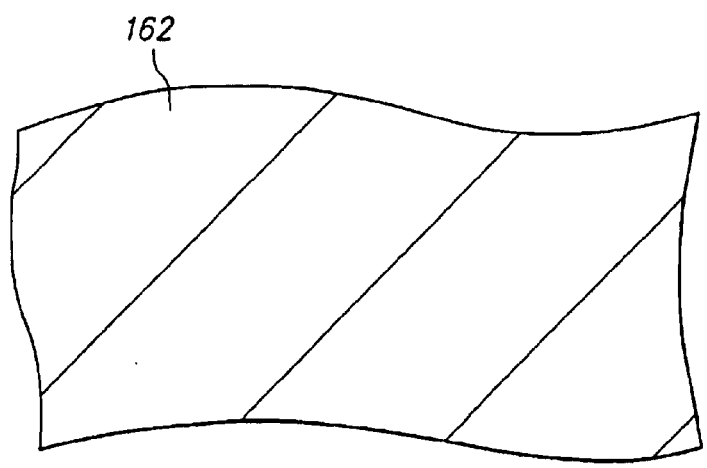
Figure 1O:
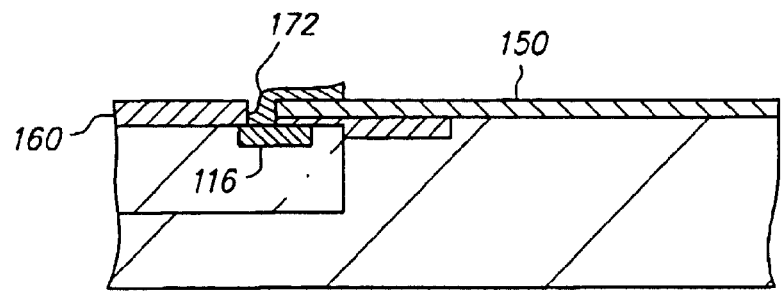
Figure 2O:
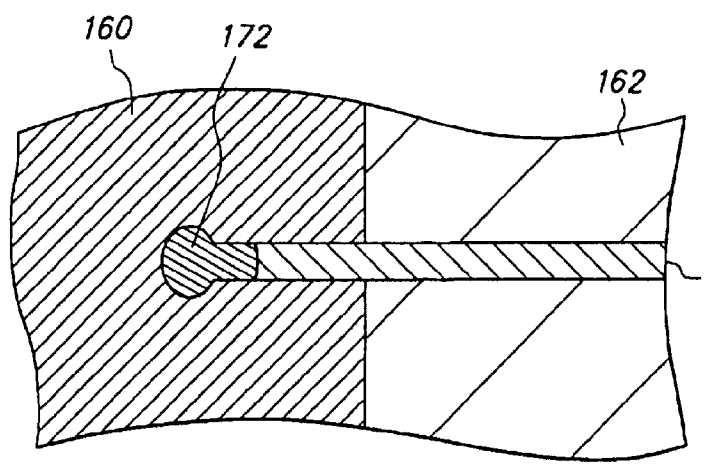
Figure 3O:
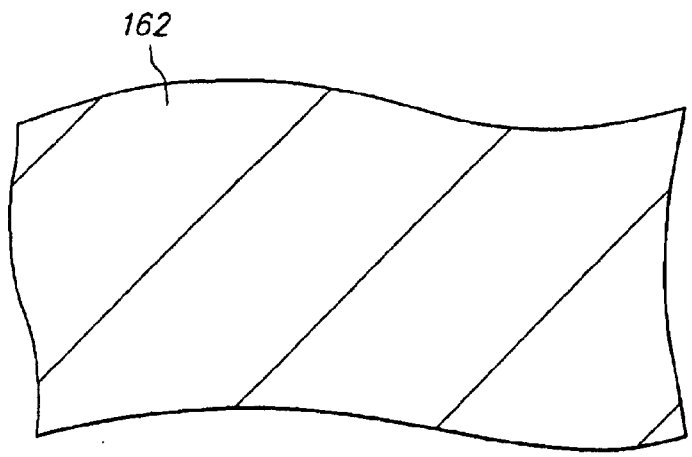
Figure 1P:
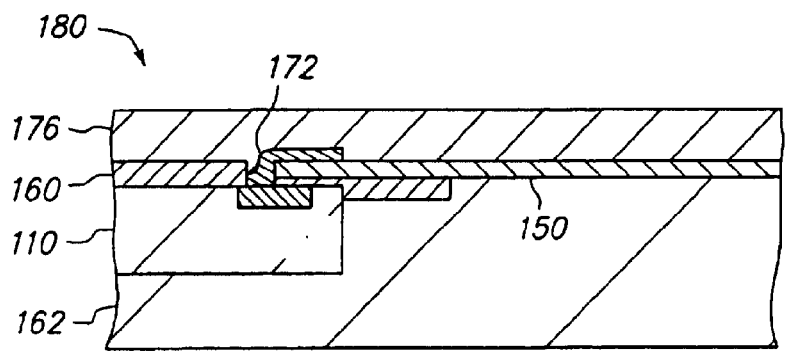
Figure 2P:
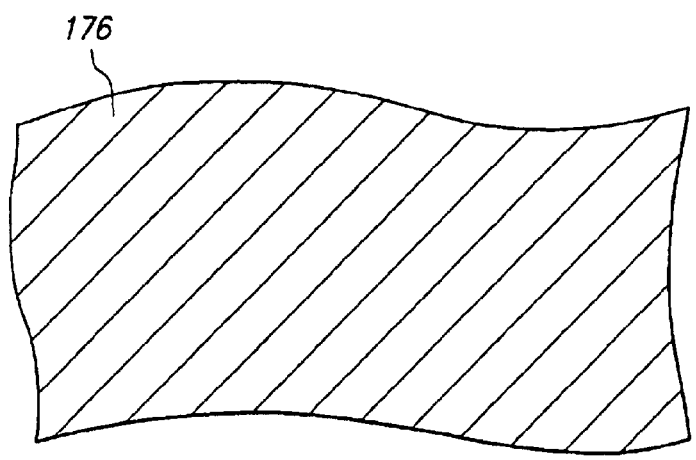
Figure 3P:
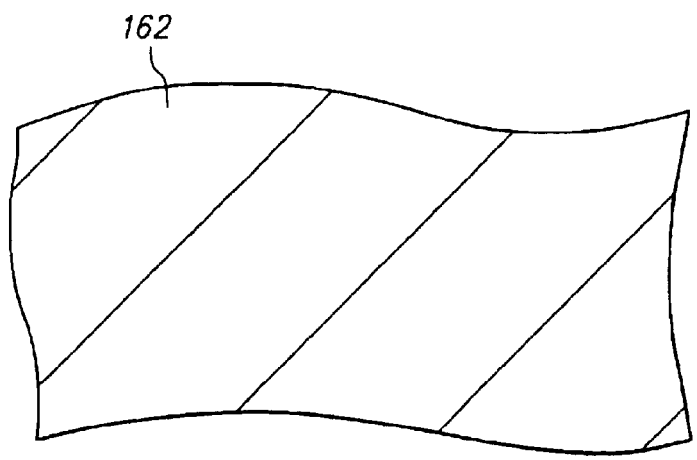
Figure 4A:
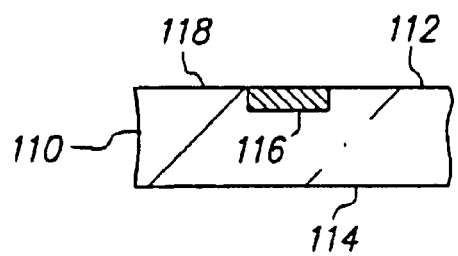
FIGS. 4A–4P are cross-sectional views corresponding to FIGS. 1A–1P, respectively.
Figure 4B:
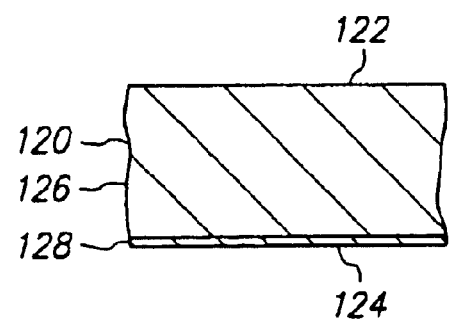
Figure 4C:
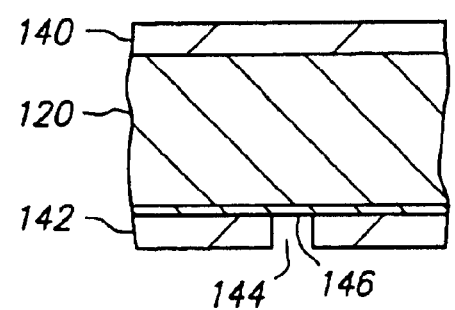
Figure 4D:
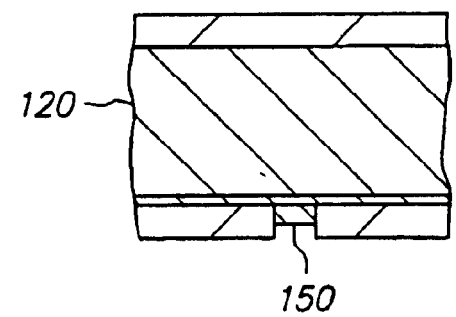
Figure 4E:
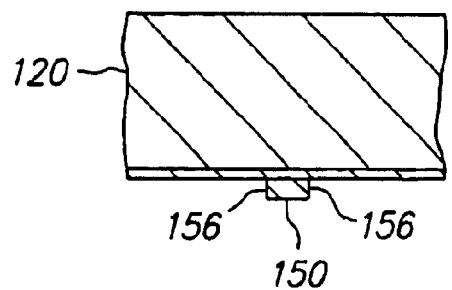
Figure 4F:
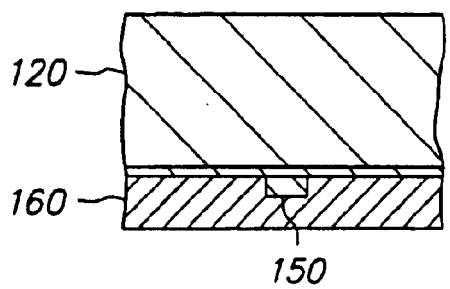
Figure 4G:
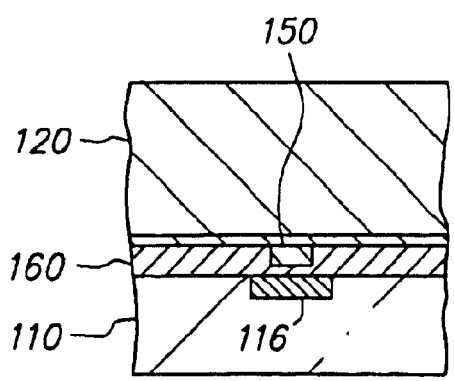
Figure 4H:
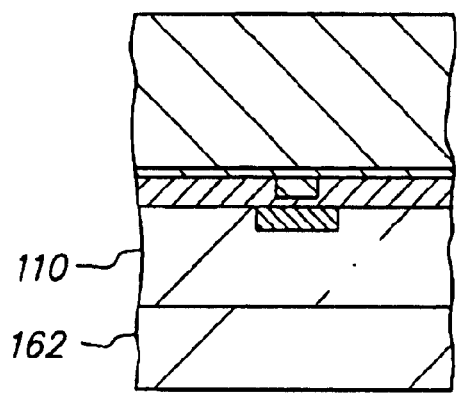
Figure 4I:
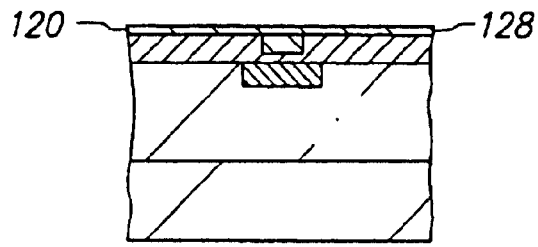
Figure 4J:
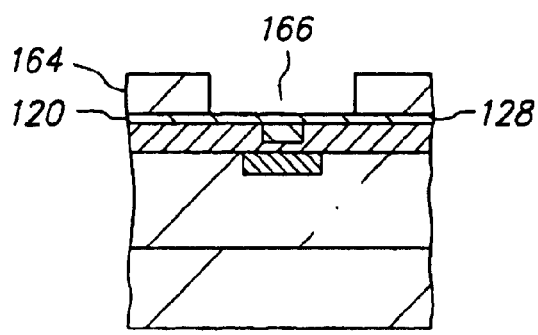
Figure 4K:
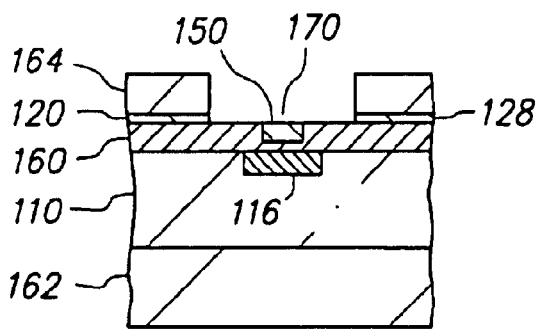
Figure 4L:
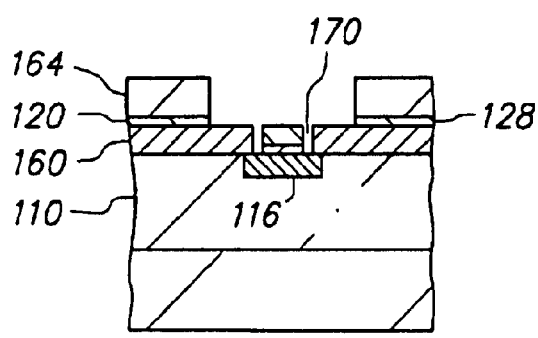
Figure 4M:
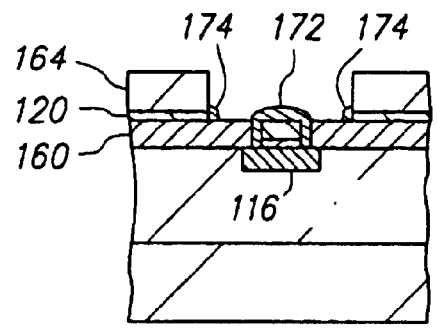
Figure 4N:
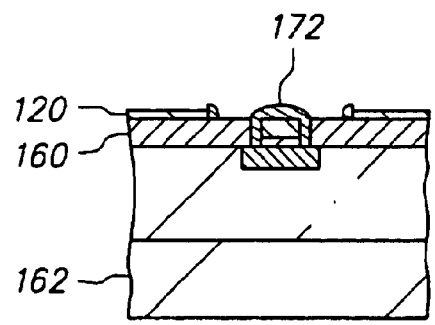
Figure 4O:
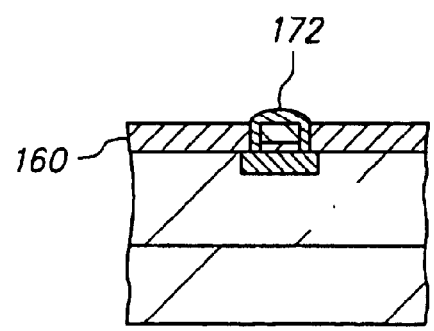
Figure 4P:
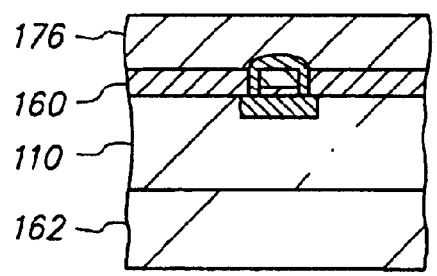
Figure 5A:
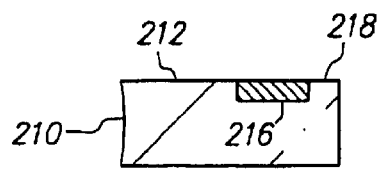
FIGS. 5A–5P are cross-sectional views showing a method of connecting a conductive trace to a semiconductor chip in accordance with a second embodiment of the present invention.
Figure 6A:
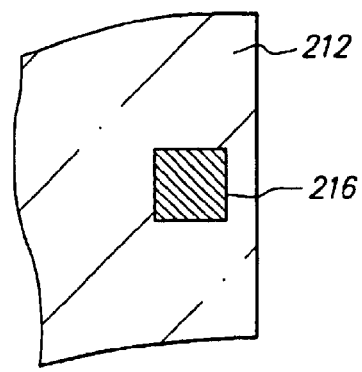
FIGS. 6A–6P are top plan views corresponding to FIGS. 5A–5P, respectively.
Figure 7A:
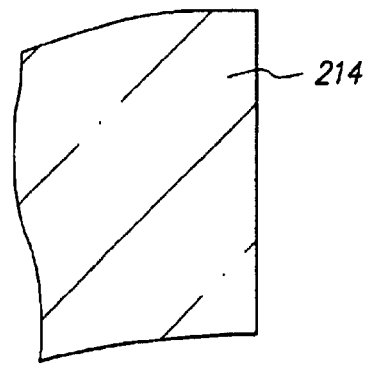
FIGS. 7A–7P are bottom plan views corresponding to FIGS. 5A–5P, respectively.
Figure 5B:
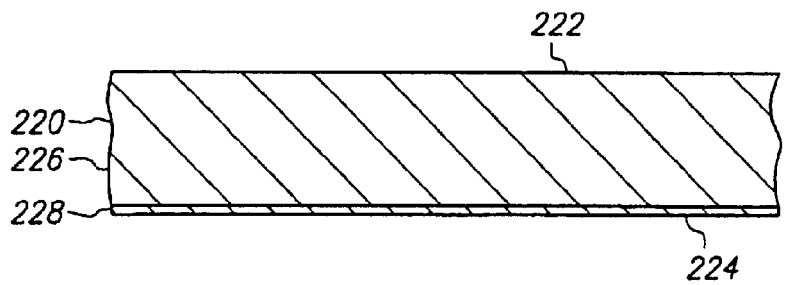
Figure 6B:
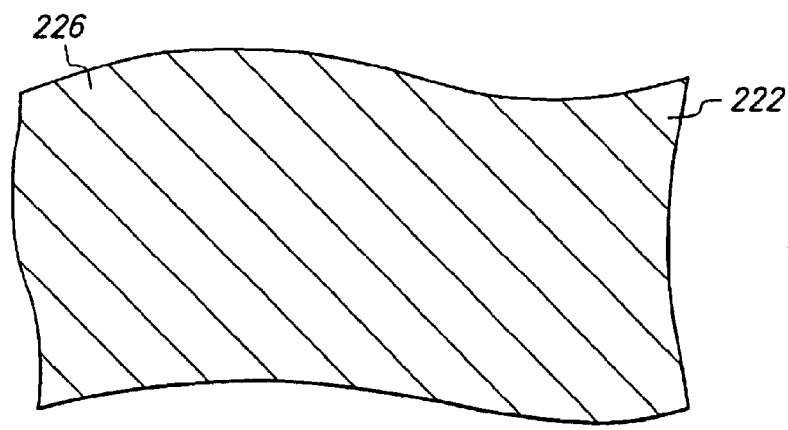
Figure 7B:
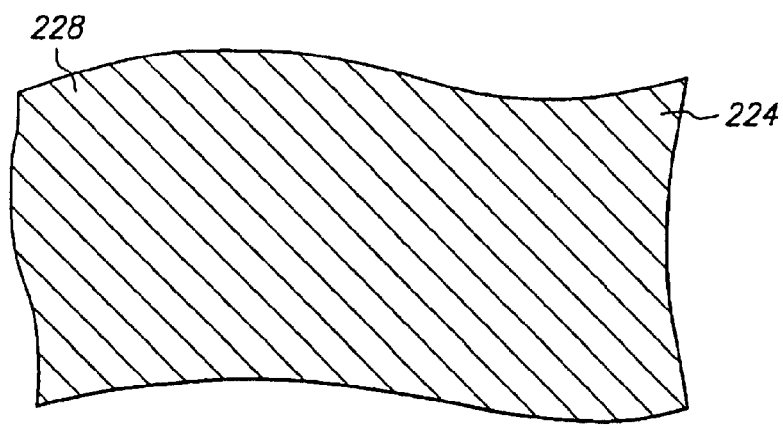
Figure 5C:
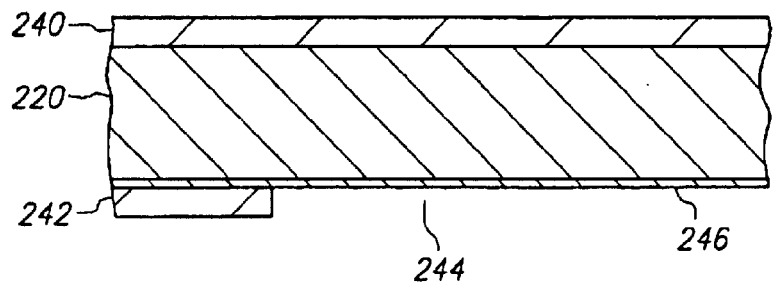
Figure 6C:
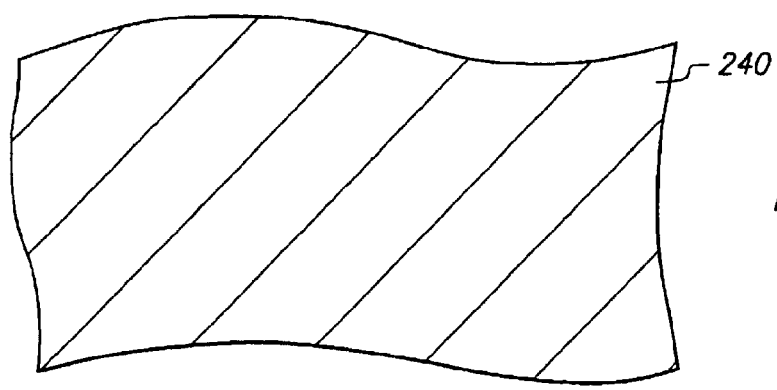
Figure 7C:
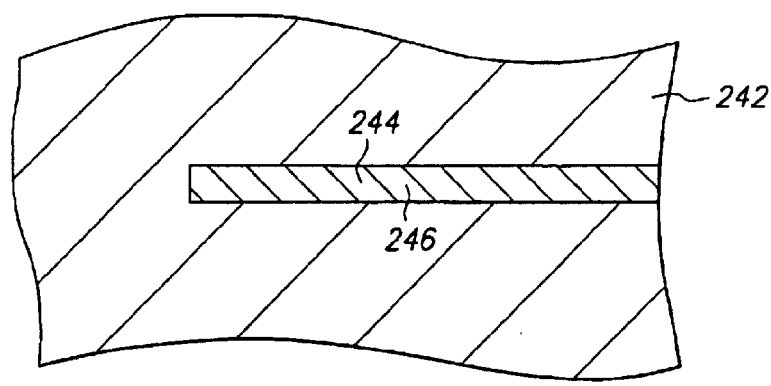
Figure 5D:
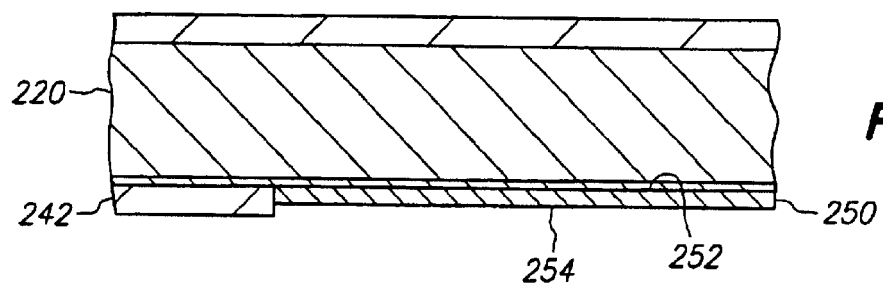
Figure 6D:
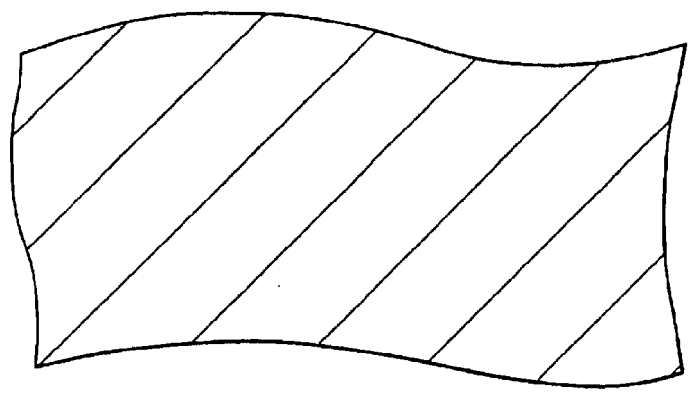
Figure 7D:
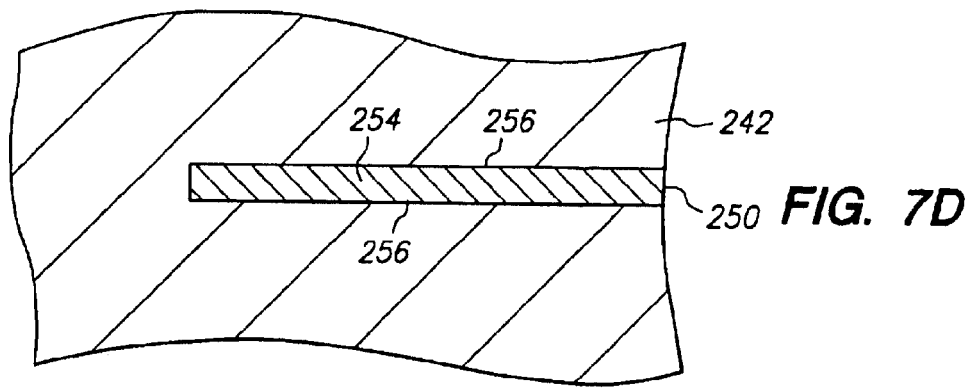
Figure 5E:
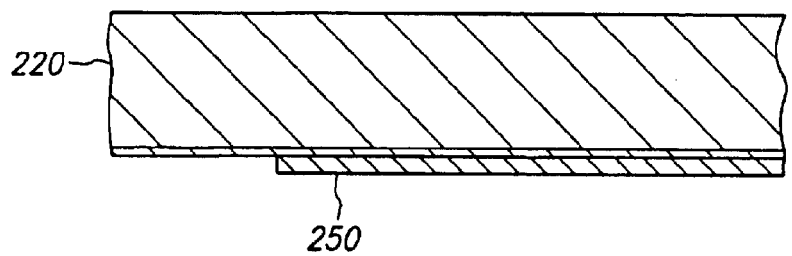
Figure 6E:
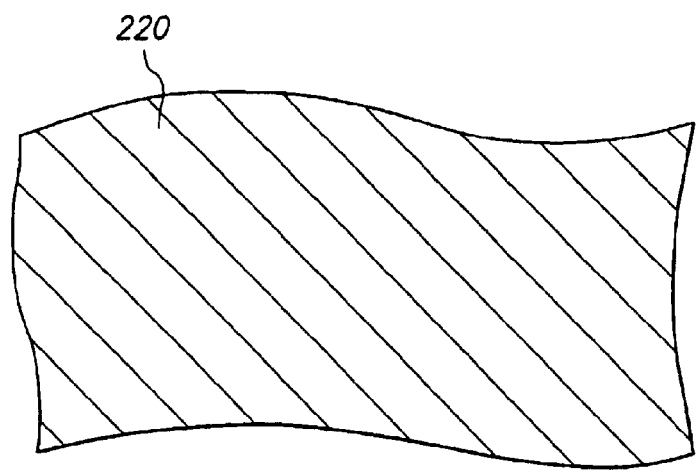
Figure 7E:
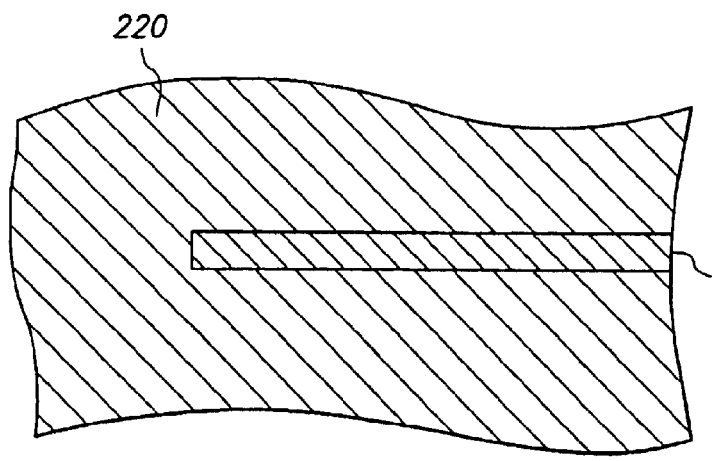
Figure 5F:
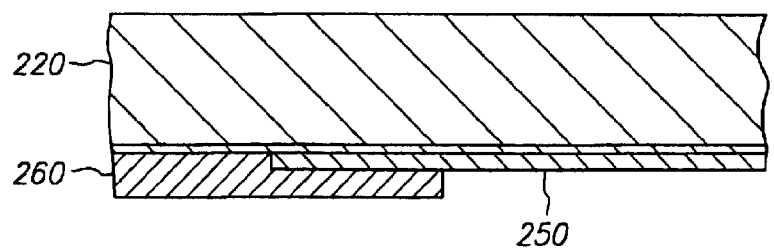
Figure 6F:
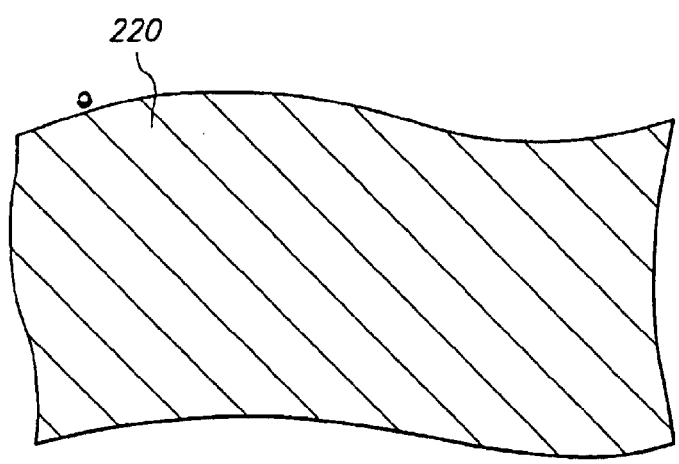
Figure 7F:
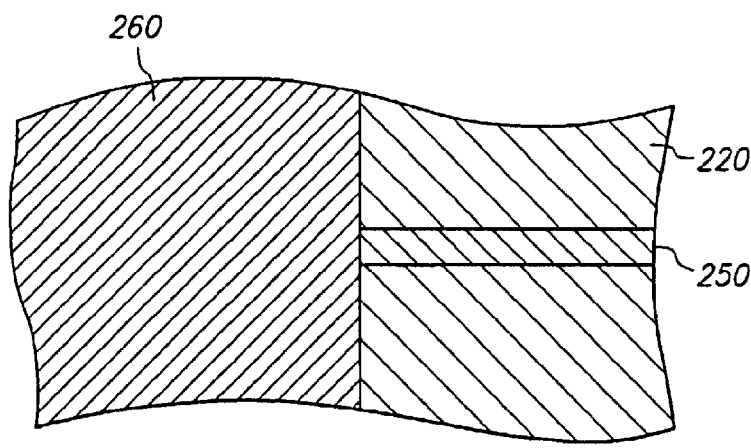
Figure 5G:
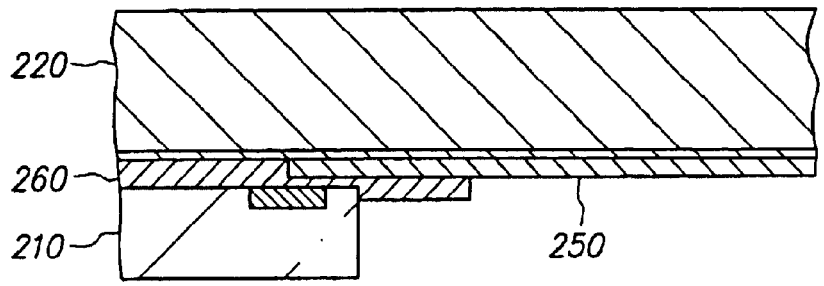
Figure 6G:
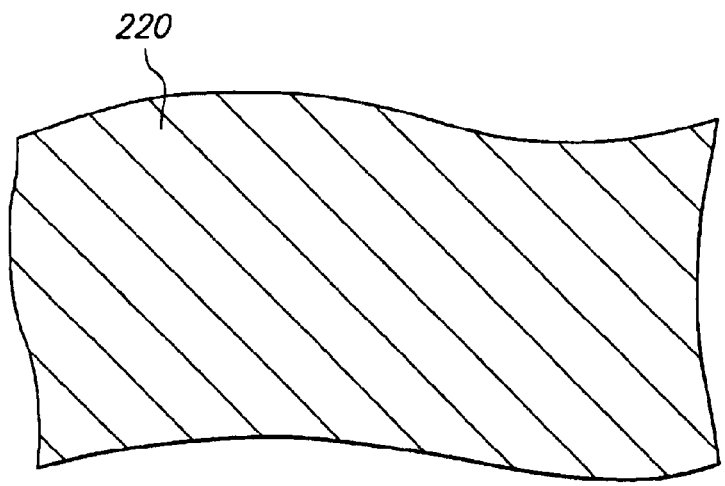
Figure 7G:
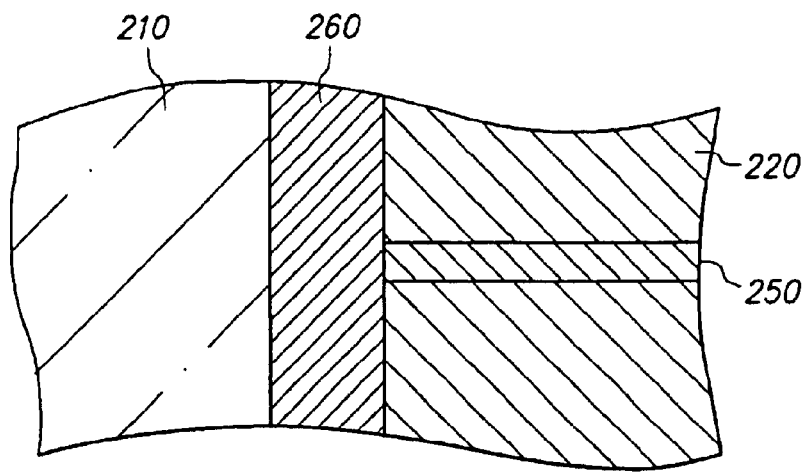
Figure 5H:
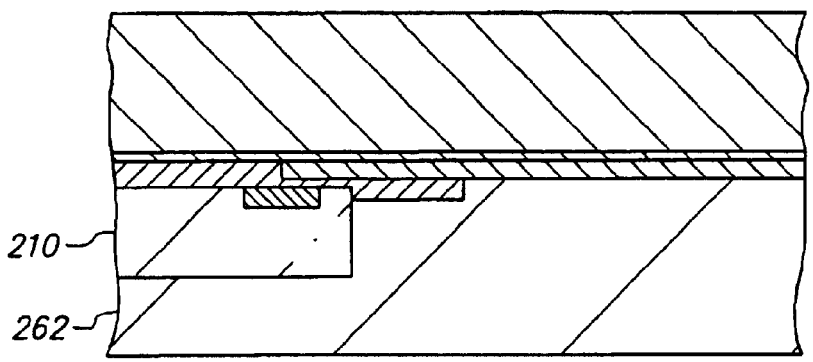
Figure 6H:
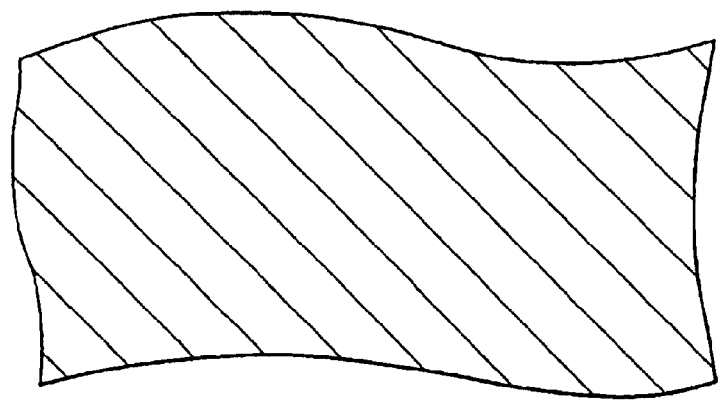
Figure 7H:
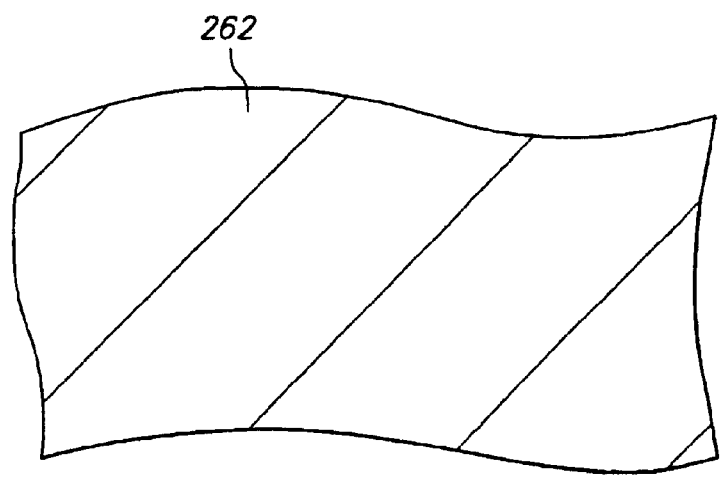
Figure 51:
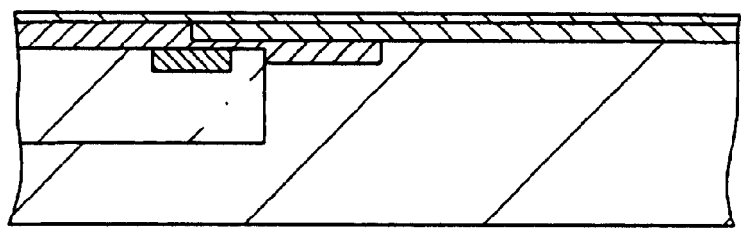
Figure 61:
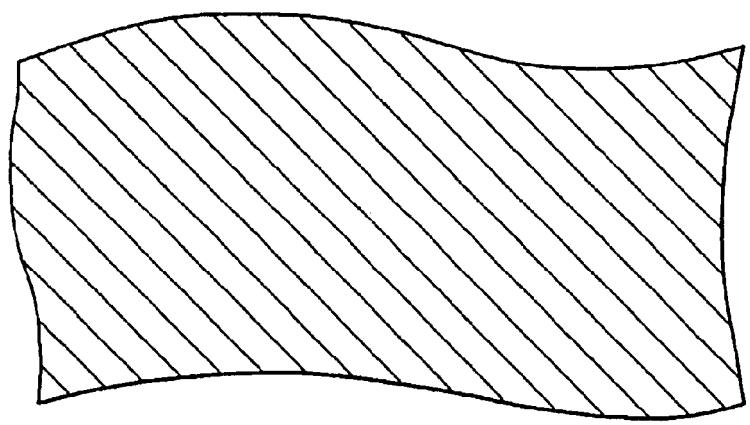
Figure 71:
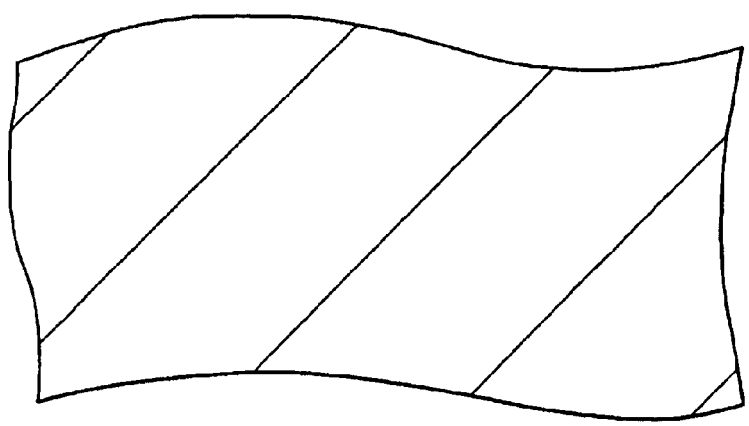
Figure 5J:
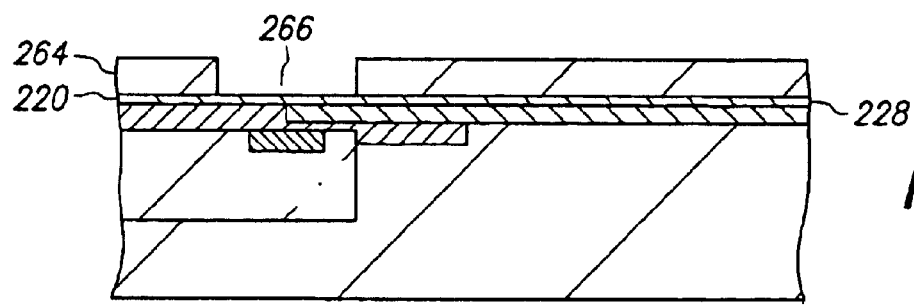
Figure 6J:
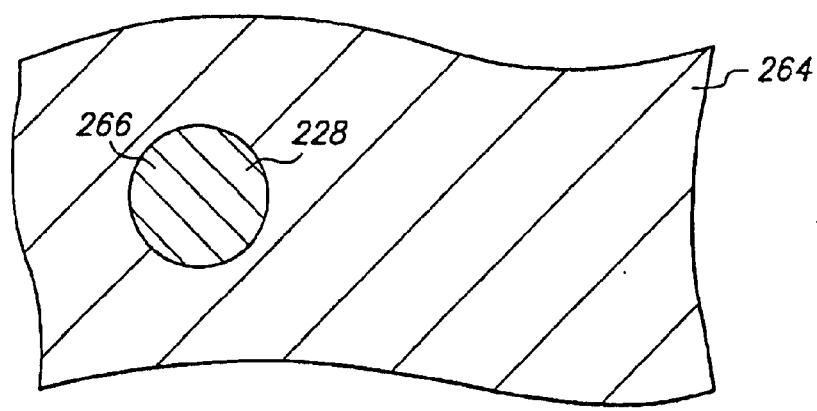
Figure 7J:
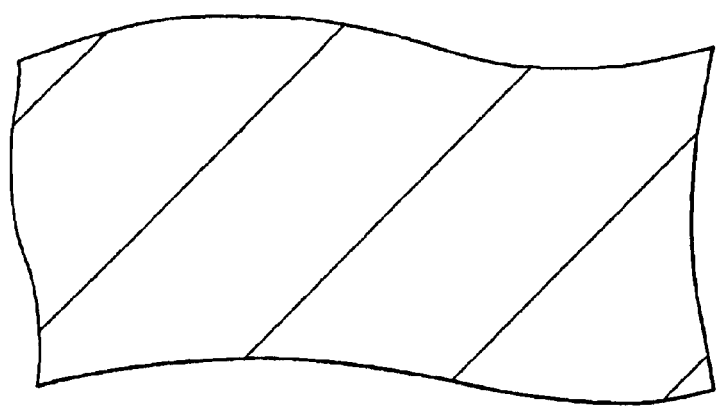
Figure 5K:
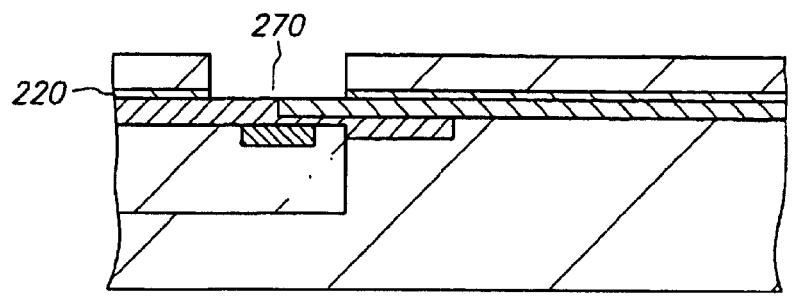
Figure 6K:
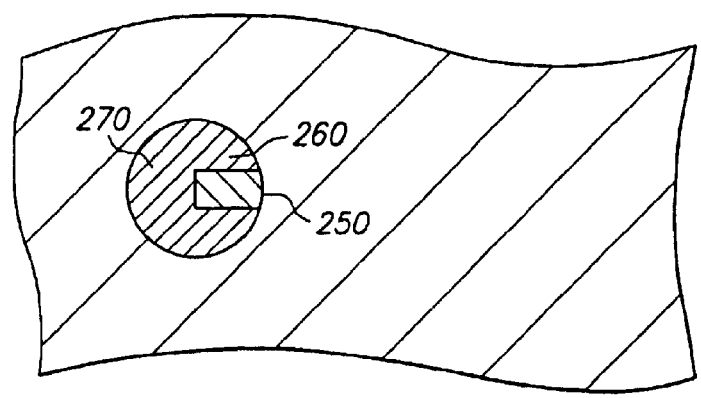
Figure 7K:
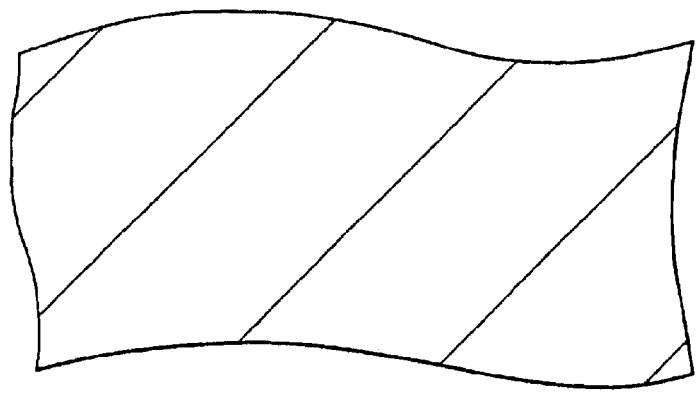
Figure 5L:
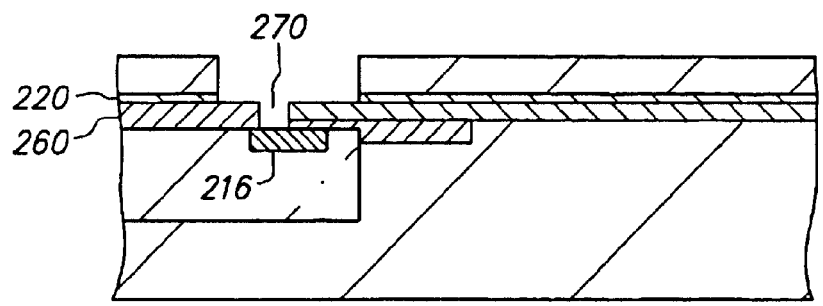
Figure 6L:
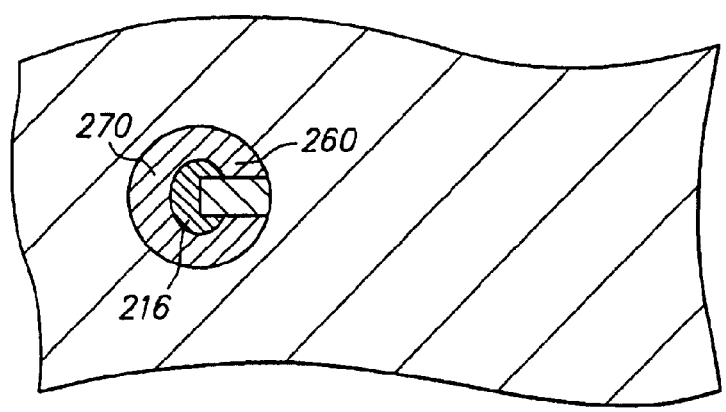
Figure 7L:
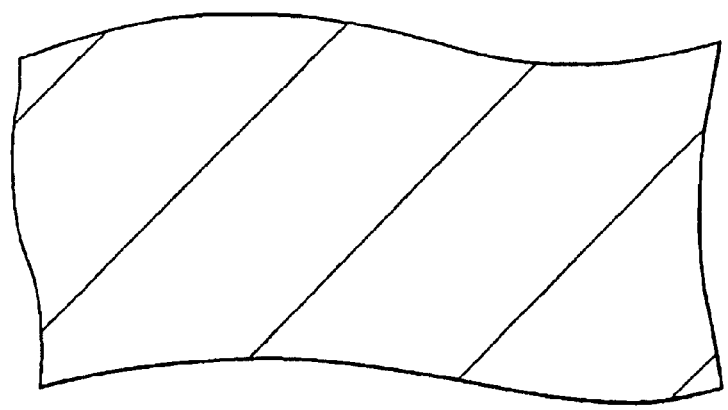
Figure 5M:
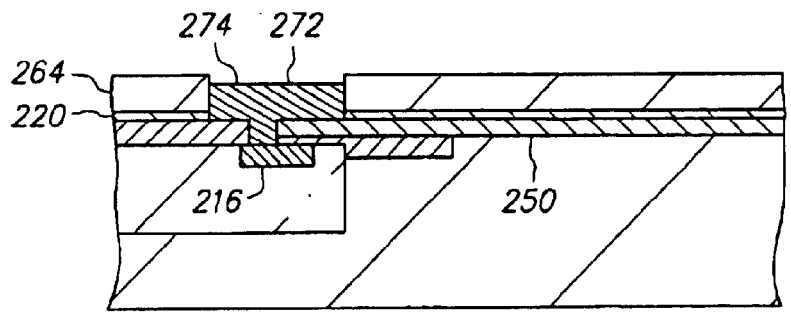
Figure 6M:
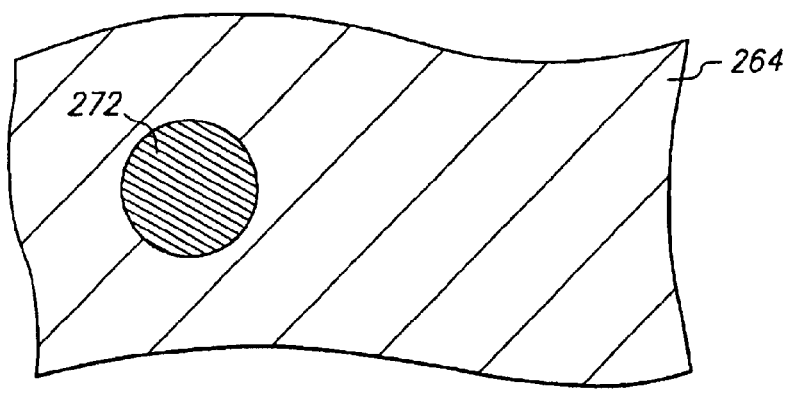
Figure 7M:
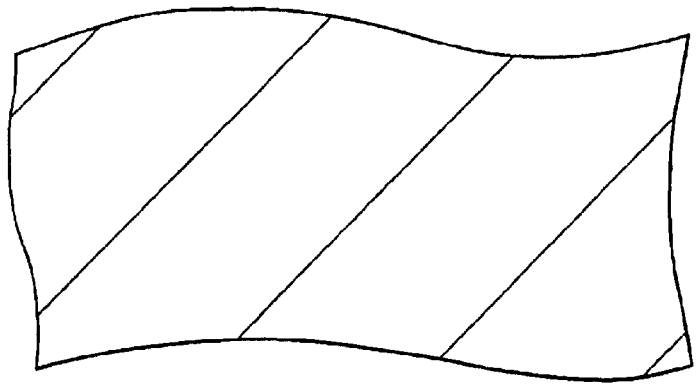
Figure 5N:
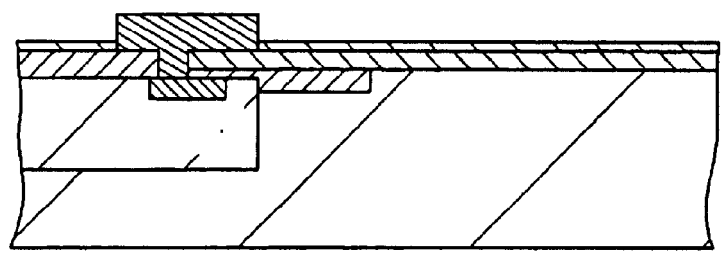
Figure 6N:
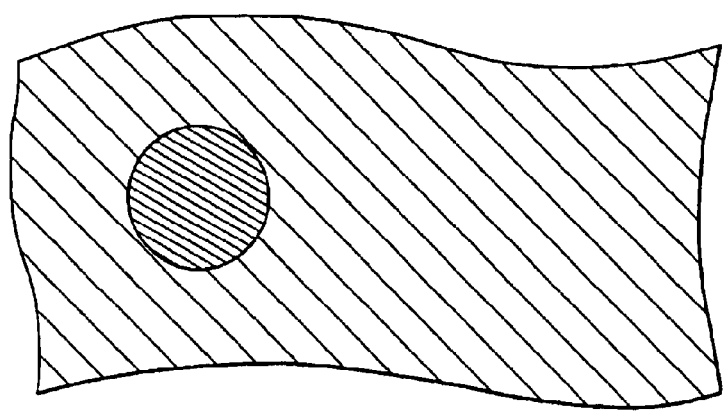
Figure 7N:
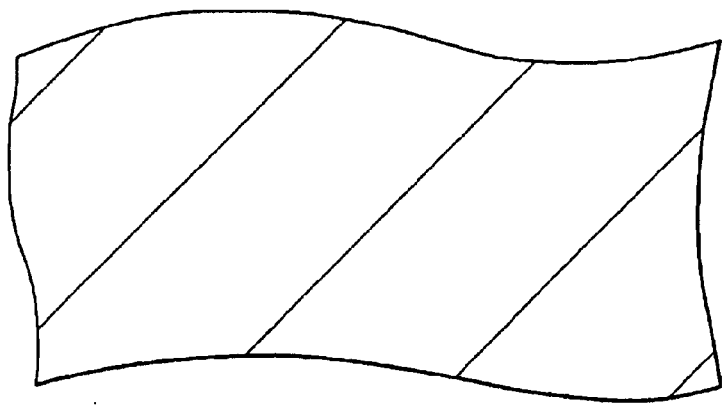
Figure 5O:
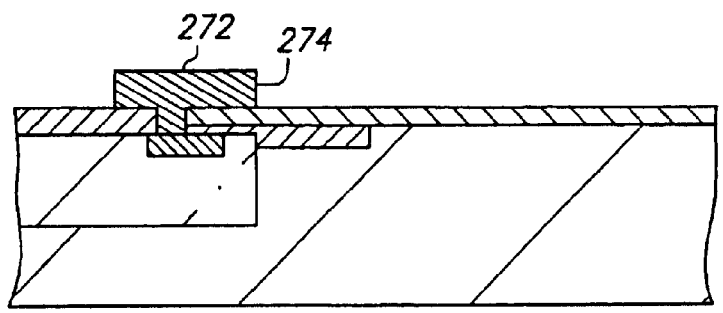
Figure 6O:
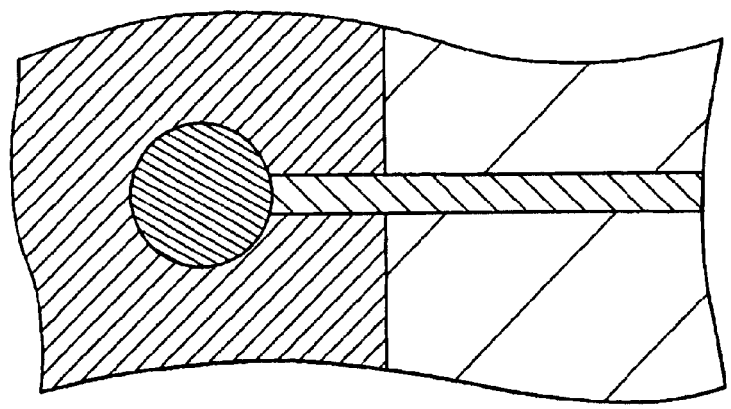
Figure 7O:
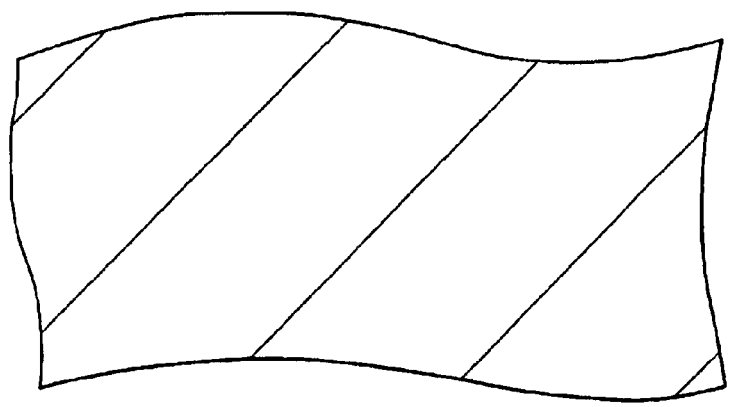
Figure 5P:
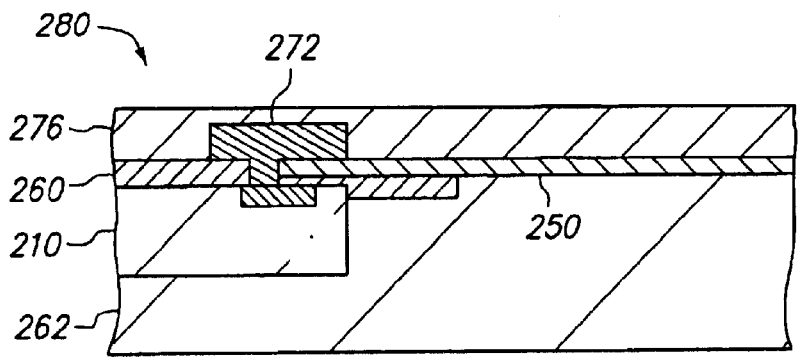
Figure 6P:
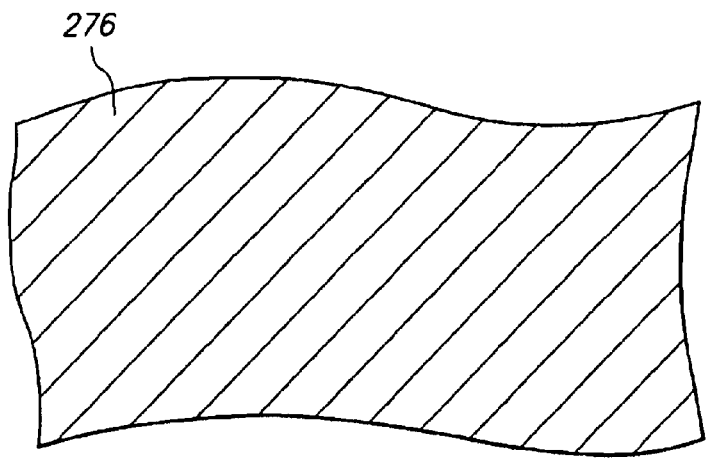
Figure 7P:
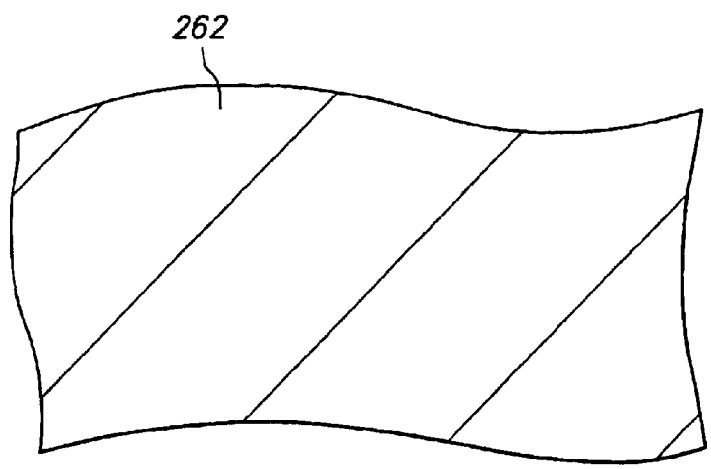

FIGS. 1A–1P, 2A–2P, 3A–3P and 4A–4P are cross-sectional, top, bottom and cross-sectional views, respectively, of a method of connecting a conductive trace to a semiconductor chip assembly in accordance with a first embodiment of the present invention. FIGS. 4A–4P are oriented orthogonally with respect to FIGS. 1A–1P and depict FIGS. 1A–1P as viewed from left-to-right.

FIGS. 1A, 2A, 3A and 4A are cross-sectional, top, bottom and cross-sectional views, respectively, of semiconductor chip 110 which is an integrated circuit in which various transistors, circuits, interconnect lines and the like are formed (not shown). Chip 110 includes opposing major surfaces 112 and 114. Surface 112 is the active surface and includes conductive pad 116 and passivation layer 118.

Pad 116 is substantially aligned with passivation layer 118 so that surface 112 is essentially flat. Alternatively, if desired, pad 116 can extend above or be recessed below passivation layer 118. Pad 116 provides a bonding site to electrically couple chip 110 with external circuitry. Thus, pad 116 can be an input/output pad or a power/ground pad. Pad 116 has a length and width of 100 microns.

Pad 116 has an aluminum base that is cleaned by dipping chip 110 in a solution containing 0.05 M phosphoric acid at room temperature for 1 minute and then rinsed in distilled water. Pad 116 can have the aluminum base serve as a surface layer, or alternatively, pad 116 can be treated to include a surface layer that covers the aluminum base, depending on the nature of a connection joint that shall subsequently contact the surface layer. In this embodiment, an electroplated copper connection joint is used. Therefore, pad 116 is treated to provide a surface layer that will accommodate this connection joint. Pad 116 can be treated by depositing several metal layers, such as chromium/copper/gold or titanium/nickel/gold on the aluminum base. The chromium or titanium layer provides a barrier for the aluminum base and an adhesive between the overlaying metal and the aluminum base. The metal layers, however, are typically selectively deposited by evaporation, electroplating or sputtering using a mask which is a relatively complicated process. Alternatively, pad 116 can be treated by forming a nickel surface layer on the aluminum base. For instance, chip 110 is dipped in a zinc solution to deposit a zinc layer on the aluminum base. This step is commonly known as zincation. Preferably, the zinc solution contains about 150 grams/liter of NaOH, 25 grams/liter of ZnO, and 1 gram/liter of NaNO$_3$, as well as tartaric acid to reduce the rate at which the aluminum base dissolves. Thereafter, the nickel surface layer is electrolessly deposited on the zincated aluminum base. A suitable electroless nickel plating solution is Enthone Enplate NI-424 at 85° C.

Chip 110 includes many other pads on surface 112, and only pad 116 is shown for convenience of illustration. In addition, chip 110 has already been singulated from other chips that it was previously attached to on a wafer.

FIGS. 1B, 2B, 3B and 4B are cross-sectional, top, bottom and cross-sectional views, respectively, of metal base 120 which includes opposing major surfaces 122 and 124, copper layer 126 and nickel layer 128. Copper layer 126 provides surface 122 and is spaced from surface 124, and nickel layer 128 provides surface 124 and is spaced from surface 122. Copper layer 126 is 200 microns thick, and nickel layer 128 is 1 micron thick.

FIGS. 1C, 2C, 3C and 4C are cross-sectional, top, bottom and cross-sectional views, respectively, of photoresist layers 140 and 142 formed on metal base 120. Photoresist layers 140 and 142 are deposited using a dry film lamination process in which hot rolls simultaneously press photoresist layers 140 and 142 onto surfaces 122 and 124, respectively. Thereafter, photoresist layer 142 is patterned by selectively applying light through a reticle (not shown), applying a developer solution to remove the photoresist portions rendered soluble by the light, and then hard baking, as is conventional. As a result, photoresist layer 140 remains unpatterned, and photoresist layer 142 contains opening 144 that selectively exposes portion 146 of surface 124. Photoresist layers 140 and 142 have a thickness of 25 microns.

FIGS. 1D, 2D, 3D and 4D are cross-sectional, top, bottom and cross-sectional views, respectively, of conductive trace 150 formed on metal base 120. Conductive trace 150 includes opposing major surfaces 152 and 154 and peripheral sidewalls 156 therebetween. Surface 152 faces towards and contacts and is covered by metal base 120, surface 154 faces away from metal base 120 and is exposed, and peripheral sidewalls 156 extend orthogonally from metal base 120 and are covered by photoresist layer 142. Conductive trace 150 is a flat planar elongated lead composed of copper with a thickness of 12 microns and a width of 50 microns.

Conductive trace 150 is formed by an electroplating operation using photoresist layers 140 and 142 as plating masks. Thus, conductive trace 150 is formed additively on selectively exposed portion 146 of surface 124 of metal base 120. Metal base 120 is connected to a plating bus (not shown), current is applied to the plating bus from an external power source, and the structure is submerged in an electrolytic copper plating solution such as Sel-Rex CUBATH M™ at room temperature while current is applied to the plating bus. As a result, conductive trace 150 plates on exposed portion 146 of metal base 120. Thereafter, the structure is removed from the electrolytic copper plating solution and rinsed in distilled water to remove contaminants.

FIGS. 1E, 2E, 3E and 4E are cross-sectional, top, bottom and cross-sectional views, respectively, of metal base 120 and conductive trace 150 after photoresist layers 140 and 142 are stripped. Photoresist layers 140 and 142 are removed using a solvent, such as a mild alkaline solution with a pH of 9, that is highly selective of photoresist with respect to copper and nickel. Therefore, no appreciable amount of metal base 120 or conductive trace 150 is removed.

At this stage, conductive trace 150 remains attached to metal base 120, surface 152 remains covered by metal base 120, and surface 154 and peripheral sidewalls 156 are exposed.

FIGS. 1F, 2F, 3F and 4F are cross-sectional, top, bottom and cross-sectional views, respectively, of adhesive 160 formed on metal base 120 and conductive trace 150. Adhesive 160 may include an organic surface protectant such as HK 2000 which is promptly applied to the structure after conductive trace 150 is formed to reduce native oxide formation on the exposed copper surfaces. The use of organic surface protectant layers in insulative adhesives for semiconductor chip assemblies is well-known in the art.

Thereafter, a liquid resin (A stage) such as polyamic acid is applied over selected portions of metal base 120 and conductive trace 150 using stencil printing. During stencil printing, a stencil (not shown) is placed over metal base 120, a stencil opening is aligned with metal base 120, and then a squeegee (not shown) pushes the liquid resin along the surface of the stencil opposite metal base 120, through the stencil opening and onto metal base 120 and conductive trace 150. The liquid resin is compliant enough at room temperature to conform to virtually any shape. Therefore, the liquid resin flows over conductive trace 150. Adhesive 160 has a thickness of 30 microns as measured from conductive trace 150.

For convenience of illustration, adhesive 160 is shown below metal base 120 to retain a single orientation throughout the figures for ease of comparison between the figures, although in this step metal base 120 would be inverted so that gravitational force would assist the liquid resin flow.

FIGS. 1G, 2G, 3G and 4G are cross-sectional, top, bottom and cross-sectional views, respectively, of chip 110 mechanically attached to metal base 120 and conductive trace 150 by adhesive 160.

Adhesive 160 is disposed between and contacts chip 110 and metal base 120, and likewise, adhesive 160 is disposed between and contacts chip 110 and conductive trace 150. Surface 112 of chip 110 faces towards metal base 120 and conducive trace 150 and is covered by adhesive 160, and surface 114 of chip 110 faces away from metal base 120 and conductive trace 150 and is exposed. Chip 110 and metal base 120 do not contact one another, and chip 110 and conductive trace 150 do not contact one another.

Adhesive 160 is sandwiched between chip 110 and metal base 120 and between chip 110 and conductive trace 150 using relatively low pressure from a pick-up head that places chip 110 on adhesive 160, holds chip 110 against adhesive 160 for 5 seconds and then releases chip 110. The pick-up head is heated to a relatively low temperature such as 150° C., and adhesive 160 receives heat from the pick-up head transferred through chip 110. As a result, adhesive 160 proximate to chip 110 is partially polymerized (B stage) and forms a gel but is not fully cured, and adhesive 160 that is partially polymerized provides a loose mechanical bond between chip 110 and conductive trace 150.

Chip 110 and metal base 120 are positioned relative to one another so that chip 110 is disposed within the periphery of adhesive 160, conductive trace 150 is disposed above and overlaps and is electrically isolated from pad 116, and conductive trace 150 extends within and outside the periphery of chip 110. Chip 110 and metal base 120 can be aligned using an automated pattern recognition system.

Thereafter, the structure is placed in an oven and adhesive 160 is fully cured (C stage) at relatively low temperature in the range of 200 to 250° C. to form a solid adhesive insulative thermosetting polyimide layer that mechanically attaches chip 110 to metal base 120 and conductive trace 150. Adhesive 160 is 3 microns thick between pad 116 and conductive trace 150.

At this stage, conductive trace 150 is covered from above by metal base 120, adhesive 160 is covered from above by metal base 120, chip 110 is covered from above by adhesive 160, and pad 116 is separated from conductive trace 150 by the thickness of adhesive 160.

For convenience of illustration, chip 110 is shown below adhesive 160 which is shown below metal base 120 to retain a single orientation throughout the figures for ease of comparison between the figures, although in this step metal base 120 would be inverted to facilitate the placement of chip 110 relative to metal base 120.

FIGS. 1H, 2H, 3H and 4H are cross-sectional, top, bottom and cross-sectional views, respectively, of encapsulant 162 formed on chip 110, metal base 120, conductive trace 150 and adhesive 160 by transfer molding. Transfer molding is the most popular chip encapsulation method for essentially all plastic packages. Generally speaking, transfer molding involves forming components in a closed mold from a molding compound that is conveyed under pressure in a hot, plastic state from a central reservoir called the transfer pot through a tree-like array of runners and gates into dosed cavities. Molding compounds are well-known in the art. Encapsulant 162 contacts surface 114 and the outer edges of chip 110, and surfaces of metal base 120, conductive trace 150 and adhesive 160 that face towards and are outside the periphery of chip 110. Encapsulant 162 is a solid adherent compressible protective layer that provides back-side environmental protection such as moisture resistance and particle protection for chip 110 as well as mechanical support for conductive trace 150 outside the periphery of chip 110. Encapsulant 162 is 100 microns thick beyond surface 114.

FIGS. 1I, 2I, 3I and 4I are cross-sectional, top, bottom and cross-sectional views, respectively, of the structure after copper layer 126 is removed by wet chemical etching.

The wet chemical etch can be sprayed on surface 122 of metal base 120, or the structure can be dipped in the wet chemical etch. The wet chemical etch is highly selective of copper with respect to nickel and the molding compound. In addition, conductive trace 150 is protected from the wet chemical etch by nickel layer 128 and encapsulant 162. Therefore, no appreciable amount of nickel layer 128, conductive trace 150 or encapsulant 162 is removed. A suitable wet chemical etch can be provided by a solution containing alkaline ammonia. The optimal etch time for exposing copper layer 126 to the wet chemical etch in order to completely remove copper layer 126 without excessively exposing nickel layer 128 to the wet chemical etch can be established through trial and error.

The wet chemical etch removes copper layer 126, thereby exposing nickel layer 128. At this stage, metal base 120 is composed of nickel layer 128.

FIGS. 1J, 2J, 3J and 4J are cross-sectional, top, bottom and cross-sectional views, respectively, of photoresist layer 164 formed on metal base 120. Photoresist layer 164 is deposited using a dry film lamination process in which a hot roll presses photoresist layer 164 onto nickel layer 128. Thereafter, photoresist layer 164 is patterned by selectively applying light through a reticle (not shown), applying a developer solution to remove the photoresist portions rendered soluble by the light, and then hard baking, as is conventional. As a result, photoresist layer 164 contains opening 166 that selectively exposes nickel layer 128 and is axially aligned with pad 116 and has a diameter of 200 microns. Photoresist layer 164 has a thickness of 25 microns.

FIGS. 1K, 2K, 3K and 4K are cross-sectional, top, bottom and cross-sectional views, respectively, of through-hole 170 that is partially formed and extends through metal base 120 and exposes conductive trace 150 and adhesive 160.

Through-hole 170 is formed through metal base 120 by wet chemical etching using photoresist layer 164 as an etch mask. Metal base 120, which at this stage consists of nickel layer 128, is selectively etched using a nickel etching solution, such as a dilute mixture of nitric and hydrochloric acid, that is highly selective of nickel with respect to polyimide and the molding compound. Therefore, no appreciable amount of adhesive 160 or encapsulant 162 is removed.

Since nickel layer 128 is extremely thin relative to conductive trace 150, and the structure is removed from the nickel etching solution immediately after through-hole 170 is formed through nickel layer 128, it is not critical that the nickel etching solution be highly selective of nickel with respect to copper. The nickel etching solution has no significant impact on conductive trace 150. In addition, conductive trace 150 and adhesive 160 protect pad 116 from the nickel etching solution. The optimal etch time for exposing nickel layer 128 to the wet chemical etch without significantly undercutting nickel layer 128 or impacting conductive trace 150 can be established through trial and error.

The wet chemical etch etches completely through nickel layer 128, thereby effecting a pattern transfer of photoresist layer 164 onto nickel layer 128. Through-hole 170 is axially aligned with pad 116 and has a diameter of 200 microns.

At this stage, through-hole 170 is formed in and extends vertically through metal base 120 to conductive trace 150 and adhesive 160 but does not extend to pad 116. In addition, adhesive 160 continues to contact and cover chip 110 and contact surface 154 and peripheral sidewalls 156 of conductive trace 150, and adhesive 160 is coplanar with and adjacent to but does not contact or cover surface 152 of conductive trace 150.

FIGS. 1L, 2L, 3L and 4L are cross-sectional, top, bottom and cross-sectional views, respectively, of respectively, of through-hole 170 that is fully formed and extends through metal base 120 and adhesive 160 and exposes pad 116.

Through-hole 170 is formed through adhesive 160 by applying a suitable etch that is highly selective of adhesive 160 with respect to pad 116 and conductive trace 150. In this instance, a selective TEA $CO_2$ laser etch is applied. The laser is directed at and axially aligned with and centered relative to pad 116. The laser has a spot size of 70 microns, pad 116 has a length and width of 100 microns, and through-hole 170 has a diameter of 200 microns at nickel layer 128. As a result, the laser strikes pad 116 and portions of conductive trace 150 and adhesive 160 that overlap pad 116 and ablates adhesive 160, and nickel layer 128 and photoresist layer 164 are outside the scope of the laser.

The laser drills through and removes a central portion of adhesive 160 within through-hole 170, thereby extending through-hole 170 through adhesive 160. However, portions of adhesive 160 that overlap the peripheral edges of pad 116 are outside the scope of the laser and remain intact. Likewise, conductive trace 150 shields the underlying adhesive 160 from the laser etch, and portions of adhesive 160 sandwiched between pad 116 and conductive trace 150 remain intact. The laser etch is anisotropic, and therefore little or none of adhesive 160 sandwiched between pad 116 and conductive trace 150 is undercut or removed.

Thereafter, a brief cleaning step can be applied to remove oxides and debris that may be present on the exposed portions of pad 116, nickel layer 128 and conductive trace 150. For instance, a brief oxygen plasma cleaning step can be applied to the structure. Alternatively, a brief wet chemical cleaning step using a solution containing potassium permanganate can be applied to the structure. In either case, the cleaning step deans the exposed portions of pad 116, nickel layer 128 and conductive trace 150 without damaging the structure.

Through-hole 170 is formed in and extends vertically through metal base 120 and adhesive 160, is axially aligned with and exposes pad 116, and has a diameter of 200 microns at nickel layer 128 and a diameter of 70 microns at adhesive 160. Through-hole 170 is formed without damaging pad 116, passivation layer 118 or conductive trace 150 and does not extend into chip 110.

Through-hole 170 may extend slightly beneath conductive trace 150 and have a diameter that is slightly larger than 70 microns due to the beam angle of the laser, the thermal effects of the laser, and/or the isotropic nature of an oxygen plasma or wet chemical cleaning step. For convenience of explanation, this slight enlargement is ignored.

FIGS. 1M, 2M, 3M and 4M are cross-sectional, top, bottom and cross-sectional views, respectively, of connection joint 172 formed on pad 116, metal base 120 and conductive trace 150.

Connection joint 172 is formed by an electroplating operation using photoresist layer 164 as a plating mask. Metal base 120 is connected to a plating bus (not shown), current is applied to the plating bus from an external power source, and the structure is submerged in an electrolytic copper plating solution such as Sal-Rex CUBATH M™ at room temperature. As a result, connection joint 172 begins to plate on metal base 120 and conductive trace 150 in through-hole 170. However, connection joint 172 does not initially deposit on pad 116 since adhesive 160 is an electrical insulator that cannot supply current from the plating bus to generate electroplating and pad 116 is electrically isolated from the plating bus.

As the electroplating operation continues, connection joint 172 continues to plate on metal base 120 and conductive trace 150 and expand axially in through-hole 170 towards pad 116. Eventually connection joint 172 contacts pad 116, and as a result, pad 116 is electrically connected to the plating bus by metal base 120 and connection joint 172, and connection joint 172 begins to plate on pad 116 as well.

The copper electroplating operation continues until connection joint 172 is about microns thick. Thereafter, the structure is removed from the electrolytic copper plating solution and rinsed in distilled water.

Connection joint 172 is formed in through-hole 170 and contacts and electrically connects pad 116, metal base 120 and conductive trace 150. Connection joint 172 contacts and covers portions of pad 116 beneath through-hole 170 and outside conductive trace 150 as well as portions of surface 152 and peripheral sidewalls 156 of conductive trace 150 that overlap pad 116. Thus, connection joint 172 provides a robust, permanent electrical connection between pad 116 and conductive trace 150.

Connection joint 172 includes thin C-shaped portion 174 that contacts and extends radially inward from metal base 120, is disposed outside conductive trace 150 and is spaced from through-hole 170 where through-hole 170 extends through adhesive 160. Furthermore, adhesive 160 remains in contact with and sandwiched between pad 116 and conductive trace 150.

Connection joint 172 is the only electrical conductor external to chip 110 that contacts pad 116, adhesive 160 and connection joint 172 are the only materials external to chip 110 that contact pad 116, and adhesive 160 and connection joint 172 are the only materials that contact both pad 116 and conductive trace 150.

FIGS. 1N, 2N, 3N and 4N are cross-sectional, top, bottom and cross-sectional views, respectively, of the structure after photoresist layer 164 is stripped. Photoresist layer 164 is removed using a solvent, such as a mild alkaline solution with a pH of 9, that is highly selective of photoresist with respect to copper, nickel, polyimide and the molding compound. Therefore, no appreciable amount of metal base 120, adhesive 160, encapsulant 162 or connection joint 172 is removed.

FIGS. 1O, 2O, 3O and 4O are cross-sectional, top, bottom and cross-sectional views, respectively, of the structure after metal base 120 is removed by wet chemical etching.

Metal base 120, which at this stage consists of nickel layer 128, is removed using a nickel etching solution, such as a dilute mixture of nitric and hydrochloric acid, that is highly selective of nickel with respect to polyimide and the molding compound. Therefore, no appreciable amount of adhesive 160 or encapsulant 162 is removed.

Since nickel layer 128 is extremely thin relative to conductive trace 150 and connection joint 172, and the structure is removed from the nickel etching solution soon after nickel layer 128 is stripped, it is not critical that the nickel etching solution be highly selective of nickel with respect to copper.

In fact, the nickel etching solution is also selective of copper, and C-shaped portion 174 is extremely thin relative to conductive trace 150 and the remainder of connection joint 172. As a result, the nickel etching solution also removes C-shaped portion 174, which is a relatively unimportant byproduct of the electroplating operation that formed connection joint 172. However, the nickel etching solution is not applied long enough to appreciably affect the other copper features.

The nickel etching solution has no significant impact on conductive trace 150 or connection joint 172. In addition, adhesive 160 and connection joint 172 protect pad 116 from the nickel etching solution. The optimal etch time for exposing nickel layer 128 to the wet chemical etch in order to completely remove nickel layer 128 without significantly impacting conductive trace 150 or connection joint 172 can be established through trial and error.

Removing metal base 120 removes the portions of metal base 120 that contact conductive trace 150, adhesive 160, encapsulant 162 and connection joint 172. Thus, removing metal base 120 reduces and eliminates contact area between metal base 120 and conductive trace 150, between metal base 150 and adhesive 160, between metal base 150 and encapsulant 162, and between metal base 150 and connection joint 172.

FIGS. 1P, 2P, 3P and 4P are cross-sectional, top, bottom and cross-sectional views, respectively, of insulative base 176 formed on conductive trace 150, adhesive 160, encapsulant 162 and connection joint 172.

Insulative base 176 is initially an epoxy in paste form that includes an epoxy resin, a curing agent, an accelerator and a filler. The filler is an inert material, such as silica (powdered fused quartz), that improves thermal conductivity, thermal shock resistance, and thermal coefficient of expansion matching. The epoxy paste is selectively deposited over the structure using stencil printing, then the epoxy paste is cured or hardened at a relatively low temperature in the range of 100 to 250° C. to form a solid adherent insulator that protects conductive trace 150 and connection joint 172. Insulative base 176 extends 50 microns above adhesive 160.

At this stage, the manufacture of semiconductor chip assembly 180 that includes chip 110, conductive trace 150, adhesive 160, encapsulant 162, connection joint 172 and insulative base 176 can be considered complete.

Conductive trace 150 is mechanically coupled to chip 110 by adhesive 160, and is electrically coupled to chip 110 by connection joint 172. Conductive trace 150 extends beyond an outer edge of chip 110 and provides horizontal fan-out routing between pad 116 and external circuitry. Encapsulant 162 and insulative base 176 provide mechanical support and environmental protection for the assembly.

The semiconductor chip assembly includes other conductive traces embedded in adhesive 160, and only a single conductive trace 150 is shown for convenience of illustration. The conductive traces are each electrically connected to a respective pad on chip 110 by a respective connection joint. Furthermore, the conductive traces each extend beyond an outer edge of chip 110 to provide horizontal fan-out routing for their respective pads.

Chip 110 is designed with the pads electrically isolated from one another. However, the pads are electrically connected to one another through the conductive traces, the connection joints and metal base 120 before metal base 120 is removed. Thereafter, once metal base 120 is removed, the conductive traces are electrically isolated from one another by adhesive 160, encapsulant 162 and insulative base 176, the connection joints are electrically isolated from one another by adhesive 160 and insulative base 176, and therefore the pads are electrically isolated from one another.

Advantageously, there is no plating bus or related circuitry that need be disconnected or severed from chip 110 or the conductive traces after metal base 120 is removed.

Figure 8A:
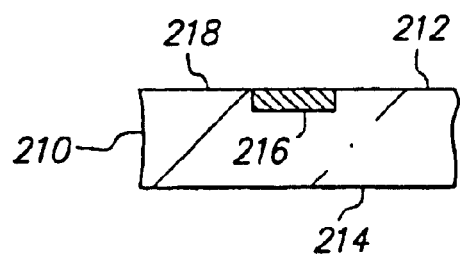
FIGS. 8A–8P are cross-sectional views corresponding to FIGS. 5A–5P, respectively.
Figure 8B:
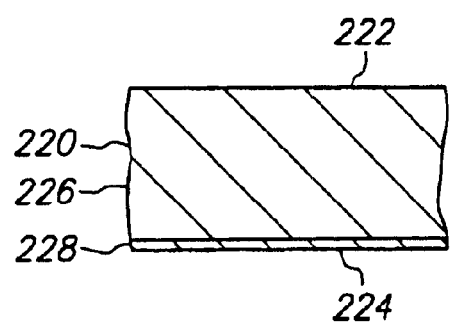
Figure 8C:
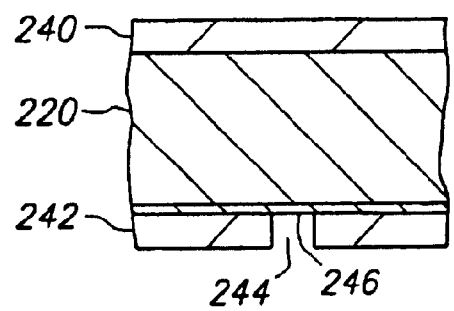
Figure 8D:
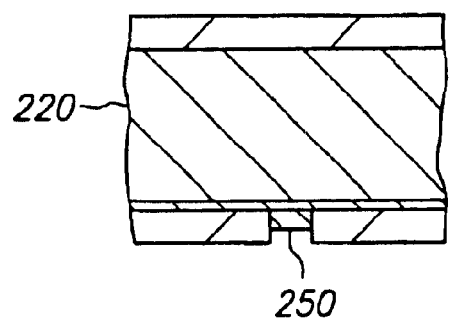
Figure 8E:
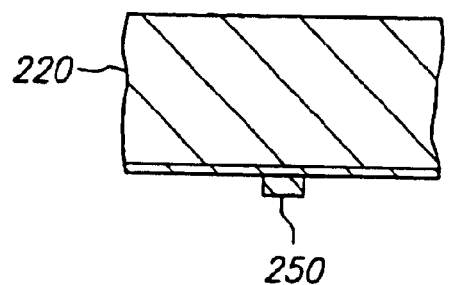
Figure 8F:
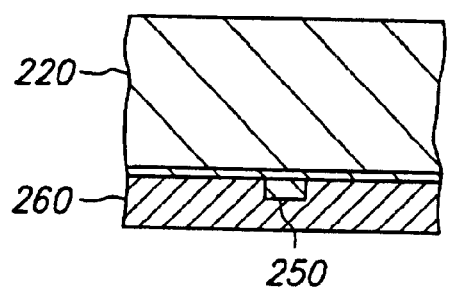
Figure 8G:
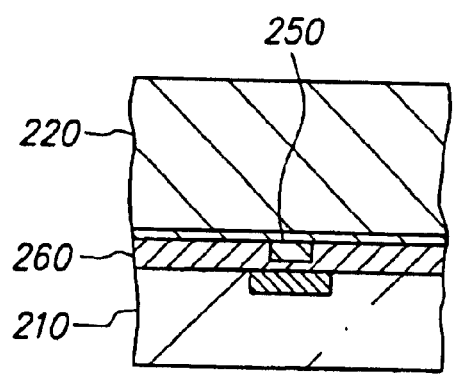
Figure 8H:
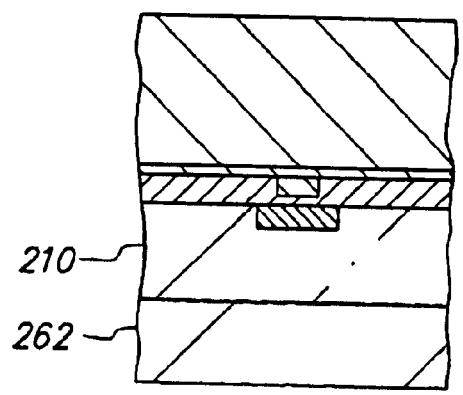
Figure 8I:
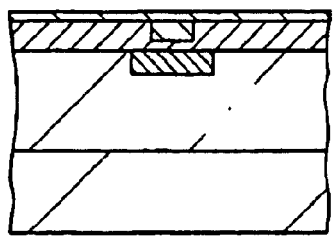
Figure 8J:
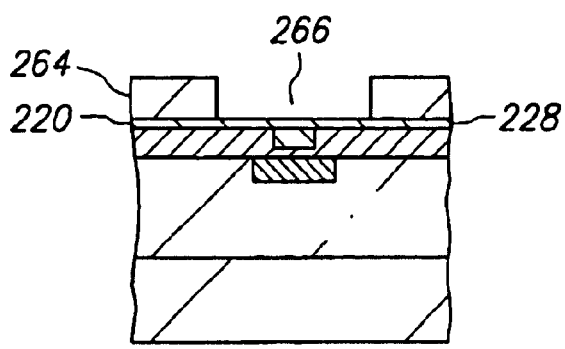
Figure 8K:
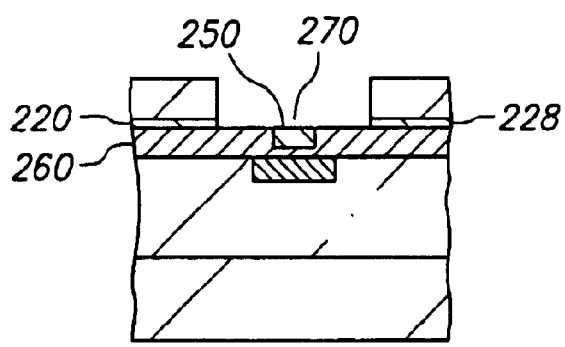
Figure 8L:
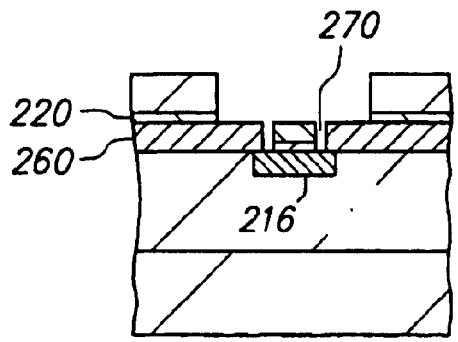
Figure 8M:
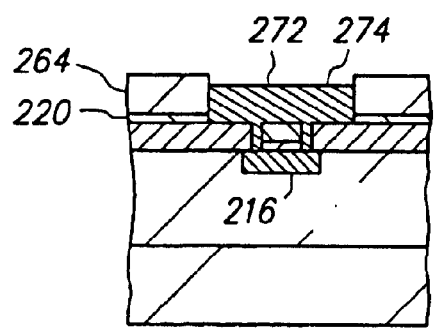
Figure 8N:
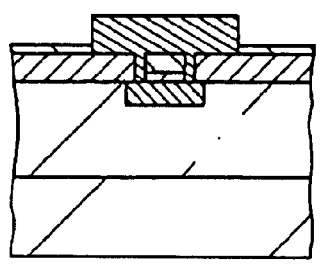
Figure 8O:
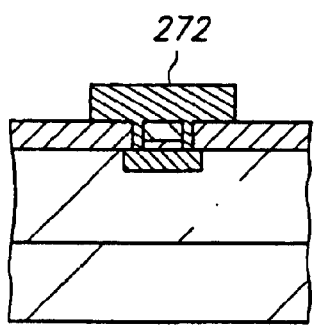
Figure 8P:
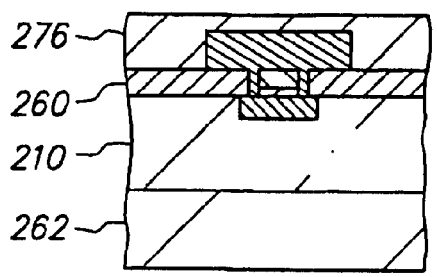
Figure 9A:
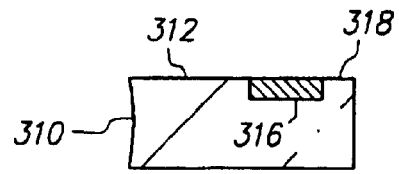
FIGS. 9A–9O are cross-sectional views showing a method of connecting a conductive trace to a semiconductor chip in accordance with a third embodiment of the present invention.
Figure 10A:
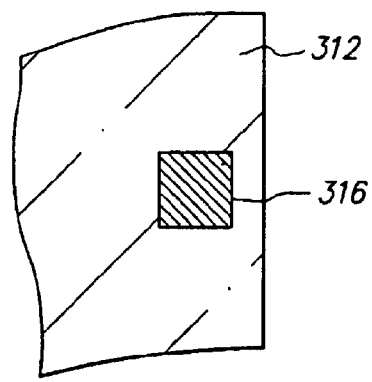
FIGS. 10A–10O are top plan views corresponding to FIGS. 9A–9O, respectively.
Figure 11A:
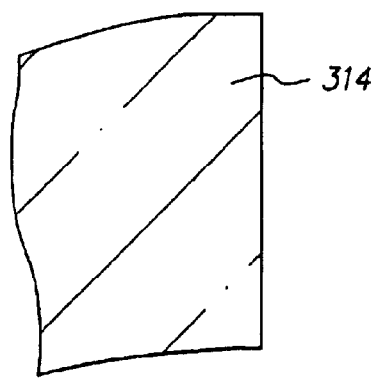
FIGS. 11A–11O are bottom plan views corresponding to FIGS. 9A–9O, respectively.
Figure 9B:
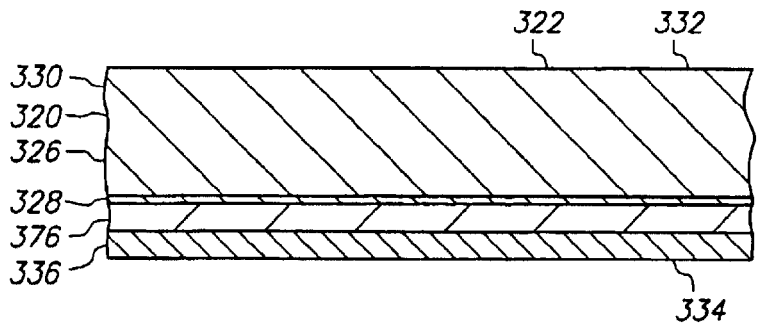
Figure 10B:
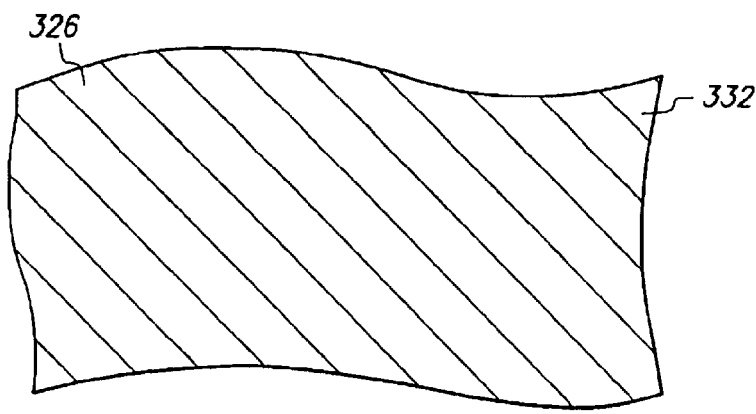
Figure 11B:
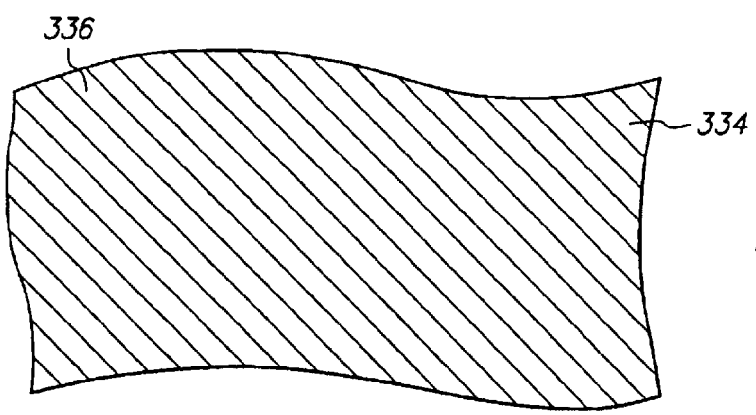
Figure 9C:
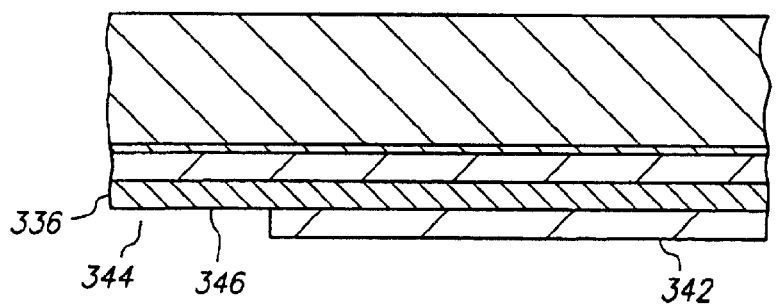
Figure 10C:
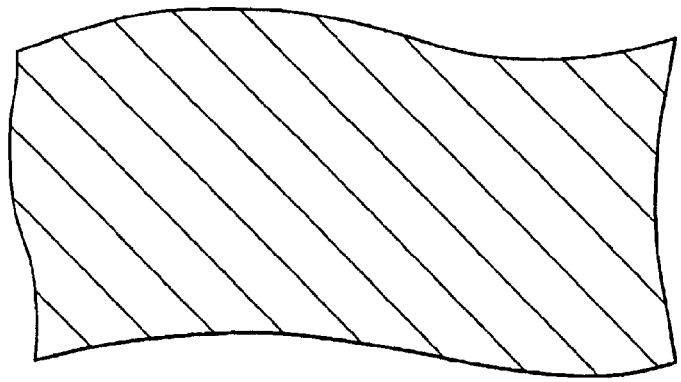
Figure 11C:
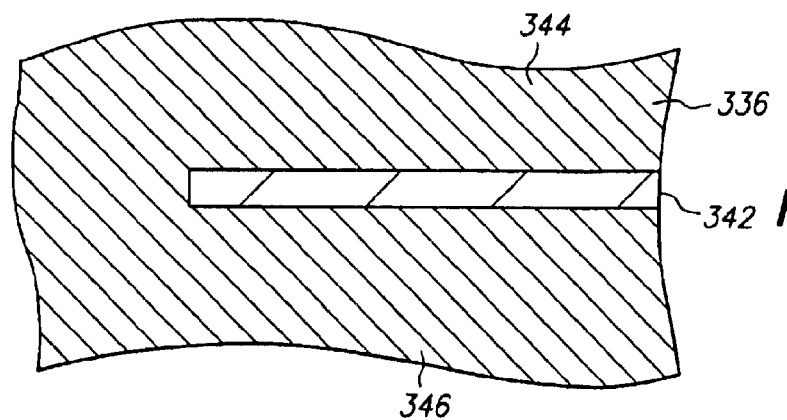
Figure 9D:
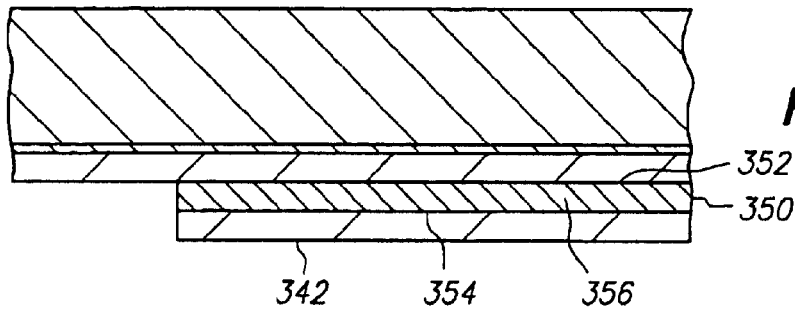
Figure 10D:
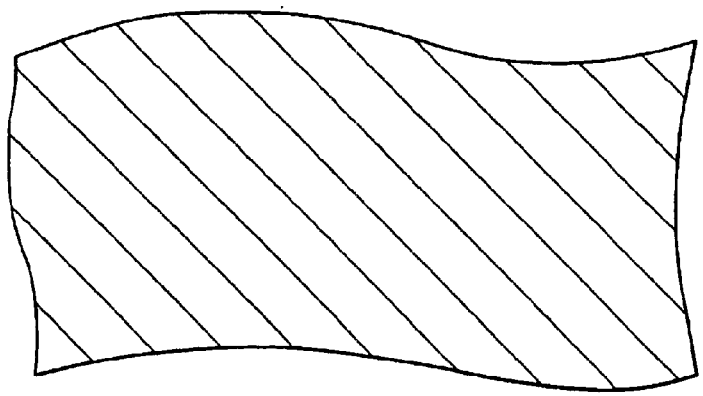
Figure 11D:
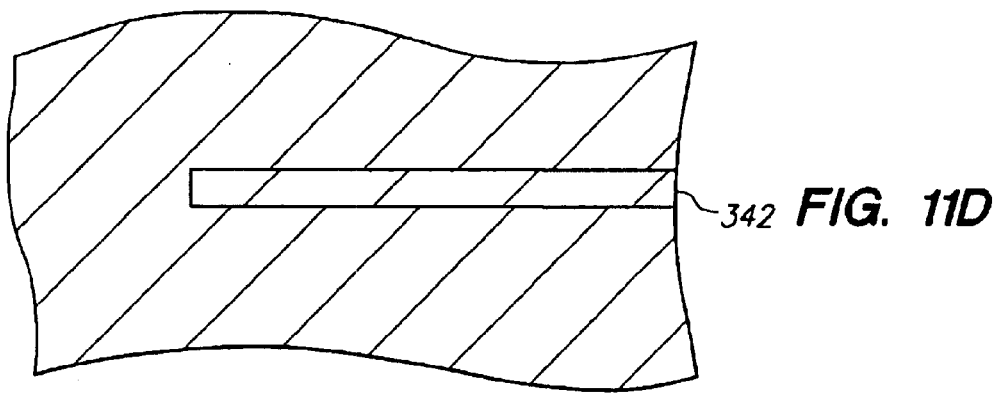
Figure 9E:
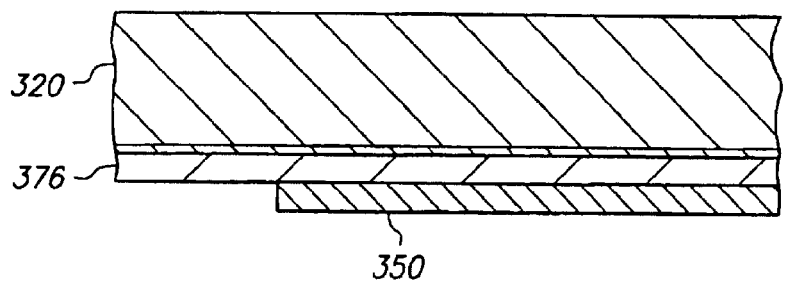
Figure 10E:
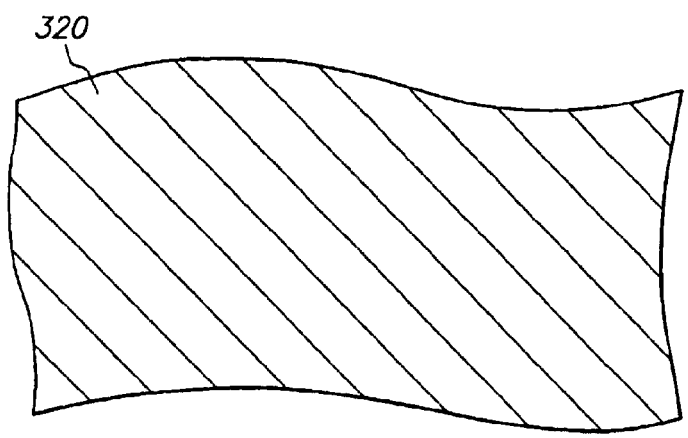
Figure 11E:
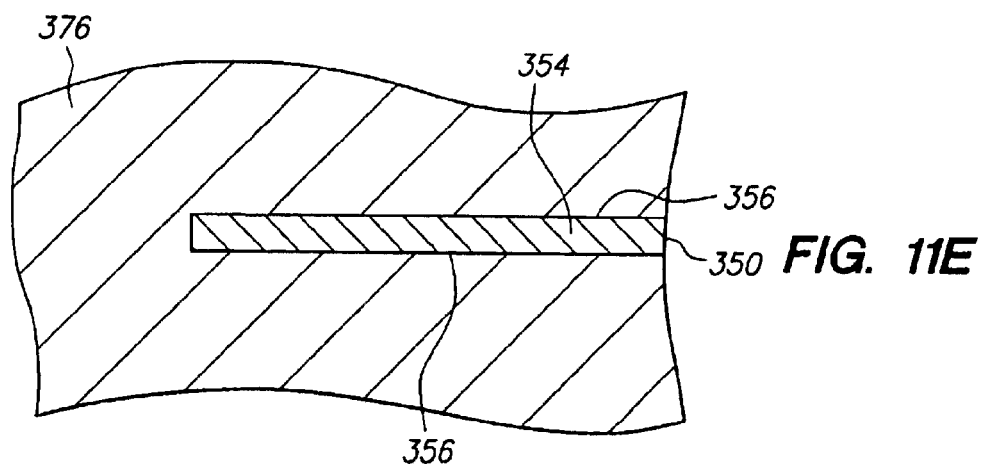
Figure 9F:
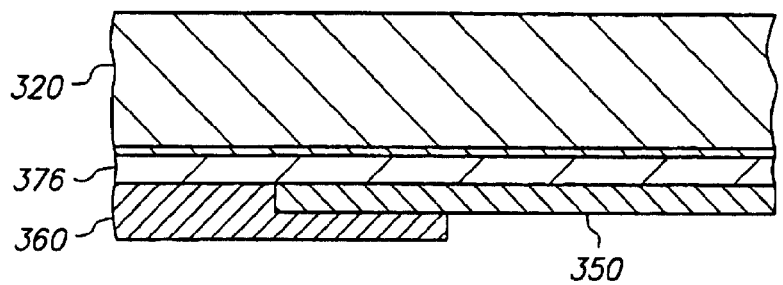
Figure 10F:
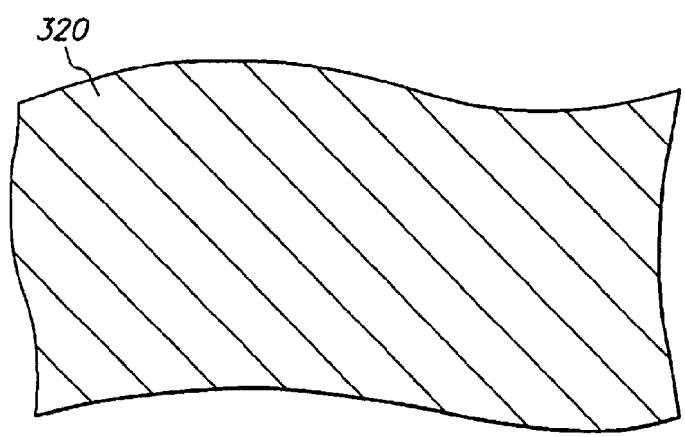
Figure 11F:
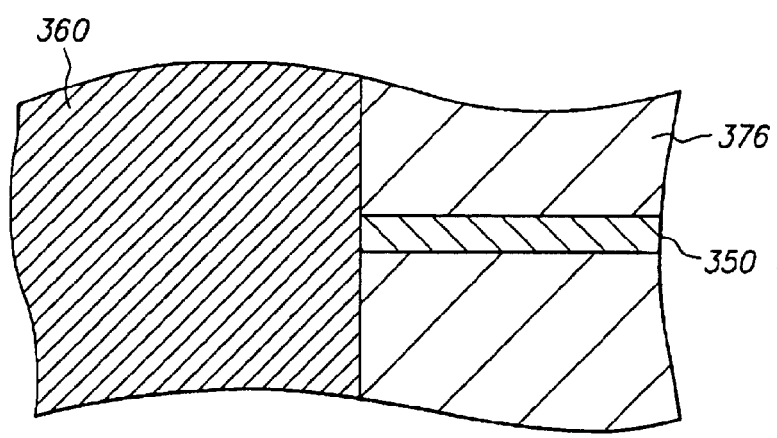
Figure 9G:
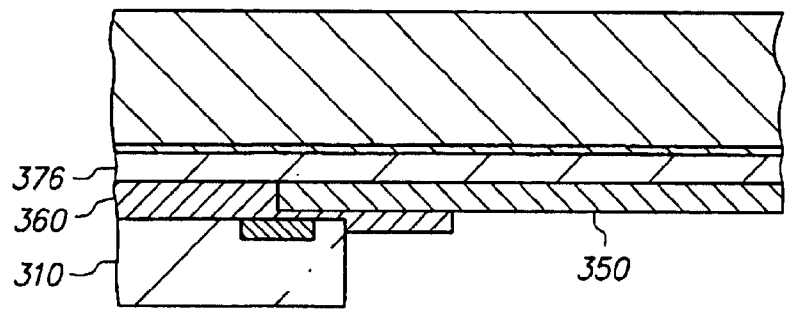
Figure 10G:
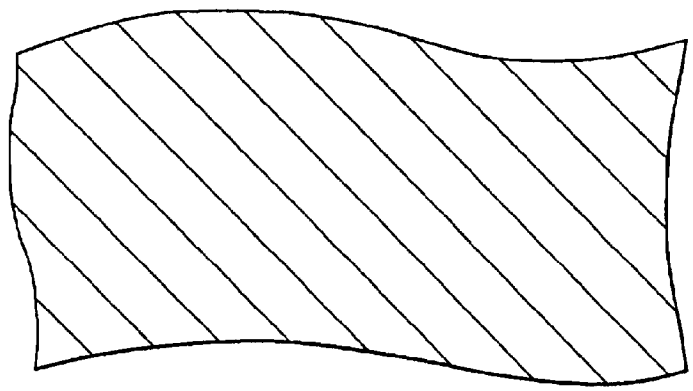
Figure 11G:
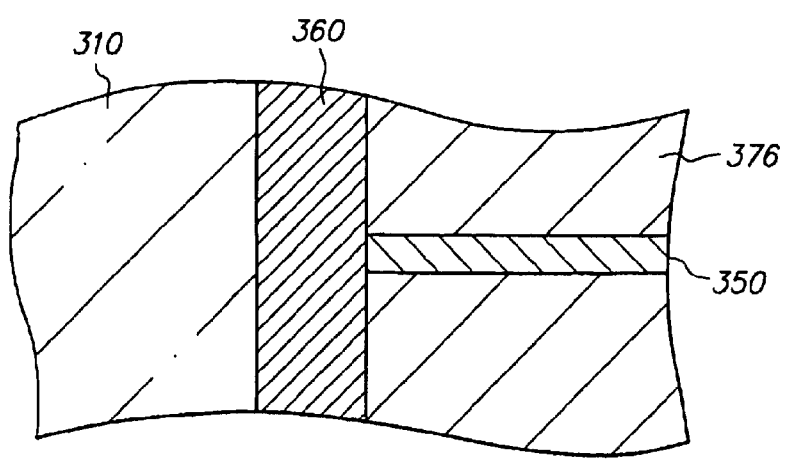
Figure 9H:
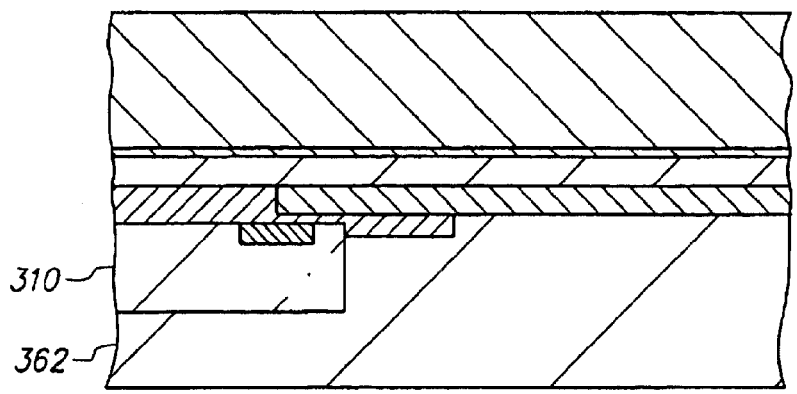
Figure 10H:
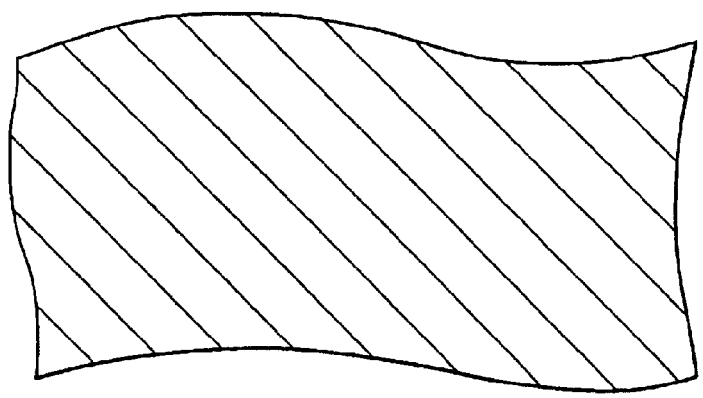
Figure 11H:
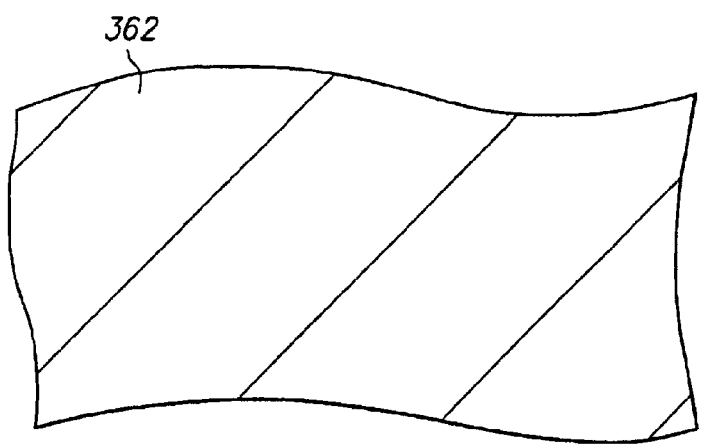
Figure 9I:
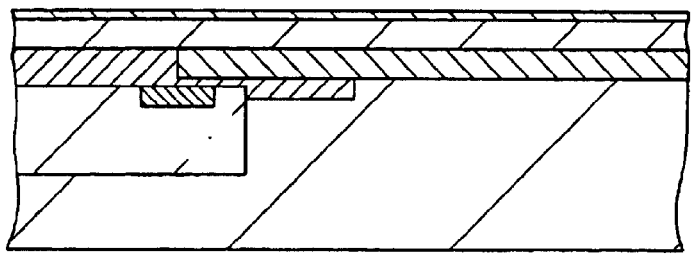
Figure 10I:
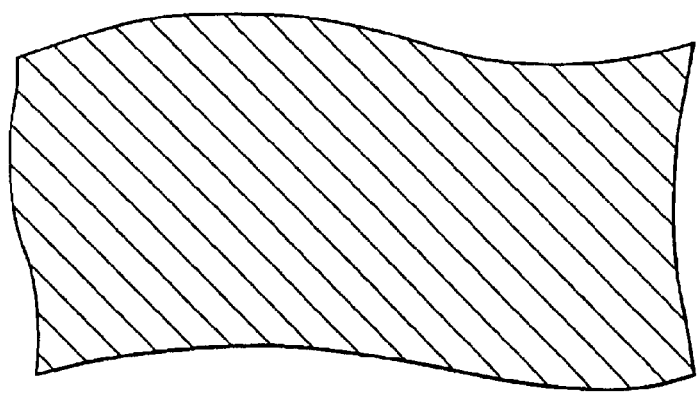
Figure 11I:
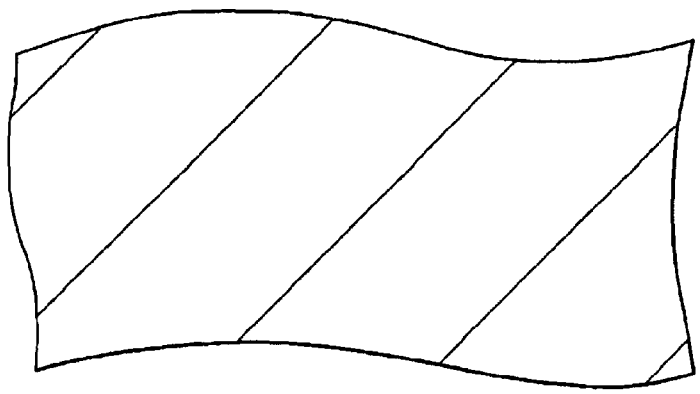
Figure 9J:
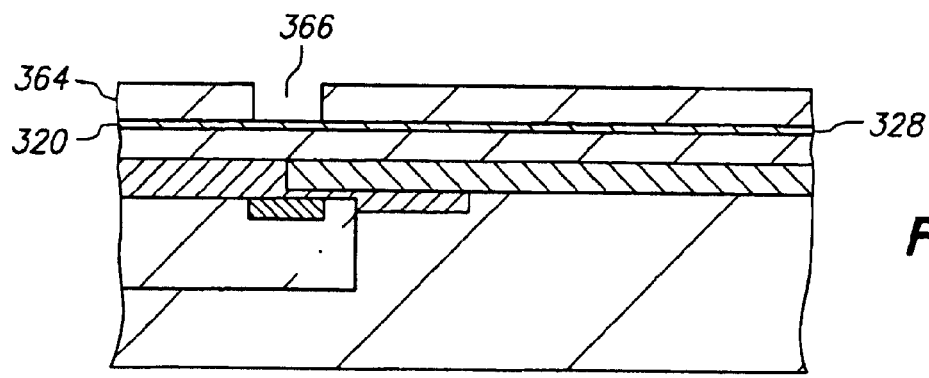
Figure 10J:
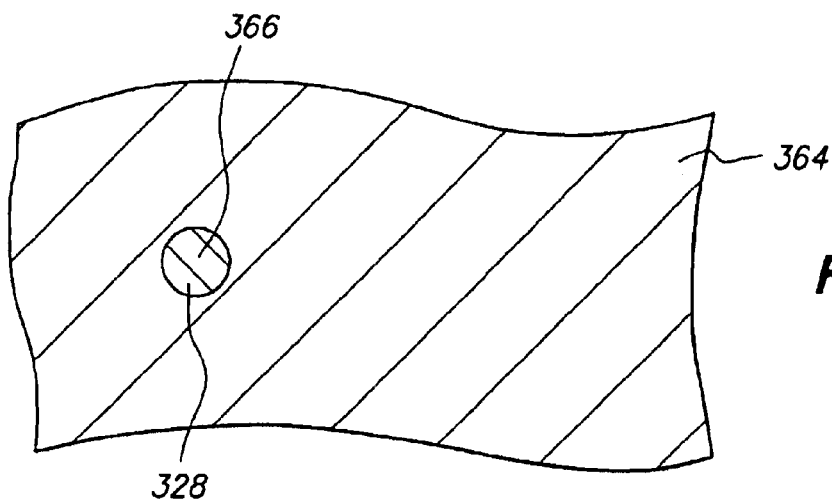
Figure 11J:
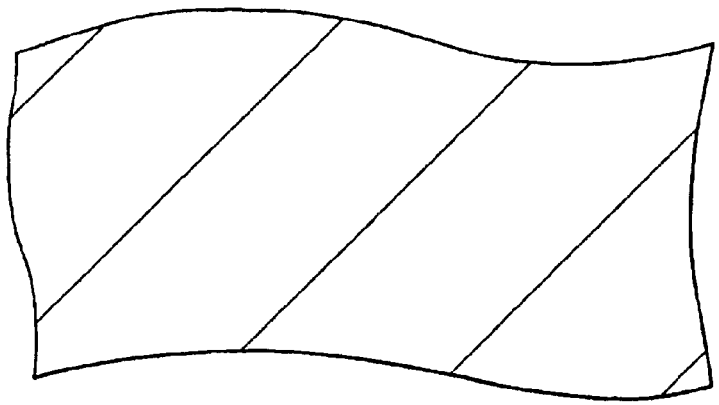
Figure 9K:
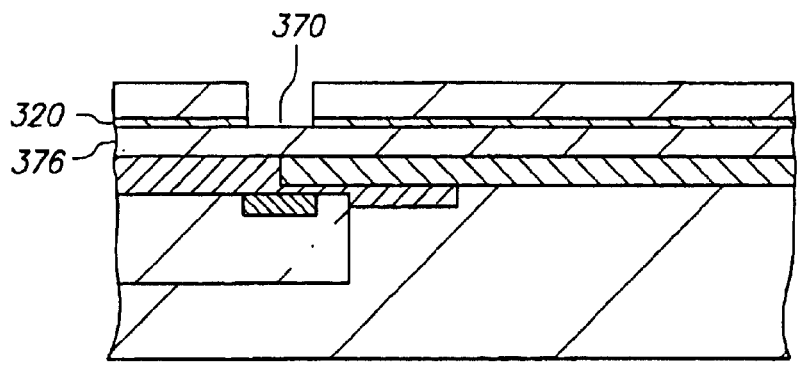
Figure 10K:
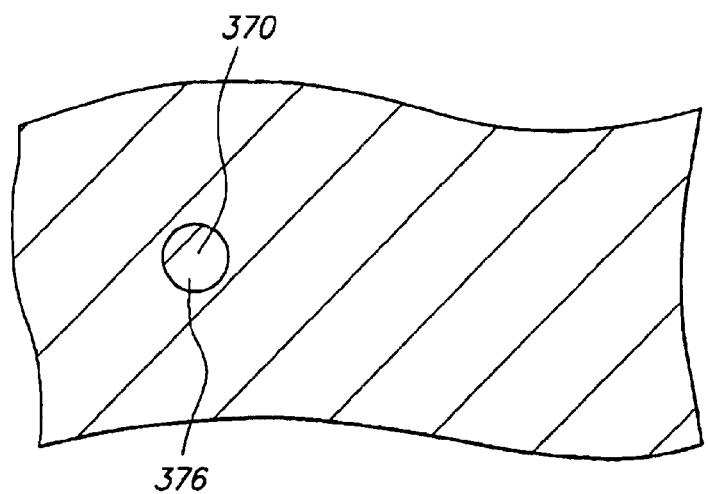
Figure 11K:
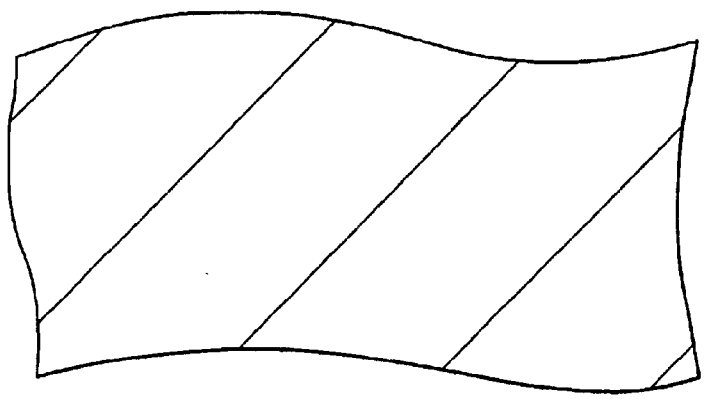
Figure 9L:
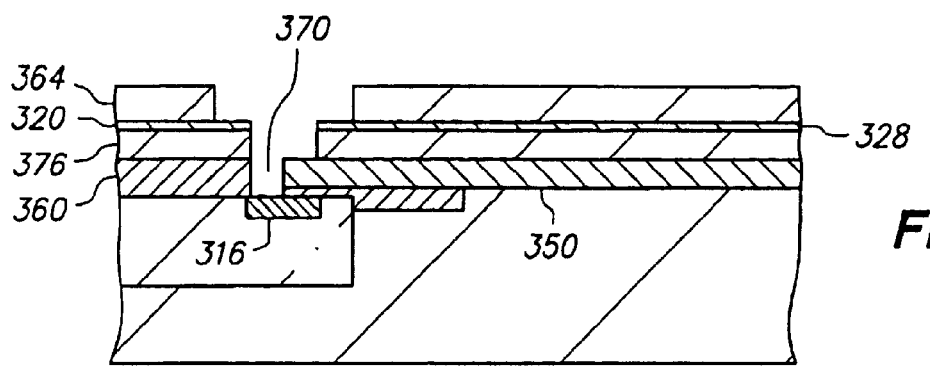
Figure 10L:
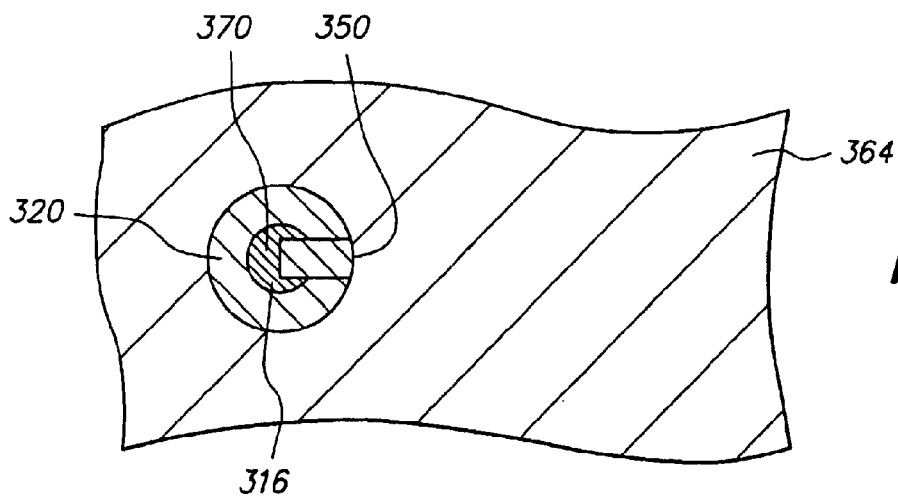
Figure 11L:
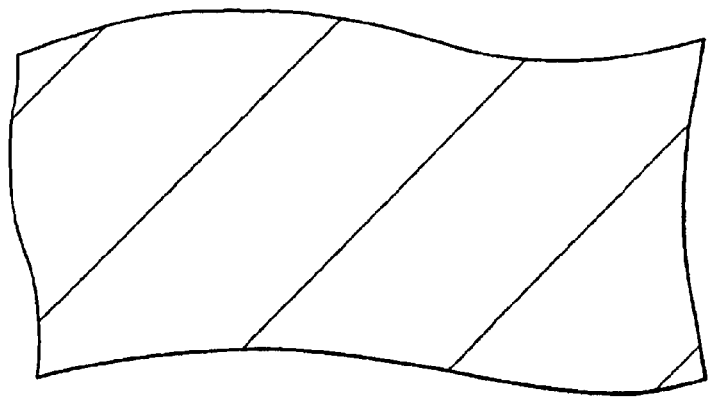
Figure 9M:
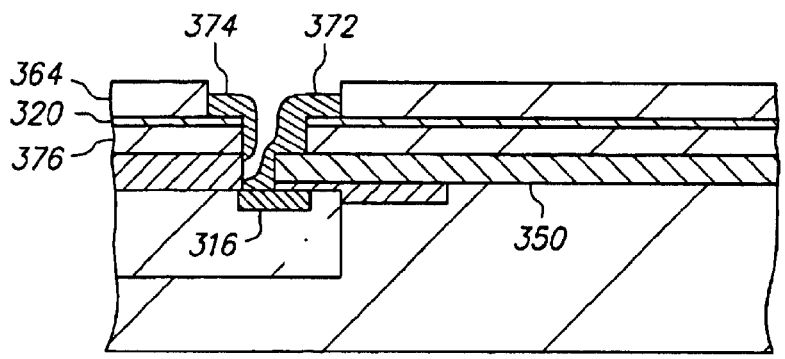
Figure 10M:
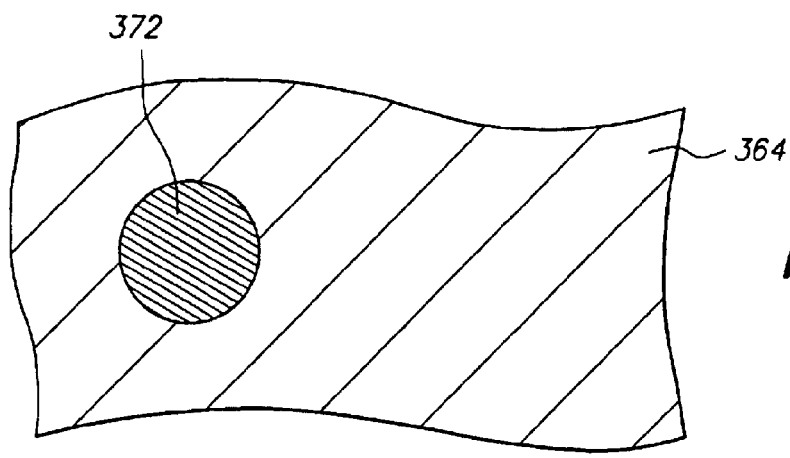
Figure 11M:
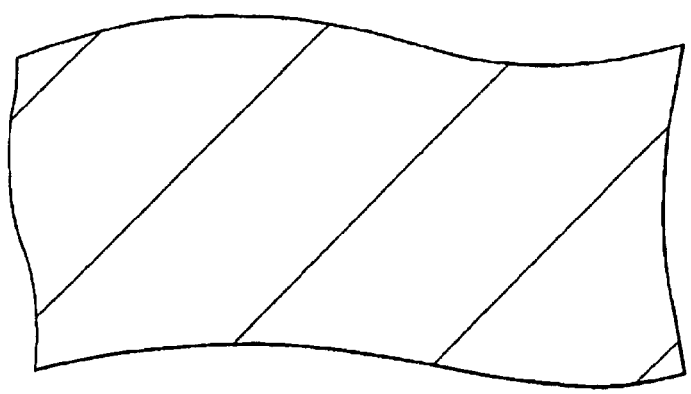
Figure 9N:
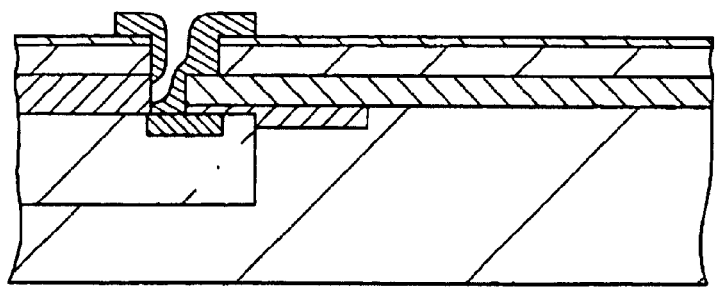
Figure 10N:
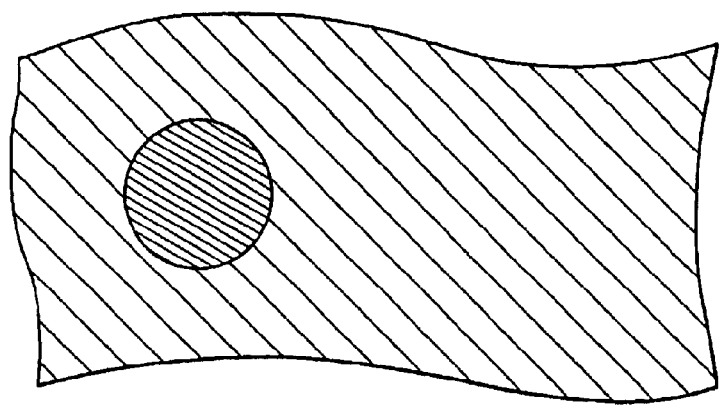
Figure 11N:
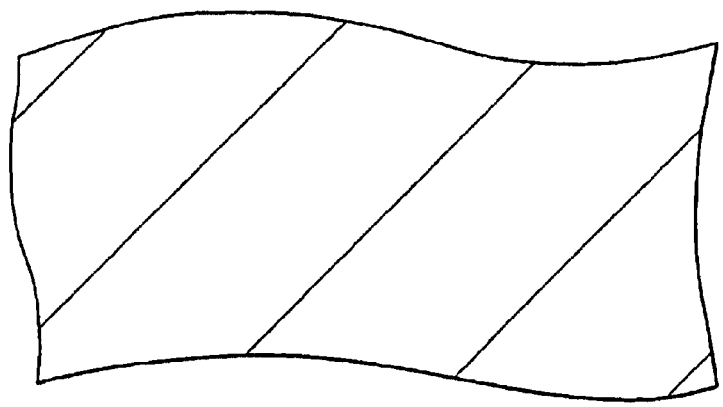
Figure 9O:
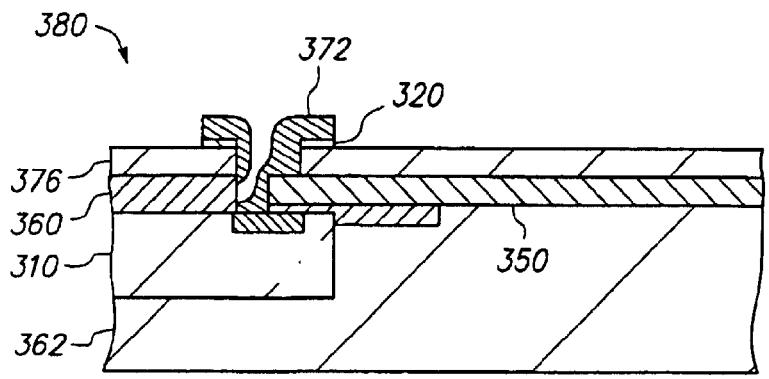
Figure 10O:
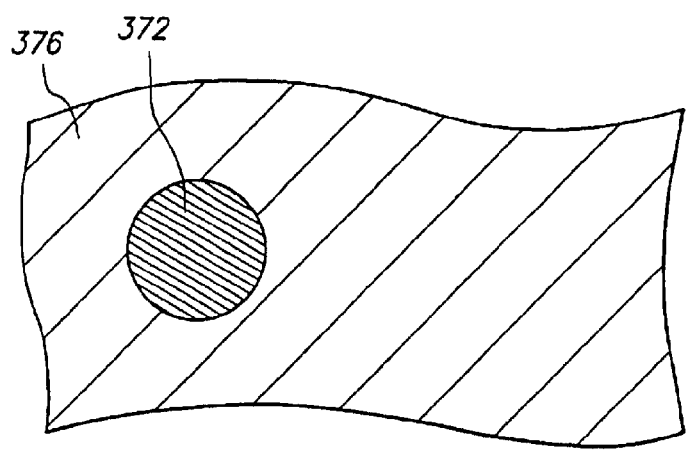
Figure 11O:
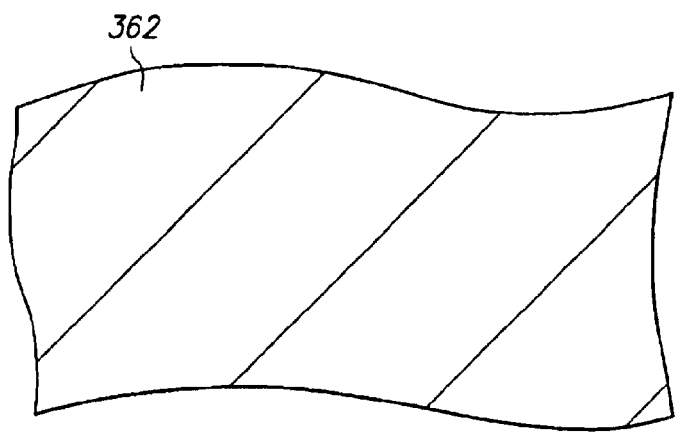

FIGS. 5A–5P, 6A–6P, 7A–7P and 8A–8P are cross-sectional, top, bottom and cross-sectional views, respectively, of a method of connecting a conductive trace to a semiconductor chip in accordance with a second embodiment of the present invention. FIGS. 8A–8P are oriented orthogonally with respect to FIGS. 5A–5P and depict FIGS. 5A–5P as viewed from left-to-right. In the second embodiment, the connection joint is a solder joint. For purposes of brevity, any description in the first embodiment is incorporated herein insofar as the same is applicable, and the same description need not be repeated. Likewise, elements of the second embodiment similar to those in the first embodiment have corresponding reference numerals indexed at two-hundred rather than one-hundred. For instance, chip 210 corresponds to chip 110, metal base 220 corresponds to metal base 120, etc.

FIGS. 5A, 6A, 7A and 8A are cross-sectional, top, bottom and cross-sectional views, respectively, of semiconductor chip 210 which includes opposing major surfaces 212 and 214. Upper surface 212 includes conductive pad 216 and passivation layer 218.

FIGS. 5B, 6B, 7B and 8B are cross-sectional, top, bottom and cross-sectional views, respectively, of metal base 220 which includes opposing major surfaces 222 and 224, copper layer 226 and nickel layer 228.

FIGS. 5C, 6C, 7C and 8C are cross-sectional, top, bottom and cross-sectional views, respectively, of photoresist layers 240 and 242 formed on metal base 220, is Photoresist layer 242 contains opening 244 that selectively exposes portion 246 of surface 224.

FIGS. 5D, 6D, 7D and 8D are cross-sectional, top, bottom and cross-sectional views, respectively, of conductive trace 250 formed on metal base 220 by electroplating. Conductive trace 250 includes opposing major surfaces 252 and 254 and peripheral sidewalls 256.

FIGS. 5E, 6E, 7E and 8E are cross-sectional, top, bottom and cross-sectional views, respectively, of metal base 220 and conductive trace 250 after photoresist layers 240 and 242 are stripped.

FIGS. 5F, 6F, 7F and 8F are cross-sectional, top, bottom and cross-sectional views, respectively, of adhesive 260 formed on metal base 220 and conductive trace 250.

FIGS. 5G, 6G, 7G and 8G are cross-sectional, top, bottom and cross-sectional views, respectively, of chip 210 mechanically attached to metal base 220 and conductive trace 250 by adhesive 260.

FIGS. 5H, 6H, 7H and 8H are cross-sectional, top, bottom and cross-sectional views, respectively, of encapsulant 262 formed on chip 210.

FIGS. 5I, 6I, 7I and 8I are cross-sectional, top, bottom and cross-sectional views, respectively, of the structure after copper layer 226 is removed by wet chemical etching.

FIGS. 5J, 6J, 7J and 8J are cross-sectional, top, bottom and cross-sectional views, respectively, of solder mask 264 formed on metal base 220. Solder mask 264 contains opening 266 that selectively exposes nickel layer 228.

FIGS. 5K, 6K, 7K and 8K are cross-sectional, top, bottom and cross-sectional views, respectively, of through-hole 270 that is partially formed and extends through metal base 220 and exposes conductive trace 250 and adhesive 260.

FIGS. 5L, 6L, 7L and 8L are cross-sectional, top, bottom and cross-sectional views, respectively, of respectively, of through-hole 270 that is fully formed and extends through metal base 220 and adhesive 260 and exposes pad 216.

FIGS. 5M, 6M, 7M and 8M are cross-sectional, top, bottom and cross-sectional views, respectively, of connection joint 272 formed on pad 216, metal base 220 and conductive trace 250. Connection joint 272 is a solder joint formed by solder paste printing followed by solder reflow.

Connection joint 272 is deposited into through-hole 270 as solder paste. The solder paste includes finely powdered tin-lead solder particles mixed in a viscous organic resin containing a fluxing agent. The solder paste is deposited into through-hole 270 using stencil printing. During the stencil printing process, the solder paste is deposited on solder mask 264, and then a squeegee (not shown) pushes the solder paste along the surface of solder mask 264 opposite metal base 220, into through-hole 270 and onto pad 216 and conductive trace 250. Thus, solder mask 264 provides a deposition mask (or stencil) for the solder paste. The solder paste is compliant enough at room temperature to conform to virtually any shape. As a result, the solder paste fills through-hole 270.

Thereafter, the structure is heated to a temperature of about 210° C. The heat causes the flux in the solder paste to react with and remove oxides from pad 216, metal base 220 and conductive trace 250 and the solder particles in the solder paste, renders the solder particles in the solder paste molten such that they coalesce, and vaporizes the organic resin in the solder paste. As a result, the solder paste contracts from its original size and solder reflow occurs. Thereafter, the heat is removed and the molten solder particles cool and solidify into a hardened solder joint that provides connection joint 272.

Connection joint 272 includes dome 274 in opening 266, and dome 274 covers adhesive 260 in through-hole 270.

FIGS. 5N, 6N, 7N and 8N are cross-sectional, top, bottom and cross-sectional views, respectively, of the structure after solder mask 264 is stripped. Removing solder mask 264 lifts-off any residual solder that remains on the surface of solder mask 264 opposite metal base 220 from the stencil printing process.

FIGS. 5O, 6O, 7O and 8O are cross-sectional, top, bottom and cross-sectional views, respectively, of the structure after metal base 220 is removed.

Since nickel layer 228 is extremely thin relative to dome 274, and the structure is removed from the nickel etching solution soon after nickel layer 228 is stripped, it is not critical that the nickel etching solution be highly selective of nickel with respect to solder. In fact, the nickel etching solution is also selective of solder. However, the nickel etching solution is not applied long enough to appreciably affect dome 274.

FIGS. 5P, 6P, 7P and 8P are cross-sectional, top, bottom and cross-sectional views, respectively, of insulative base 276 formed on conductive trace 250, adhesive 260, encapsulant 262 and connection joint 272.

At this stage, the manufacture of semiconductor chip assembly 280 that includes chip 210, conductive trace 250, adhesive 260, encapsulant 262, connection joint 272 and insulative base 276 can be considered complete.

Figure 12A:
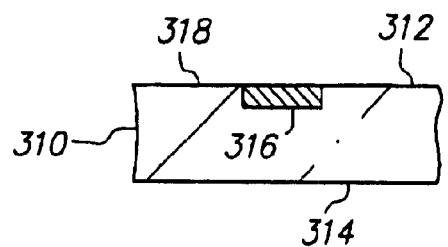
FIGS. 12A–12O are cross-sectional views corresponding to FIGS. 9A–9O, respectively.
Figure 12B:
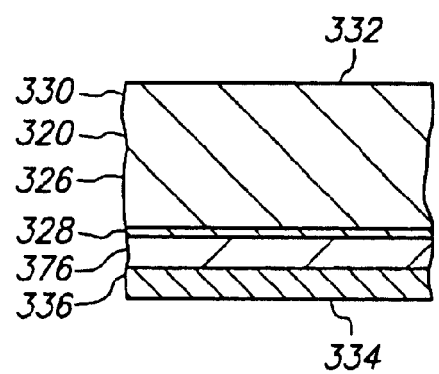
Figure 12C:
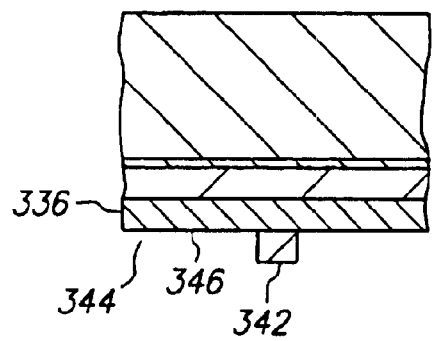
Figure 12D:
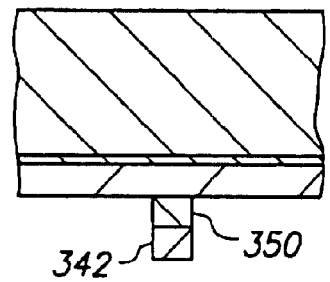
Figure 12E:
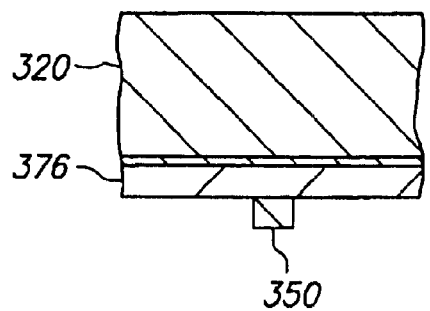
Figure 12F:
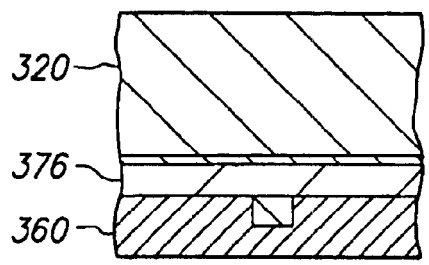
Figure 12G:
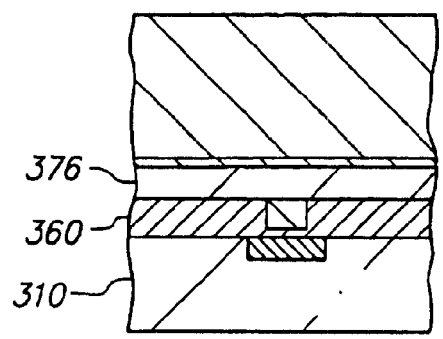
Figure 12H:
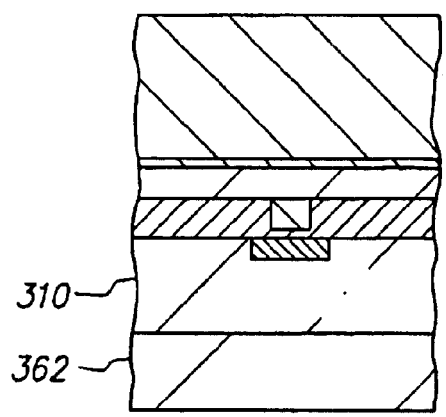
Figure 12I:
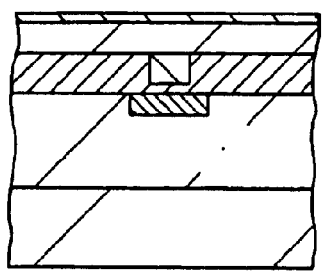
Figure 12J:
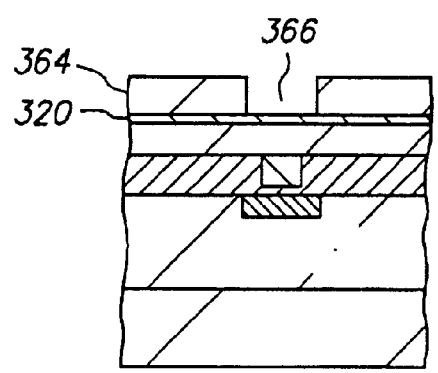
Figure 12K:
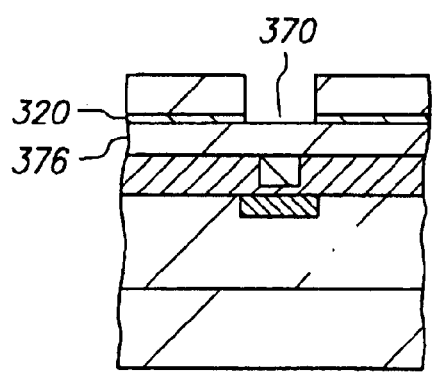
Figure 12L:
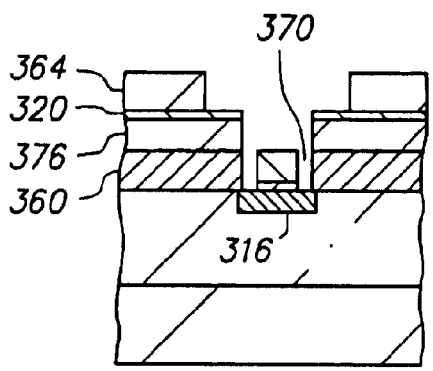
Figure 12M:
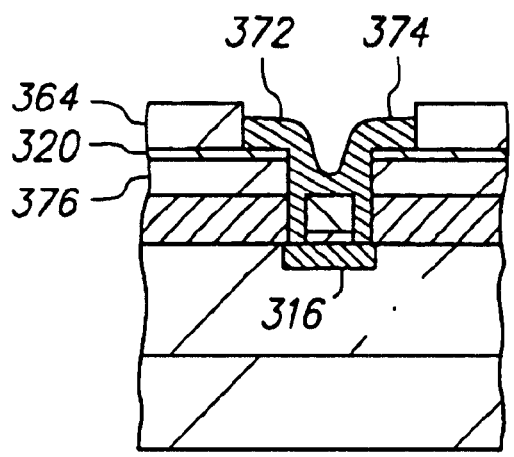
Figure 12N:
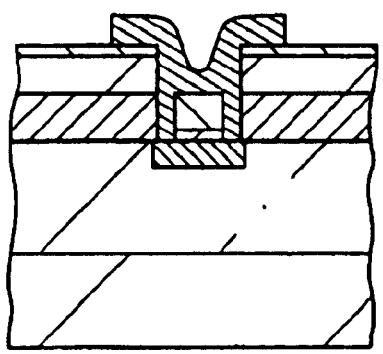
Figure 12O:
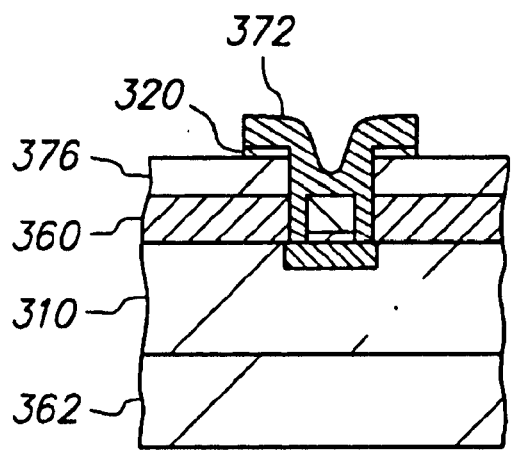
Figure 13A:
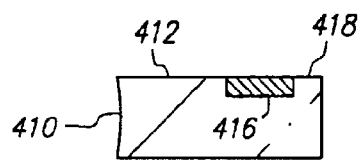
FIGS. 13A–13O are cross-sectional views showing a method of connecting a conductive trace to a semiconductor chip in accordance with a fourth embodiment of the present invention.
Figure 14A:
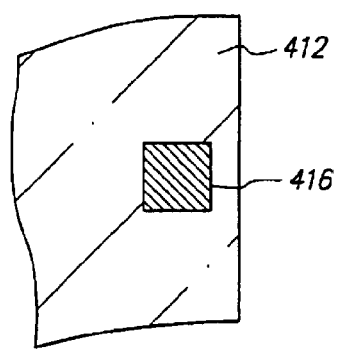
FIGS. 14A–14O are top plan views corresponding to FIGS. 13A–13O, respectively.
Figure 15A:
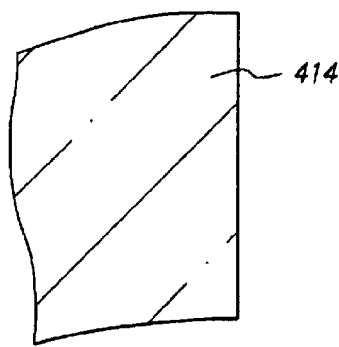
FIGS. 15A–15O are bottom plan views corresponding to FIGS. 13A–13O, respectively.
Figure 13B:
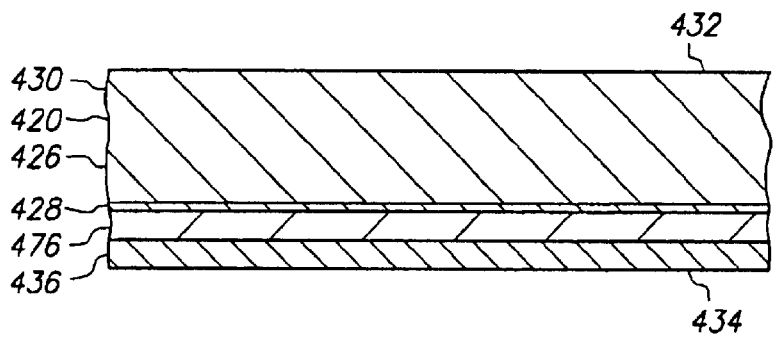
Figure 14B:
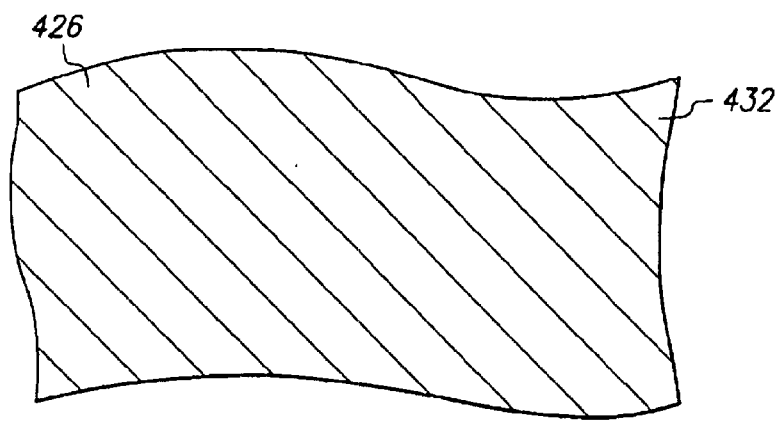
Figure 15B:
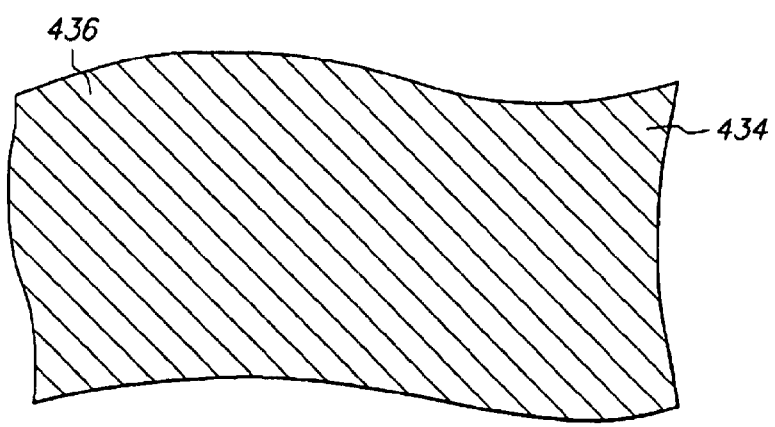
Figure 13C:
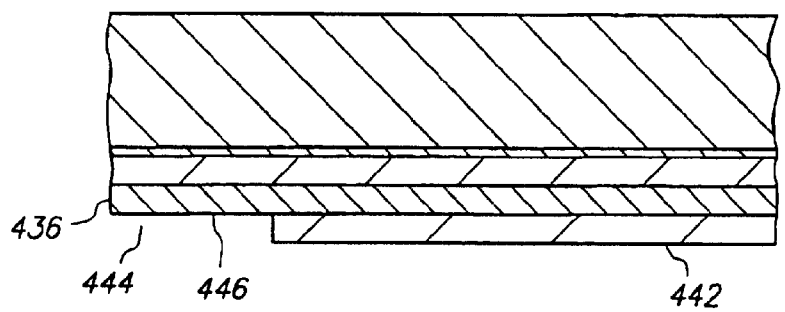
Figure 14C:
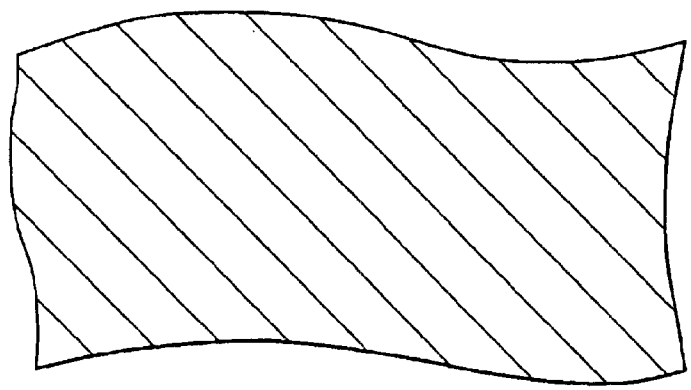
Figure 15C:
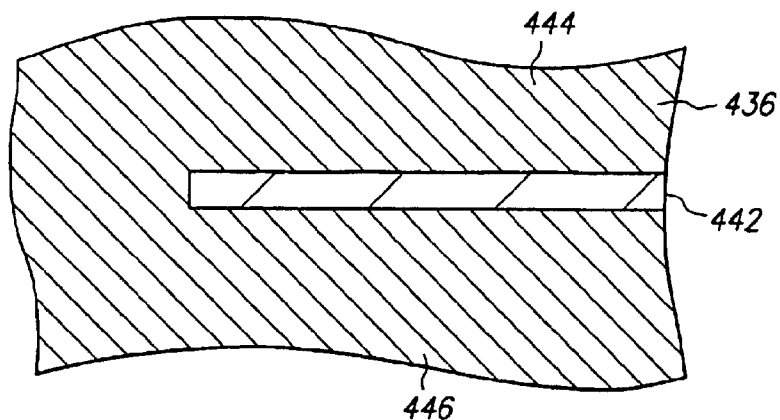
Figure 13D:
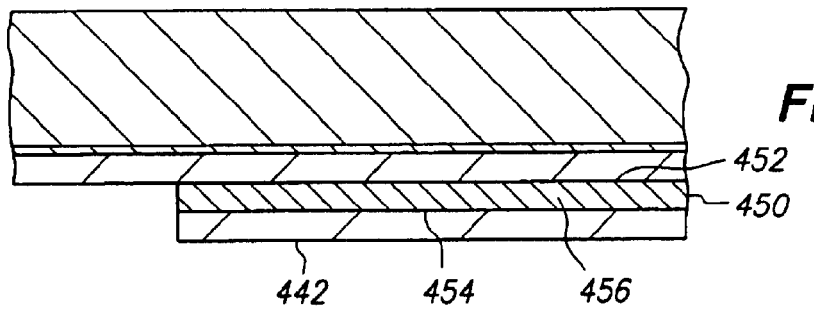
Figure 14D:
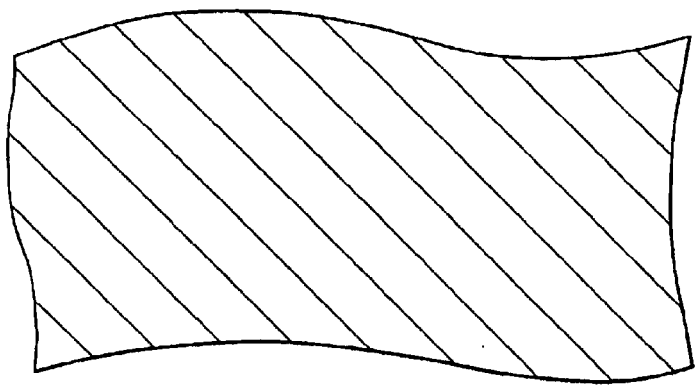
Figure 15D:
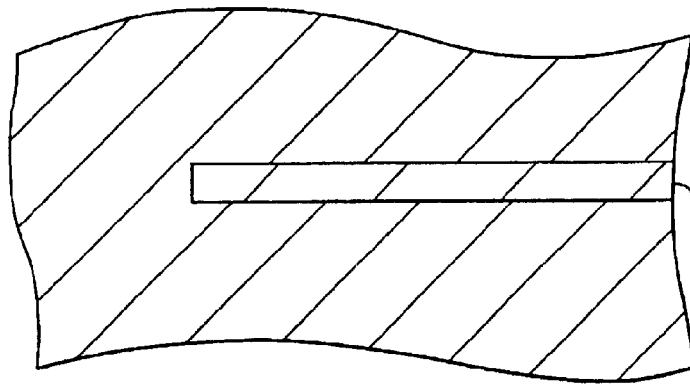
Figure 13E:
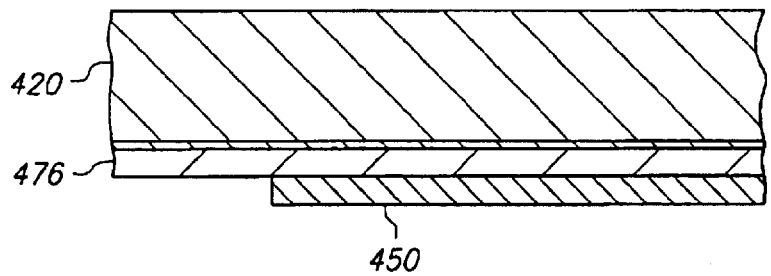
Figure 14E:
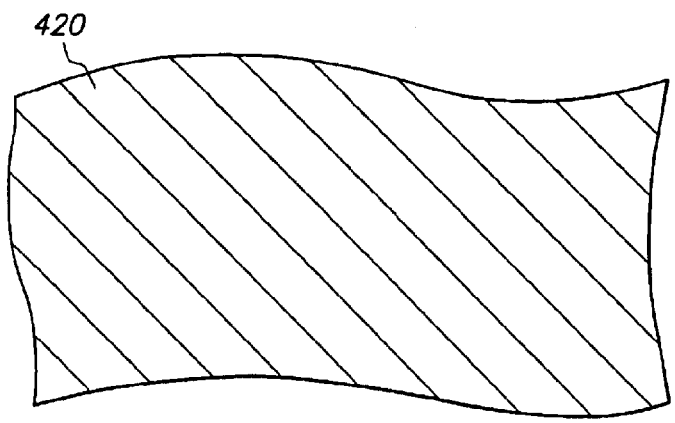
Figure 15E:
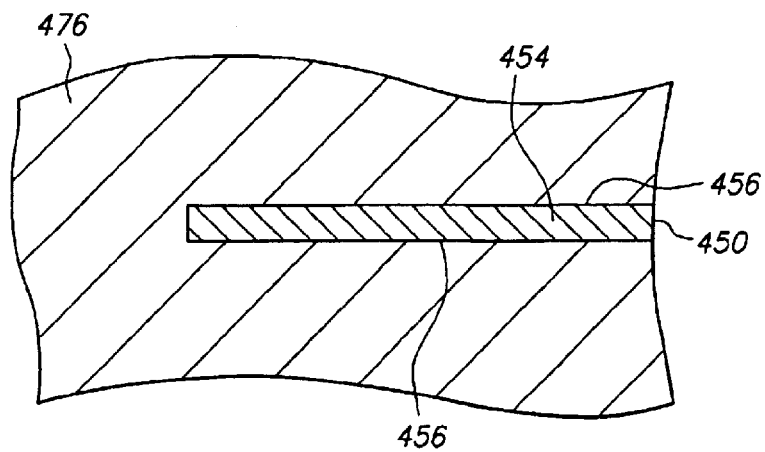
Figure 13F:
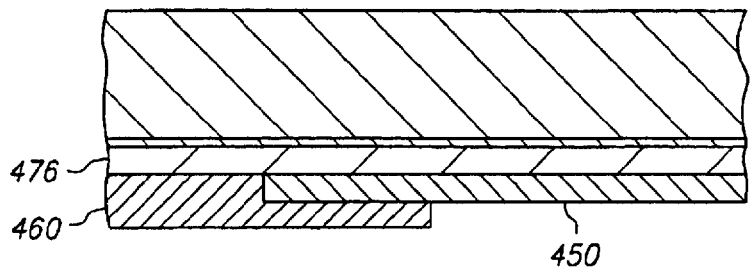
Figure 14F:
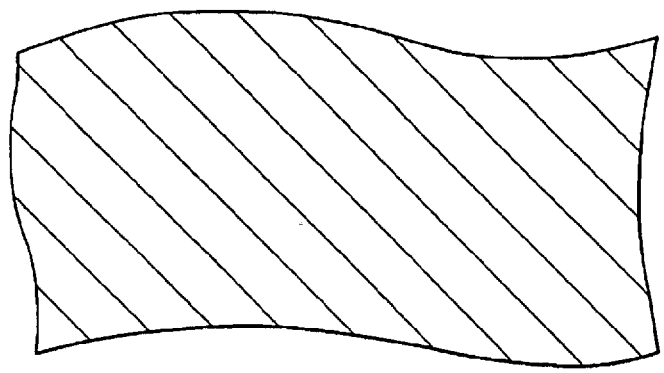
Figure 15F:
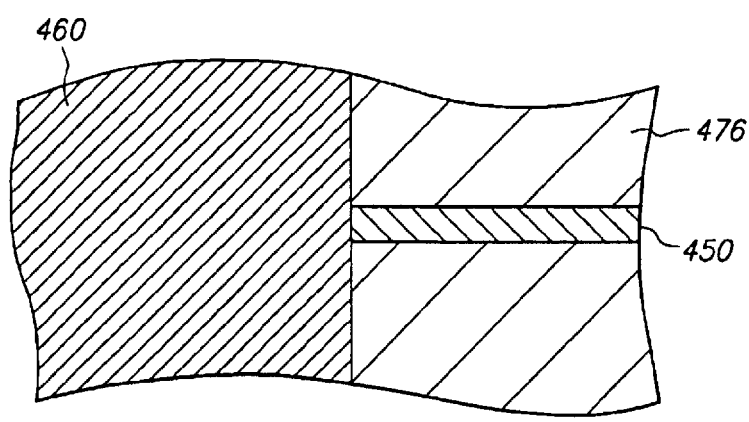
Figure 13G:
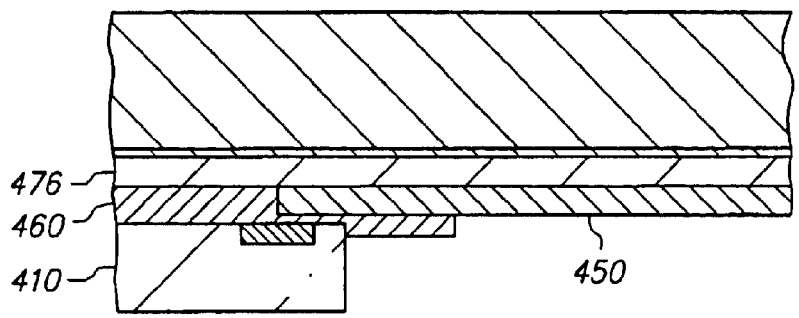
Figure 14G:
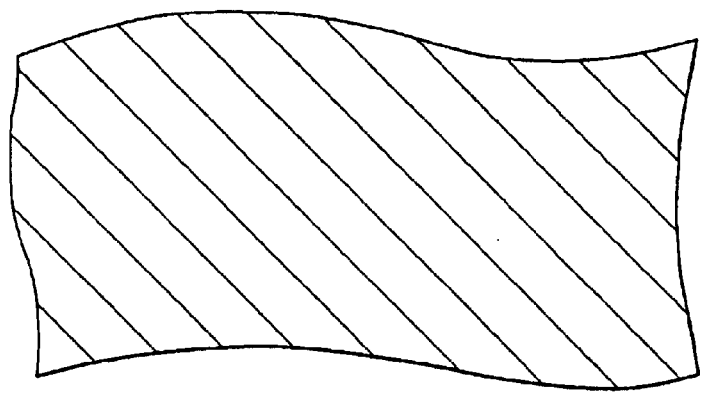
Figure 15G:
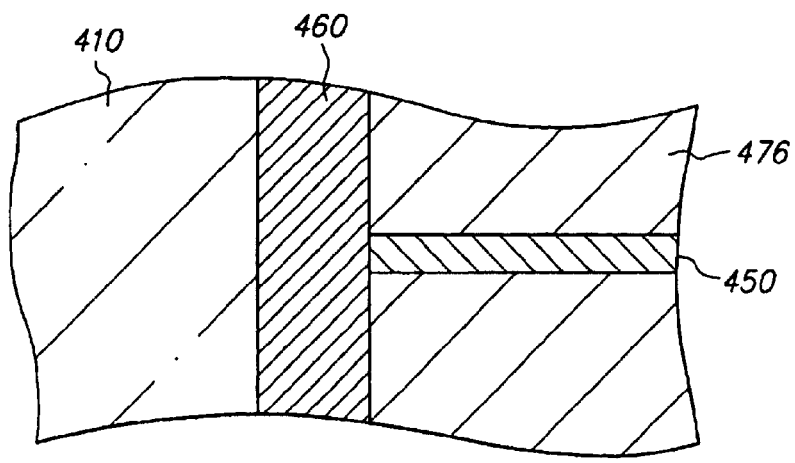
Figure 13H:
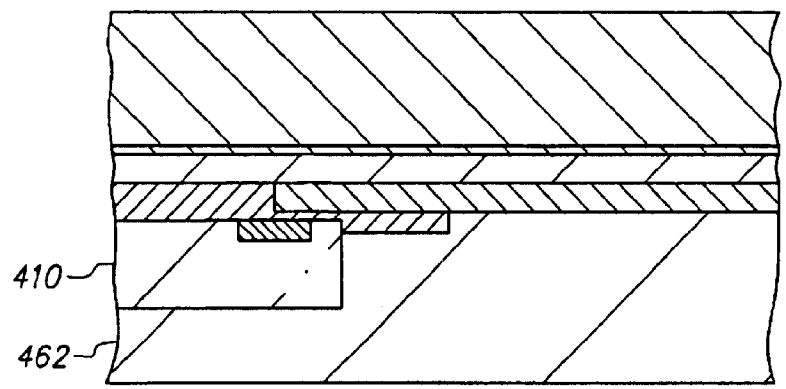
Figure 14H:
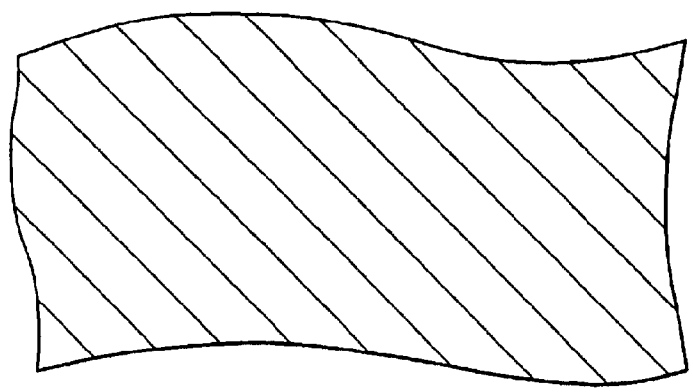
Figure 15H:
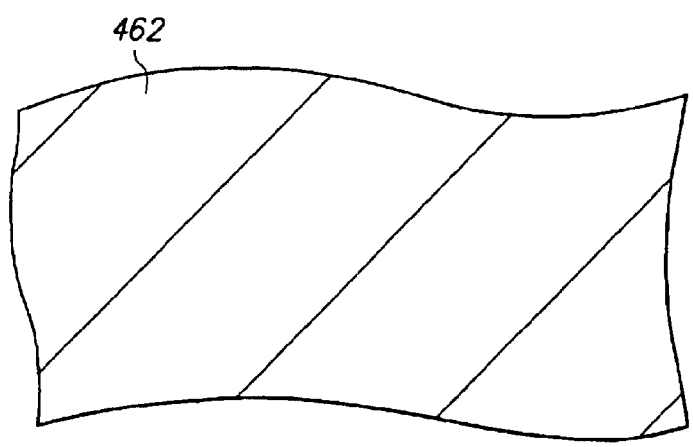
Figure 13I:
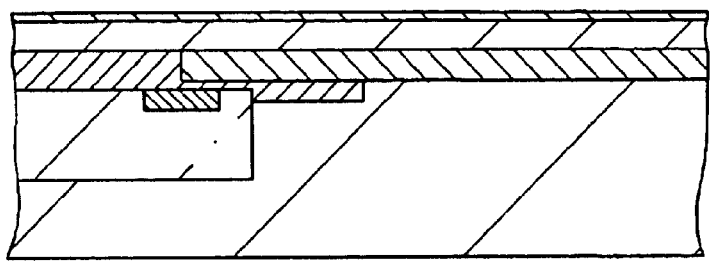
Figure 14I:
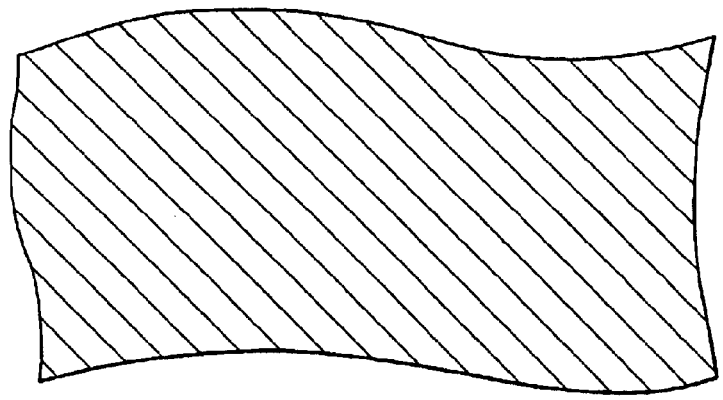
Figure 15I:
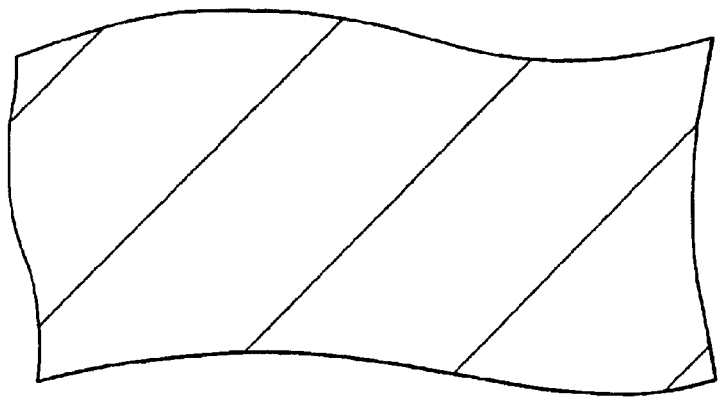
Figure 13J:
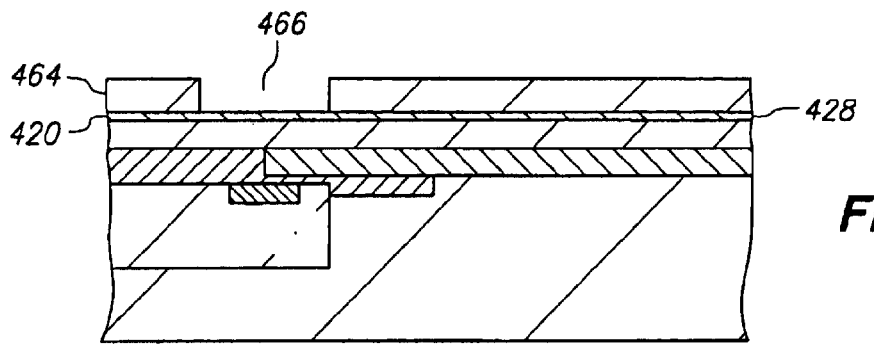
Figure 14J:
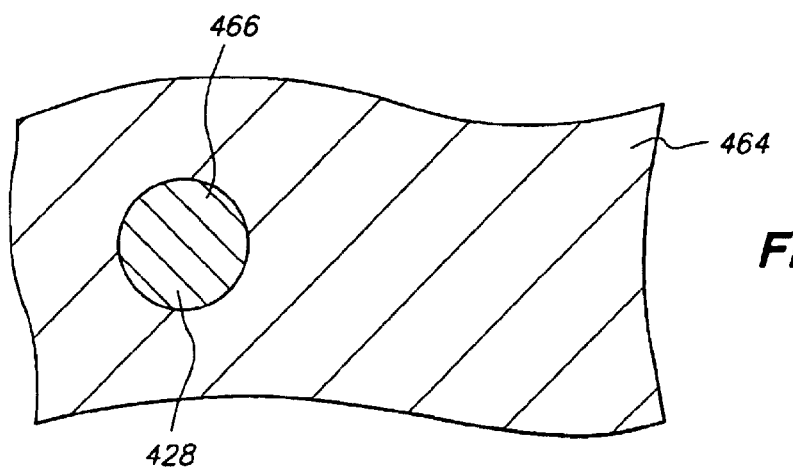
Figure 15J:
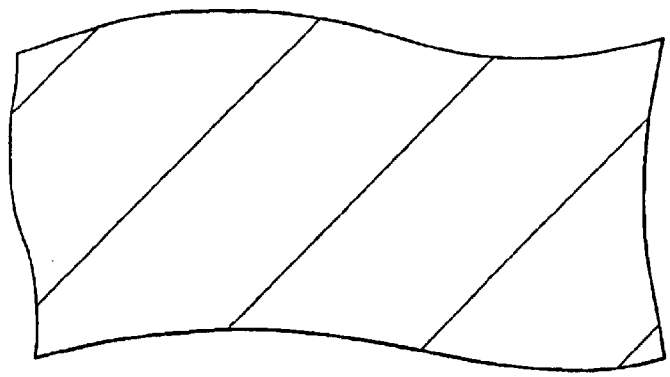
Figure 13K:
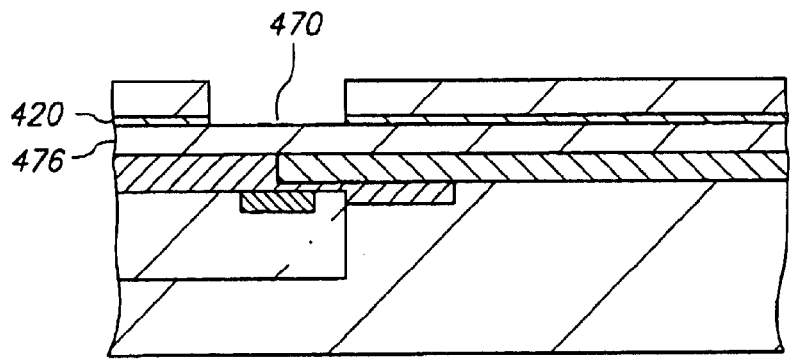
Figure 14K:
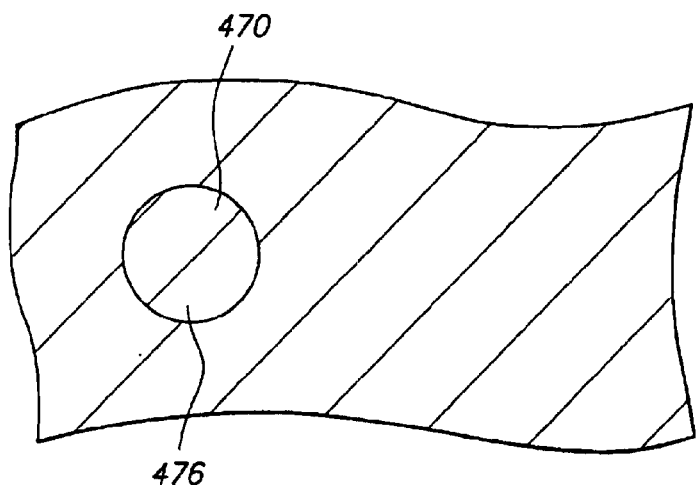
Figure 15K:
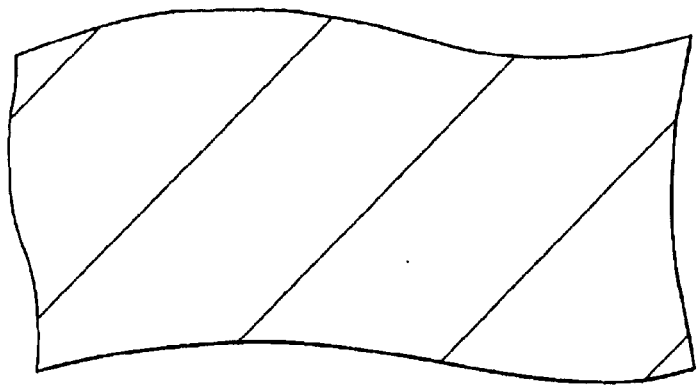
Figure 13L:
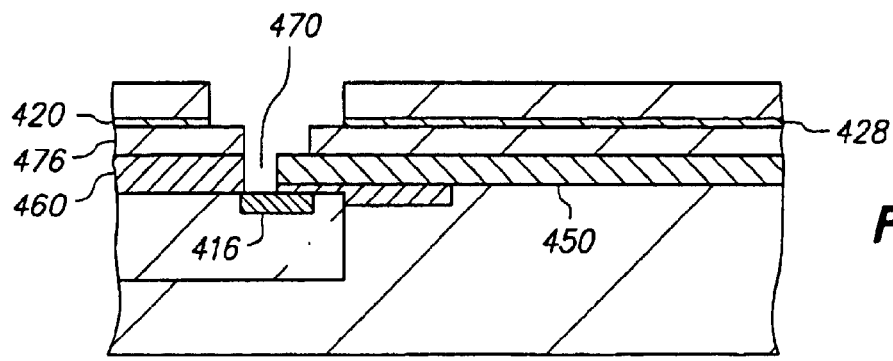
Figure 14L:
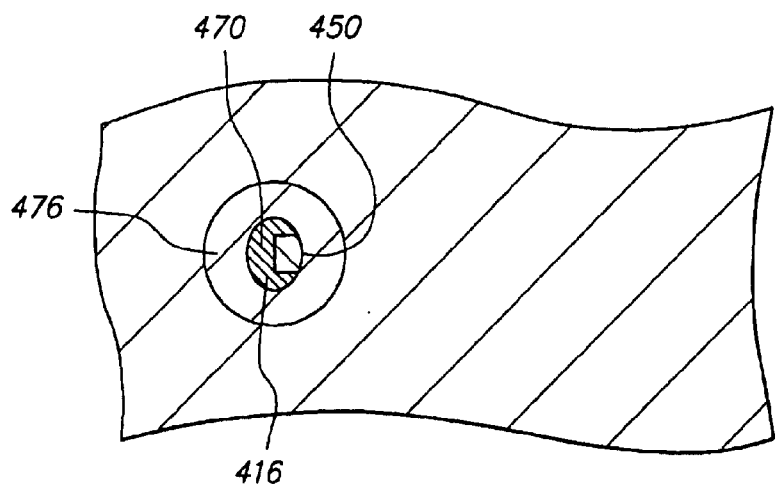
Figure 15L:
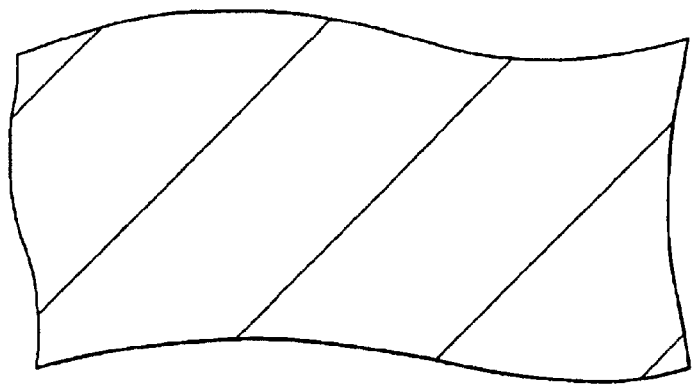
Figure 13M:
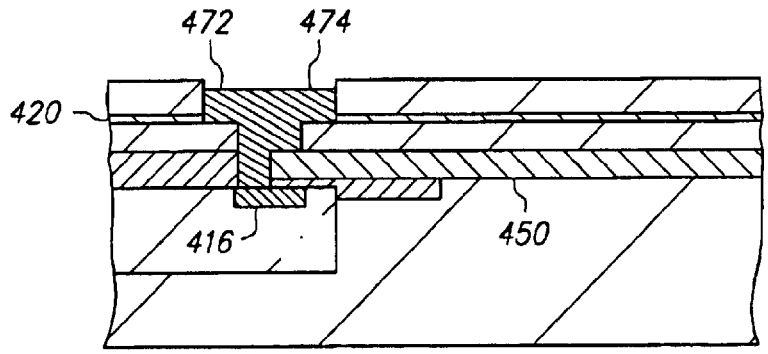
Figure 14M:
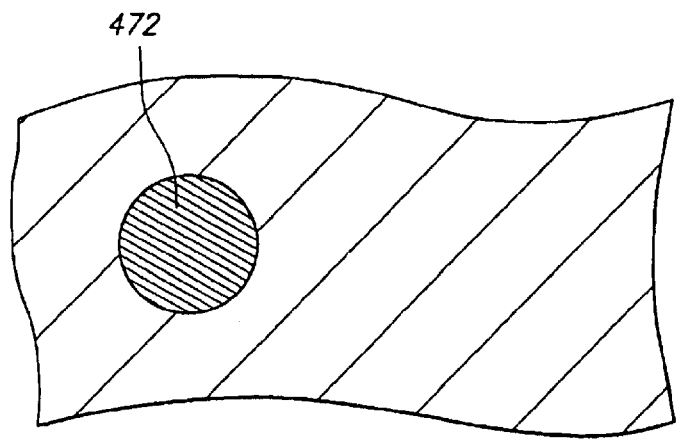
Figure 15M:
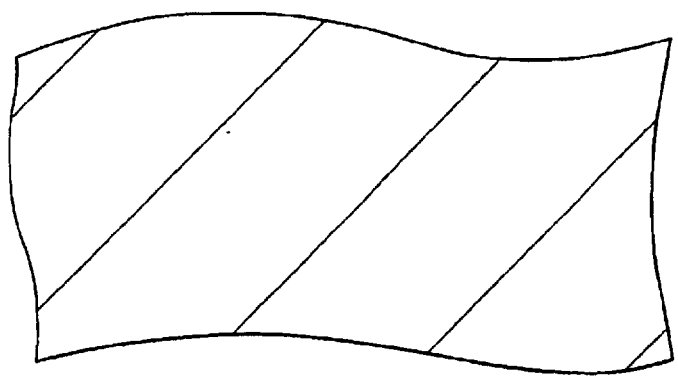
Figure 13N:
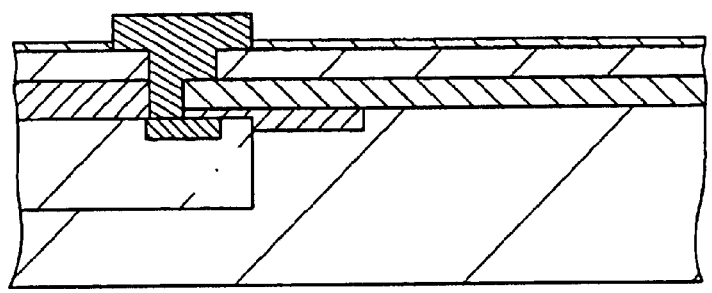
Figure 14N:
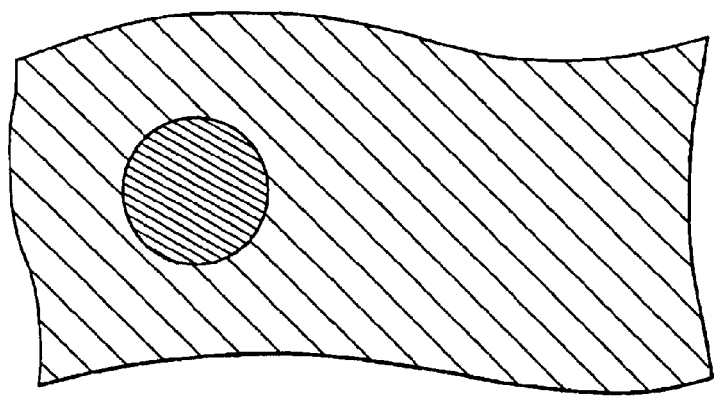
Figure 15N:
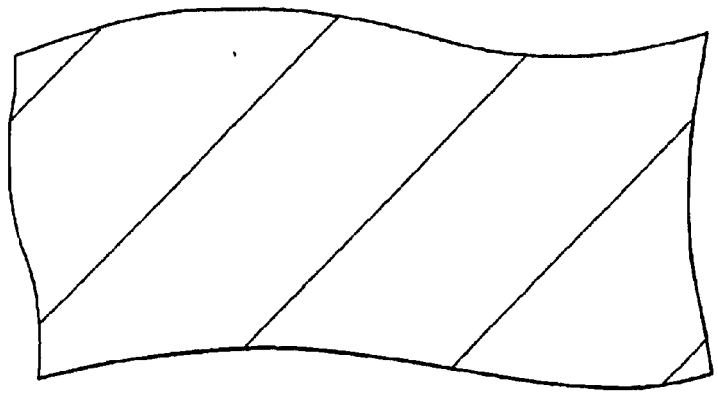
Figure 130:
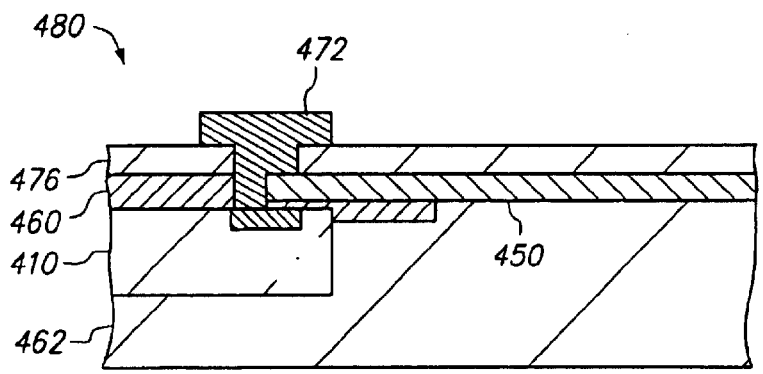
Figure 140:
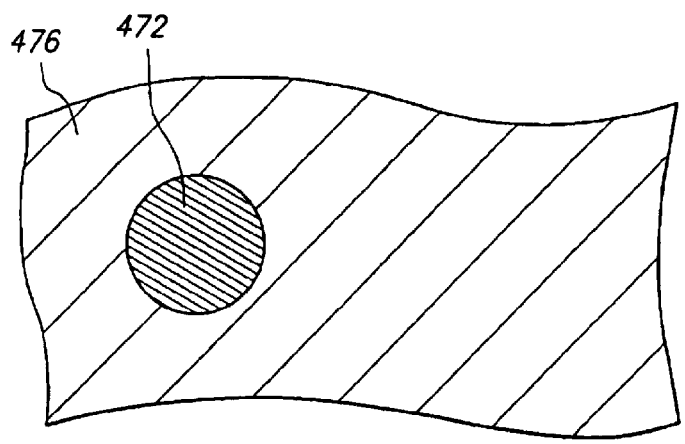
Figure 150:
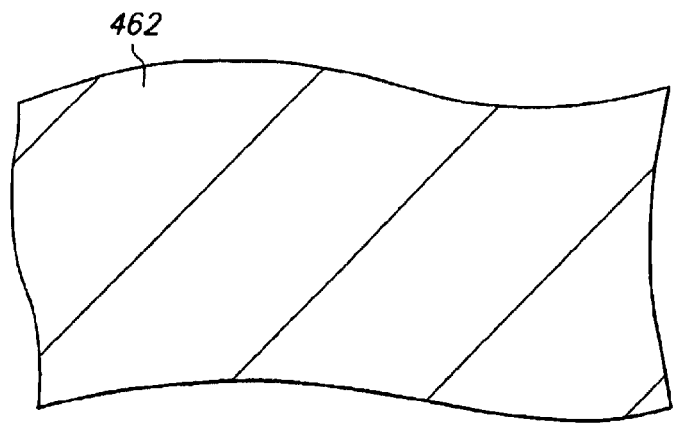

FIGS. 9A–9O, 10A–10O, 11A–11O and 12A–12O are cross-sectional, top, bottom and cross-sectional views, respectively, of a method of connecting a conductive trace to a semiconductor chip in accordance with a third embodiment of the present invention. FIGS. 12A–12O are oriented orthogonally with respect to FIGS. 9A–9O and depict FIGS. 9A–9O as viewed from left-to-right. In the third embodiment, a laminated structure that includes the conductive trace, the insulative base and the metal base is mechanically attached to the chip, and then the connection joint is formed. For purposes of brevity, any description in the first embodiment is incorporated herein insofar as the same is applicable, and the same description need not be repeated. Likewise, elements of the third embodiment similar to those in the first embodiment have corresponding reference numerals indexed at three-hundred rather than one-hundred. For instance, chip 310 corresponds to chip 110, metal base 320 corresponds to metal base 120, etc.

FIGS. 9A, 10A, 11A and 12A are cross-sectional, top, bottom and cross-sectional views, respectively, of semiconductor chip 310 which includes opposing major surfaces 312 and 314. Upper surface 312 includes conductive pad 316 and passivation layer 318.

FIGS. 9B, 10B, 11B and 12B are cross-sectional, top, bottom and cross-sectional views, respectively, of laminated structure 330 which includes opposing major surfaces 332 and 334, metal base 320, metal layer 336 and insulative base 376. Metal base 320 includes copper layer 326 and nickel layer 328. Laminated structure 330 is a diclad laminate in which insulative base 376 adhesively attaches metal base 320 and metal layer 336 to one another. Metal base 320 and metal layer 336 are disposed on opposite sides of insulative base 376 and are spaced, separated and electrically isolated from one another. Metal base 320 provides surface 332 (at surface 322), and metal layer 336 provides surface 334. Metal base 320 is identical to metal base 120. Metal layer 336 is a copper foil with a thickness of 12 microns. Insulative base 376 is a polyimide layer with a thickness of 15 microns. Thus, insulative base 376 has a different composition and is thinner than insulative base 176.

FIGS. 9C, 10C, 11C and 12C are cross-sectional, top, bottom and cross-sectional views, respectively, of photoresist layer 342 formed on metal layer 336. Photoresist layer 342 contains opening 344 that selectively exposes portion 346 of surface 334. Furthermore, photoresist layer 342 is essentially a mirror image of photoresist layer 142. That is, photoresist layer 342 provides coverage where photoresist layer 142 provides exposure and vice-versa.

FIGS. 9D, 10D, 11D and 12D are cross-sectional, top and bottom views, respectively, of conductive trace 350 formed from metal layer 336 by wet chemical etching using photoresist layer 342 as an etch mask. A "back-side" wet chemical etch is applied to surface 334 of laminated structure 330. For instance, the wet chemical etch can be sprayed on surface 334, or a protective mask can be deposited on surface 332 and then the structure can be dipped in the wet chemical etch. The wet chemical etch is highly selective of copper with respect to polyimide. Therefore, no appreciable amount of insulative base 376 is removed. A suitable wet chemical etch can be provided by a solution containing alkaline ammonia. The optimal etch time for exposing metal layer 336 to the wet chemical etch without significantly undercutting conductive trace 350 can be established through trial and error.

The wet chemical etch etches completely through metal layer 336, thereby effecting a pattern transfer of photoresist layer 342 onto metal layer 336. Conductive trace 350 constitutes a remaining or unetched portion of metal layer 336 after the wet chemical etch is applied.

Conductive trace 350 includes opposing major surfaces 352 and 354 and peripheral sidewalls 356. Conductive trace 350 is composed of copper and is 12 microns thick. Thus, conductive trace 350 is identical to conductive trace 150 except that conductive trace 350 has tapered sidewalls due to undercutting by the wet chemical etch.

The conductive traces are electrically isolated from one another since metal base 320 does not electrically connect the conductive traces.

FIGS. 9E, 10E, 11E and 12E are cross-sectional, top and bottom views, respectively, of metal base 320, conductive trace 350 and insulative base 376 after photoresist layer 342 is stripped.

FIGS. 9F, 10F, 1F and 12F are cross-sectional, top and bottom views, respectively, of adhesive 360 formed on conductive trace 350 and insulative base 376. Adhesive 360 is spaced and separated from metal base 320.

FIGS. 9G, 10G, 11G and 12G are cross-sectional, top and bottom views, respectively, of chip 310 mechanically attached to conductive trace 350 and insulative base 376 by adhesive 360.

FIGS. 9H, 10H, 11H and 12H are cross-sectional, top, bottom and cross-sectional views, respectively, of encapsulant 362 formed on chip 310.

FIGS. 9I, 10I, 11I and 12I are cross-sectional, top, bottom and cross-sectional views, respectively, of the structure after copper layer 326 is removed by wet chemical etching.

FIGS. 9J, 10J, 11J and 12J are cross-sectional, top, bottom and cross-sectional views, respectively, of photoresist layer 364 formed on metal base 320. Photoresist layer 364 contains opening 366 that selectively exposes nickel layer 328. Opening 366 has a diameter of 90 microns.

FIGS. 9K, 10K, 11K and 12K are cross-sectional, top, bottom and cross-sectional views, respectively, of through-hole 370 that is partially formed and extends through metal base 320 and exposes insulative base 376.

FIGS. 9L, 10L, 11L and 12L are cross-sectional, top, bottom and cross-sectional views, respectively, of respectively, of through-hole 370 that is fully formed and extends through metal base 320, adhesive 360 and insulative base 376 and exposes pad 316.

Through-hole 370 is formed through adhesive 360 and insulative base 376 in essentially the same manner as through-hole 170. Namely, a selective TEA $CO_2$ laser etch is directed at and axially aligned with pad 316. The laser has a spot size of 120 microns, pad 316 has a length and width of 100 microns, and through-hole 370 has a diameter of 90 microns at nickel layer 328. The laser spot size is 30 microns (120–90) larger than the diameter of through-hole 370 so that the laser covers through-hole 370 and accounts for alignment tolerances between the laser and through-hole 370. As a result, the laser strikes pad 316 and portions of nickel layer 328, conductive trace 350, adhesive 360, photoresist layer 364 and insulative base 376 that overlap pad 316.

The laser drills through and removes adhesive 360 and insulative base 376 within through-hole 370, thereby effecting a pattern transfer of through-hole 370 through adhesive 360 and insulative base 376. The laser also drills through and removes an annular portion of photoresist layer 364 that surrounds through-hole 370 and has a width of 15 microns ((120–90)/2 thereby increasing the diameter of opening 366 from 90 microns to 120 microns. However, nickel layer 328 shields the underlying adhesive 360 and insulative base 376 from the laser etch, and portions of adhesive 360 and insulative base 376 sandwiched between pad 316 and nickel layer 328 remain intact. Likewise, conductive trace 350 shields the underlying adhesive 360 from the laser etch, and portions of adhesive 360 sandwiched between pad 316 and conductive trace 350 remain intact. The laser etch is anisotropic, and therefore little or none of adhesive 360 and insulative base 376 sandwiched between pad 316 and nickel layer 328 or adhesive 360 sandwiched between pad 316 and conductive trace 350 is undercut or removed.

Through-hole 370 is formed in and extends vertically through metal base 320, adhesive 360 and insulative base 376, is axially aligned with and centered relative to and exposes pad 316 and has a diameter of 90 microns.

FIGS. 9M, 10M, 11M and 12M are cross-sectional, top, bottom and cross-sectional views, respectively, of connection joint 372 formed on pad 316, metal base 320 and conductive trace 350.

Connection joint 372 is formed by an electroplating operation using photoresist layer 364 as a plating mask. Metal base 120 is connected to a plating bus (not shown), current is applied to the plating bus from an external power source, and the structure is submerged in an electrolytic copper plating solution such as Sel-Rex CUBATH M™ at room temperature. As a result, connection joint 372 begins to plate on metal base 320 in through-hole 370. However, connection joint 372 does not initially deposit on pad 316 or conductive trace 350 since insulative base 376 is an electrical insulator that cannot supply current from the plating bus to generate electroplating and pad 316 and conductive trace 350 are electrically isolated from the plating bus.

As the electroplating operation continues, connection joint 372 continues to plate on metal base 320 and expand axially in through-hole 370 towards pad 316. Eventually connection joint 372 contacts conductive trace 350, and as a result, conductive trace 350 is electrically connected to the plating bus by metal base 320 and connection joint 372, and connection joint 372 begins to plate on conductive trace 350 as well.

As the electroplating operation continues, connection joint 372 continues to plate on metal base 320 and conductive trace 350 and expand axially in through-hole 370 towards pad 316. Eventually connection joint 372 contacts pad 316, and as a result, pad 316 is electrically connected to the plating bus by metal base 320 and connection joint 372, and connection joint 372 begins to plate on pad 316 as well.

The copper electroplating operation continues until connection joint 372 is about microns thick. Thereafter, the structure is removed from the electrolytic copper plating solution and rinsed in distilled water.

Connection joint 372 includes thick C-shaped portion 374 in opening 366 that contacts and extends radially inward from metal base 320, is disposed outside conductive trace 350 and is adjacent to through-hole 370 where throughhole 370 extends through insulative base 376. Furthermore, metal base 320 contacts and is sandwiched between C-shaped portion 374 and insulative base 376.

FIGS. 9N, 10N, 11N and 12N are cross-sectional, top, bottom and cross-sectional views, respectively, of the structure after photoresist layer 364 is stripped.

FIGS. 9O, 10O, 11O and 12O are cross-sectional, top, bottom and cross-sectional views, respectively, of the structure after metal base 320 is etched again.

Metal base 320, which at this stage consists of nickel layer 328, is etched using a nickel etching solution, such as a dilute mixture of nitric and hydrochloric acid, that is highly selective of nickel with respect to polyimide and the molding compound. Therefore, no appreciable amount of adhesive 360 or encapsulant 362 is removed.

Since nickel layer 328 is extremely thin relative to C-shaped portion 374, and the structure is removed from the nickel etching solution soon after nickel layer 328 is stripped, the nickel etching solution is not applied long enough to appreciably affect C shaped portion 374.

The nickel etching solution etches through nickel layer 328 and removes the exposed portions of nickel layer 328. The nickel etching solution also undercuts and removes minor portions of nickel layer 328 beneath C-shaped portion 374. However, the nickel etching solution is not applied long enough to remove major portions of nickel layer 328 beneath C-shaped portion 374. As a result, nickel layer 328 beneath C-shaped portion 374 remains largely intact.

The wet chemical etch exposes conductive trace 350 and insulative base 376, and electrically isolates the conductive traces from one another, the connection joints from one another, and the pads from one another.

The wet chemical etch also reduces contact area between metal base 320 and connection joint 372 since the wet chemical etch undercuts and removes some but not all of nickel layer 328 beneath C-shaped portion 374.

The wet chemical etch, in combination with the previous wet chemical etches applied to metal base 320, removes most but not all of metal base 320 that overlaps chip 310 and conductive trace 350. That is, small portions of nickel layer 328 remain intact between C-shaped portion 374 and insulative base 376.

At this stage, the manufacture of semiconductor chip assembly 380 that includes chip 310, metal base 320, conductive trace 350, adhesive 360, encapsulant 362, connection joint 372 and insulative base 376 can be considered complete.

Figure 16A:
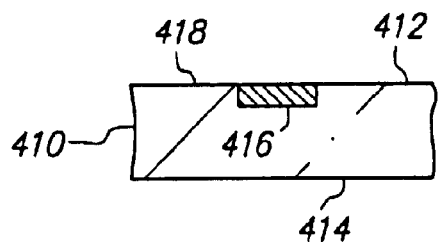
FIGS. 16A–16O are cross-sectional views corresponding to FIGS. 13A–13O, respectively.
Figure 16B:
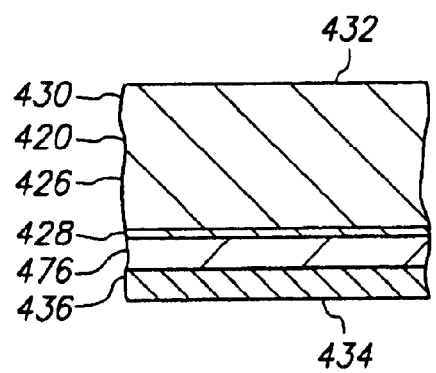
Figure 16C:
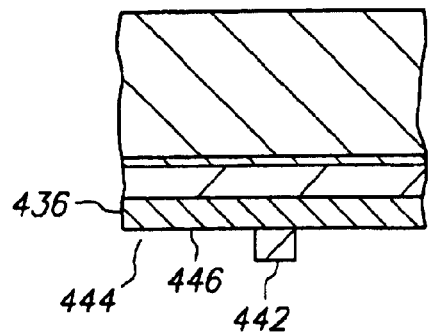
Figure 16D:
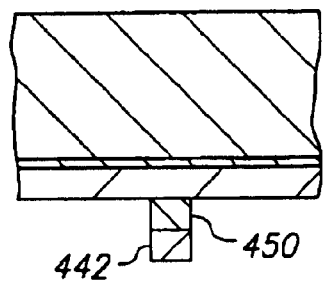
Figure 16E:
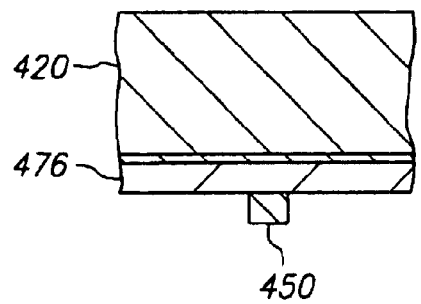
Figure 16F:
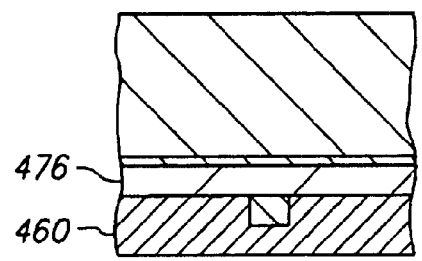
Figure 16G:
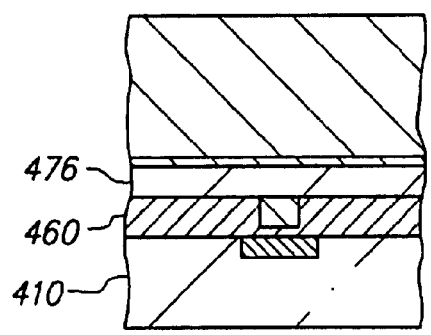
Figure 16H:
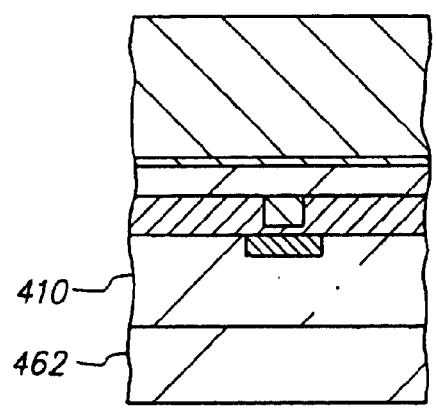
Figure 16I:
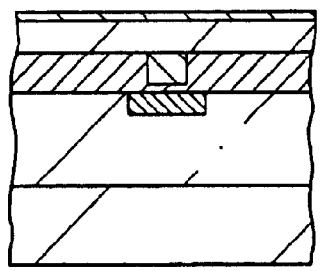
Figure 16J:
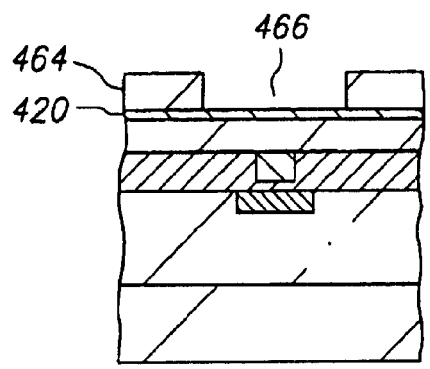
Figure 16K:
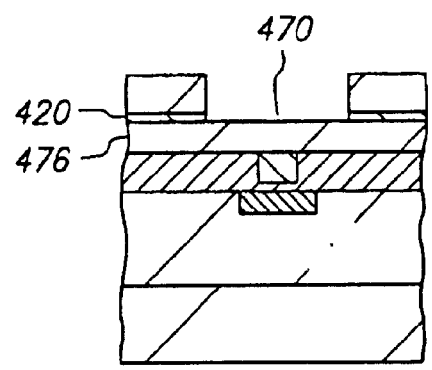
Figure 16L:
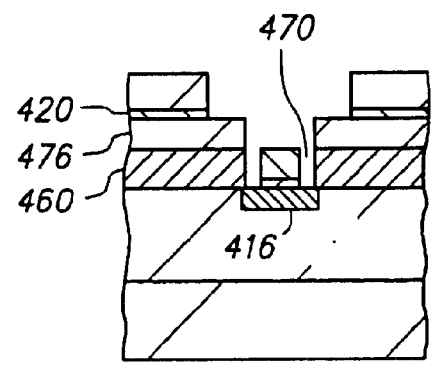
Figure 16M:
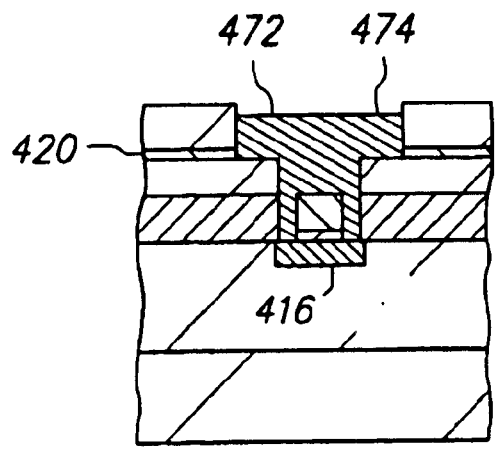
Figure 16N:
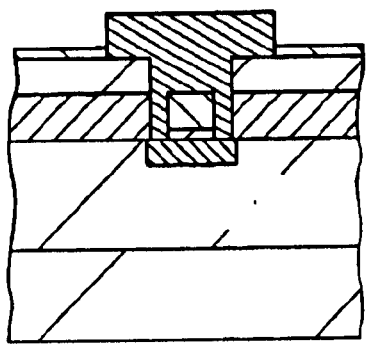
Figure 16O:
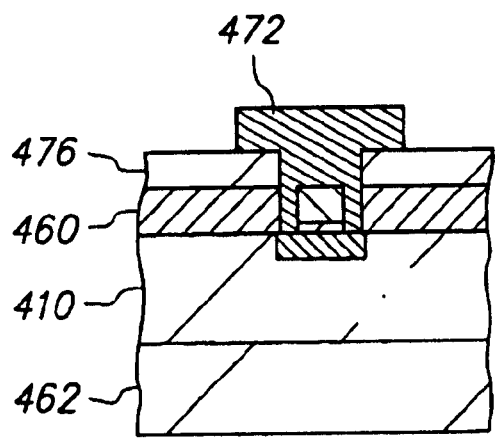

FIGS. 13A–13O, 14A–14O, 15A–15O and 16A–16O are cross-sectional, top, bottom and cross-sectional views, respectively, of a method of connecting a conductive trace to a semiconductor chip in accordance with a fourth embodiment of the present invention. FIGS. 16A–16O are oriented orthogonally with respect to FIGS. 13A–13O and depict FIGS. 13A–13O as viewed from left-to-right. In the fourth embodiment, a laminated structure that includes the conductive trace, the insulative base and the metal base is mechanically attached to the chip, and then the connection joint is formed as a solder joint. For purposes of brevity, any description in the first, second and third embodiments is incorporated herein insofar as the same is applicable, and the same description need not be repeated. Likewise, elements of the fourth embodiment similar to those in the first, second and third embodiments have corresponding reference numerals indexed at four-hundred rather than one-hundred, two-hundred or three-hundred. For instance, chip 410 corresponds to chip 110, metal base 420 corresponds to metal base 120, laminated structure 430 corresponds to laminated structure 330, metal layer 436 corresponds to metal layer 336, photoresist layer 442 corresponds to photoresist layer 342, conductive trace 450 corresponds to conductive trace 350, solder mask 464 corresponds to solder mask 264, connection joint 472 corresponds to connection joint 272, insulative base 476 corresponds to insulative base 376, etc.

FIGS. 13A, 14A, 15A and 16A are cross-sectional, top, bottom and cross-sectional views, respectively, of semiconductor chip 410 which includes opposing major surfaces 412 and 414. Upper surface 412 includes conductive pad 416 and passivation layer 418.

FIGS. 13B, 14B, 15B and 16B are cross-sectional, top, bottom and cross-sectional views, respectively, of laminated structure 430 which includes opposing major surfaces 432 and 434, metal base 420, metal layer 436 and insulative base 476. Metal base 420 includes copper layer 426 and nickel layer 428.

FIGS. 13C, 14C, 15C and 16C are cross-sectional, top, bottom and cross-sectional views, respectively, of photoresist layer 442 formed on metal layer 436. Photoresist layer 442 contains opening 444 that selectively exposes portion 446 of surface 434.

FIGS. 13D, 14D, 15D and 16D are cross-sectional, top and bottom views, respectively, of conductive trace 450 formed from metal layer 436 by wet chemical etching using photoresist layer 442 as an etch mask. Conductive trace 450 includes opposing major surfaces 452 and 454 and peripheral sidewalls 456.

FIGS. 13E, 14E, 15E and 16E are cross-sectional, top and bottom views, respectively, of metal base 420, conductive trace 450 and insulative base 476 after photoresist layer 442 is stripped.

FIGS. 13F, 14F, 15F and 16F are cross-sectional, top and bottom views, respectively, of adhesive 460 formed on conductive trace 450 and insulative base 476.

FIGS. 13G, 14G, 15G and 16G are cross-sectional, top and bottom views, respectively, of chip 410 mechanically attached to conductive trace 450 and insulative base 476 by adhesive 460.

FIGS. 13H, 14H, 15H and 16H are cross-sectional, top, bottom and cross-sectional views, respectively, of encapsulant 462 formed on chip 410.

FIGS. 13I, 14I, 15I and 16I are cross-sectional, top, bottom and cross-sectional views, respectively, of the structure after copper layer 426 is removed by wet chemical etching.

FIGS. 13J, 14J, 15J and 16J are cross-sectional, top, bottom and cross-sectional views, respectively, of solder mask 464 formed on metal base 420. Solder mask 464 contains opening 466 that selectively exposes nickel layer 428.

FIGS. 13K, 14K, 15K and 16K are cross-sectional, top, bottom and cross-sectional views, respectively, of through-hole 470 that is partially formed and extends through metal base 420 and exposes insulative base 476.

FIGS. 13L, 14L, 15L and 16L are cross-sectional, top, bottom and cross-sectional views, respectively, of through-hole 470 that is fully formed and extends through metal base 420, adhesive 460 and insulative base 476 and exposes pad 416. Through-hole 470 has a diameter of 200 microns at nickel layer 428 and a diameter of 70 microns at adhesive 460 and insulative base 476.

FIGS. 13M, 14M, 15M and 16M are cross-sectional, top, bottom and cross-sectional views, respectively, of connection joint 472 formed on pad 416, metal base 420 and conductive trace 450. Connection joint 472 is a solder joint formed by solder paste printing followed by solder reflow. Connection joint 472 includes dome 474 in opening 466.

FIGS. 13N, 14N, 15N and 16N are cross-sectional, top, bottom and cross-sectional views, respectively, of the structure after solder mask 464 is stripped.

FIGS. 13O, 14O, 15O and 16O are cross-sectional, top, bottom and cross-sectional views, respectively, of the structure after metal base 420 is removed.

At this stage, the manufacture of semiconductor chip assembly 480 that includes chip 410, conductive trace 450, adhesive 460, encapsulant 462, connection joint 472 and insulative base 476 can be considered complete.

The semiconductor chip assemblies described above are merely exemplary. Numerous other embodiments are contemplated. For instance, the encapsulant and/or the insulative base can be omitted. In addition, the embodiments described above can be combined with one another. For instance, the conductive trace can be electroplated on the metal base, regardless of whether the metal base is removed. The embodiments described above can be mixed-and-matched with one another and with other embodiments depending on design and reliability considerations.

Figure 17:
FIGS. 17–21 are top plan views of conductive trace variations in accordance with the present invention.
Figure 18:
Figure 19:
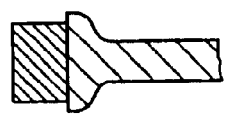
Figure 20:
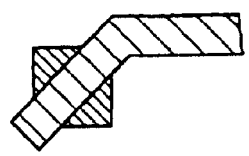
Figure 21:
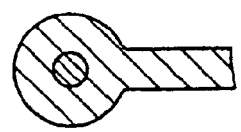

The conductive trace can have various shapes and sizes. The conductive trace can overlap various portions of the pad, such as one peripheral edge and the center of the pad (FIGS. 2L, 6L, 10L and 14L), two opposing peripheral edges and the center of the pad (FIG. 17), three peripheral edges but not the center of the pad (FIGS. 18 and 19), two corners and the center of the pad (FIG. 20) or four peripheral edges but not the center of the pad (FIG. 21).

The conductive trace can be various conductive metals including copper, gold, nickel, silver, palladium, tin, combinations thereof, and alloys thereof. The preferred composition of the conductive trace will depend on the nature of the connection joint as well as design and reliability factors. Furthermore, those skilled in the art will understand that in the context of a semiconductor chip assembly, a copper material is typically a copper alloy that is mostly copper but not pure elemental copper, such copper-zirconium (99.9% copper), copper-silver-phosphorus-magnesium (99.7% copper), or copper-tin-iron-phosphorus (99.7% copper).

The conductive trace may function as a signal, power or ground layer depending on the purpose of the associated chip pad. Likewise, the conductive trace can fan-in or fan-out or both.

The conductive trace can be formed on the metal base by numerous deposition techniques including electroplating and electroless plating.

The conductive trace can be deposited on the metal base as a single layer or multiple layers. For instance, the conductive trace can be a 10 micron layer of gold, or alternatively, a 9.5 micron layer of nickel electroplated on a 0.5 micron layer of gold electroplated on a copper bass to reduce costs, or alternatively, a 9 micron layer of nickel electroplated on a 0.5 micron layer of gold electroplated on a 0.5 micron layer of tin electroplated on a copper base to reduce costs and avoid gold-copper alloys that may be difficult to remove when the copper base is etched. As another example, the conductive trace can consist of a non-copper layer electroplated on a copper base and a copper layer electroplated on the non-copper layer. Suitable non-copper layers include nickel, gold, palladium and silver. After the conductive trace is mechanically attached to the chip by the adhesive, a wet chemical etch can be applied that is highly selective of copper with respect to the non-copper layer to remove the copper base (or the exposed portion of the copper base) without removing the copper or non-copper layers. The non-copper layer provides an etch stop that prevents the wet chemical etch from removing the copper layer. Furthermore, it is understood that in the context of the present invention, the conductive trace and the metal base are different metals (or metallic materials) even if a multi-layer conductive trace includes a single layer that is similar to the metal base (such as the example described above) or a single layer of a mufti-layer metal base.

The conductive trace can be spot plated near the pad to make it compatible with receiving the connection joint. For instance, a copper conductive trace can be spot plated with nickel and then silver to make it compatible with a gold ball bond connection joint and avoid the formation of brittle silver-copper intermetallic compounds.

The conductive trace need not necessarily be flat, and a vertically protruding ball, pad, pillar (columnar post), bumped terminal or contact terminal can be deposited on or integral with the conductive trace and protrude above the insulative base. A pillar is particularly well-suited for reducing thermal mismatch related stress in the next level assembly, and a bumped terminal is particularly well-suited for providing vertical compliance in the next level assembly. Further details regarding conductive traces with various pillars, bumped terminals and contact terminals are set forth in U.S. application Ser. No. 09/878,649 filed Jun. 11, 2001 by Charles W. C. Lin entitled "Method of Making a Semiconductor Chip Assembly with a Conductive Trace Subtractively Formed Before and After Chip Attachment," U.S. application Ser. No. 09/878,626 filed Jun. 11, 2001 by Charles W. C. Lin entitled "Method of Connecting a Conductive Trace to a Semiconductor Chip," U.S. application Ser. No. 09/997,973 filed Nov. 29, 2001 by Charles W. C. Lin et al. entitled "Method of Connecting a Bumped Conductive Trace to a Semiconductor Chip," U.S. application Ser. No. 10/156,277 filed May 28, 2002 by Charles W. C. Lin entitled "Method of Making a Pillar in a Laminated Structure for a Semiconductor Chip Assembly," U.S. application Ser. No. 10/156,469 filed May 28, 2002 by Charles W. C. Lin et al. entitled "Method of Making a Bumped Terminal in a Laminated Structure for a Semiconductor Chip Assembly," U.S. application Ser. No. 10/165,483 filed Jun. 6, 2002 by Charles W. C. Lin et al. entitled "Method of Making a Contact Terminal with a Plated Metal Peripheral Sidewall Portion for a Semiconductor Chip Assembly," U.S. application Ser. No. 10/188,459 filed Jul. 3, 2002 by Charles W. C. Lin et al. entitled "Method of Connecting a Conductive Trace and an Insulative Base to a Semiconductor Chip using Multiple Etch Steps," U.S. application Ser. No. 10/356,372 filed Feb. 1, 2003 by Charles W. C. Lin et al. entitled "Method of Connecting a Conductive Trace and an Insulative Base to a Semiconductor Chip using Multiple Etch Steps," and U.S. application Ser. No. 10/356,800 filed Feb. 1, 2003 by Charles W. C. Lin et al. entitled "Method of Connecting an Additively and Subtractively Formed Conductive Trace and an Insulative Base to a Semiconductor Chip" which are incorporated by reference.

The metal base can be various metals such as copper, copper alloys, nickel, iron-nickel alloys, aluminum, and so on, and can be a single layer or multiple layers.

The metal base need not necessarily be removed. For instance, a portion of the metal base above the pad can be selectively etched to permit formation of the through-hole, and another portion of the metal base that is disposed within the periphery of the chip can remain intact and provide a heat sink. Likewise, the connection joint can be formed over a small portion of the metal base, and the small portion of the metal base can remain embedded between the connection joint and the adhesive or the insulative base.

The laminated structure can be formed with a wide variety of materials through a wide variety of techniques. For instance, laminated structures that consist of a metal base, an insulative base and a metal layer (with the insulative base sandwiched between the metal base and the metal layer) are generally preferred, and laminated structures in which the metal base and the metal layer are copper are suitable due to their widespread availability and tendency to remain flat without warpage. Commercially available laminates such as NEOFLEX™ diclad by Mitsui Chemicals of Tokyo, Japan are suitable. Resin-coated copper (RCC) laminates are also suitable. However, other laminated structures can also be employed.

The metal layer can be etched to form the conductive trace in numerous manners. For instance, a photoresist layer can be formed on the metal layer, the metal layer can be etched using the photoresist layer as an etch mask, and then the photoresist layer can be stripped. Alternatively, a photoresist layer can be formed on the metal layer, a plated metal can be selectively electroplated on the metal layer using the photoresist layer as a plating mask, the photoresist layer can be stripped, and then the metal layer can be etched using the plated metal as an etch mask. For example, the metal layer can be an ultra-thin copper foil with a thickness of 1–3 microns that is attached to an aluminum layer, then the metal layer can be laminated to the insulative base and sandwiched between the aluminum layer and the insulative base, then the aluminum layer can be peeled off the metal layer, the plated metal can be electroplated copper with a thickness of 10–15 microns, and a copper etching solution can be briefly applied to etch completely through the metal layer and remove a few microns of the plated metal. In this manner, the conductive trace can be formed semi-additively and composed of copper and include unetched portions of the metal layer and the plated metal. Likewise, the conductive trace can be formed subtractively from the metal layer, regardless of whether the plated metal etch mask remains attached to the conductive trace.

The pad can have numerous shapes including a flat rectangular shape and a bumped shape. For instance, a bump-shaped pad may extend into the through-hole and may even extend above the conductive trace. The pad can either be partially or completely exposed prior to forming the connection joint. The pad can have a length and width that are larger than, equal to, or smaller than the diameter of the through-hole. Preferably, a substantial portion of the pad is directly beneath the through-hole. If desired, the pad can be treated to accommodate the connection joint.

Numerous adhesives can be applied between the chip and the conductive trace. For instance, the adhesive can be applied as a paste, a laminated layer, or a liquid applied by screen-printing, spin-on, or spray-on. The adhesive can be a single layer that is applied to the conductive trace then contacted to the chip or a single layer that is applied to the chip and then contacted to the conductive trace. Similarly, the adhesive can be multiple layers with a first layer applied to the conductive trace, a second layer applied to the chip and then the layers contacted to one another. Thermosetting adhesive liquids and pastes such as epoxies are generally suitable. Likewise, thermoplastic adhesives such as an insulative thermoplastic polyimide film with a glass transition temperature (Tg) of 400° C. are also generally suitable. Silicone adhesives are also generally suitable.

The through-hole can be formed either before or after mechanically attaching the conductive trace to the chip. For instance, the adhesive can be applied as a liquid or paste (A stage) over the conductive trace, the adhesive can be partially cured (B stage), a back-side etch can form the through-hole in the adhesive, the partially cured adhesive can be brought into contact with the chip, and then the adhesive can be fully cured (C stage). Alternatively, the liquid or paste adhesive can be sandwiched between the chip and the conductive trace, the adhesive can be fully cured thereby mechanically fastening the chip to the conductive trace, and then a front-side etch can form the through-hole in the adhesive.

The through-hole can be formed in numerous manners. For instance, the through-hole can be formed with a single removal step such as mechanical drilling, mechanical punching or laser drilling. For example, the through-hole can be formed through a cover sheet, the metal base, the insulative base and/or the adhesive using laser drilling. Alternatively, the through-hole can be formed with multiple removal steps. For example, the through-hole can be formed through a cover sheet using laser drilling, then through the metal base using wet chemical etching, and then through the insulative base and/or the adhesive using laser drilling. As another example, the through-hole can be defined by a photoresist layer, then formed through the metal base using wet chemical etching, and then through the insulative base and/or the adhesive using laser drilling.

The through-hole can be formed using laser ablation (including laser direct write without a mask and projection laser ablation with a mask) or plasma etching. Similarly, the through-hole can be formed by a combination of laser ablation and plasma etching.

See, for instance, U.S. application Ser. No. 10/302,642 filed Nov. 23, 2002 by Cheng-Lien Chiang et al. entitled "Method of Connecting a Conductive Trace to a Semiconductor Chip Using Plasma Undercut Etching" which is incorporated by reference.

The through-hole can have a circular, ovular, square, rectangular or other shape (as viewed from the top surface of the metal base). The through-hole can be aligned with and expose a single pad or multiple pads and may expose one or more peripheral edges of the pad or just a central portion of the pad spaced from the peripheral edges of the pad. Furthermore, the through-hole can have a wide variety of shapes and slopes including vertical sidewalls, tapered sidewalls, continuous sidewalls and stepped sidewalls.

The insulative base may be rigid or flexible, and can be various dielectric films or prepregs formed from numerous organic or inorganic insulators such as tape (polyimide), epoxy, silicone, glass, aramid and ceramic. Organic insulators are preferred for low cost, high dielectric applications, whereas inorganic insulators are preferred when high thermal dissipation and a matched thermal coefficient of expansion are important. For instance, the insulative base can initially be an epoxy paste that includes an epoxy resin, a curing agent, an accelerator and a filler, that is subsequently cured or hardened to form a solid adherent insulative layer. The filler can be an inert material such as silica (powdered fused quartz) that improves thermal conductivity, thermal shock resistance and thermal coefficient of expansion matching. Organic fiber reinforcement may also be used in resins such as epoxy, cyanate ester, polyimide, PTFE and combinations thereof. Fibers that may be used include aramid, polyester, polyamide, poly-ether-ether-ketone, polyimide, polyetherimide and polysulfone. The fiber reinforcement can be woven fabric, woven glass, random microfiber glass, woven quartz, woven, aramid, non-woven fabric, non-woven aramid fiber or paper.

Commercially available dielectric materials such as SPEEDBOARD C prepreg by W. L. Gore & Associates of Eau Claire, Wis. are suitable.

The insulative base can be disposed over the conductive trace before or after mechanically attaching the conductive trace to the chip. Likewise, the insulative base can be disposed over the conductive trace In numerous manners, including printing and transfer molding.

The insulative base may be disposed between the metal base and the metal layer in numerous manners. For instance, an epoxy resin without reinforcement can be coated onto the metal base and then laminated to the metal base and the metal layer as heat and pressure are applied. Alternatively, a prepreg with reinforcement can be a dry film that is sandwiched between the metal base and the metal layer and then laminated to the metal base and the metal layer as heat and pressure are applied.

The encapsulant can be deposited on the chip using a wide variety of techniques including printing and transfer molding. For instance, the encapsulant can be printed on the chip as an epoxy paste and then cured or hardened to form a solid adherent protective layer. The encapsulant can be any of the adhesives mentioned above. Moreover, the encapsulant need not necessarily contact the chip. For instance, a glob-top coating can be deposited on the chip after mechanically attaching the chip to the conductive trace, and then the encapsulant can be formed on the glob-top coating.

The connection joint can be formed from a wide variety of materials Including copper, gold, nickel, palladium, tin, alloys thereof, and combinations thereof, can be formed by a wide variety of processes including electroplating, electroless plating, ball bonding, solder reflowing and conductive adhesive curing, and can have a wide variety of shapes and sizes. The shape and composition of the connection joint depends on the composition of the conductive trace as well as design and reliability considerations. Further details regarding an electroplated connection joint are disclosed in U.S. application Ser. No. 09/865,367 filed May 24, 2001 by Charles W. C. Lin entited "Semiconductor Chip Assembly with Simultaneously Electroplated Contact Terminal and Connection Joint" which is incorporated by reference. Further details regarding an electrolessly plated connection joint are disclosed in U.S. application Ser. No. 09/864,555 filed May 24, 2001 by Charles W. C. Lin entitled "Semiconductor Chip Assembly with Simultaneously Electrolessly Plated Contact Terminal and Connection Joint" which is incorporated by reference. Further details regarding a ball bond connection joint are disclosed in U.S. application Ser. No. 09/864,773 filed May 24, 2001 by Charles W. C. Lin entitled "Semiconductor Chip Assembly with Ball Bond Connection Joint" which is incorporated by reference. Further details regarding a solder or conductive adhesive connection joint are disclosed in U.S. application Ser. No. 09/927,216 filed Aug. 10, 2001 by Charles W. C. Lin entitled "Semiconductor Chip Assembly with Hardened Connection Joint" which is incorporated by reference.

The connection joint can be formed by a wide variety of plating techniques. For instance, the connection joint can be formed solely by electroplating or electroless plating. Alternatively, the connection joint can be formed by a combination of electroplating and electroless plating. For example, the connection joint can be formed by applying a copper activator solution that renders the through-hole sidewalls at the adhesive and/or the insulative base catalytic to electroless copper, then performing a copper electroless plating operation that deposits a thin electroless copper layer in the throughhole, and then performing a copper electroplating operation that deposits a thick electroplated copper layer on the thin electroless copper layer.

The connection joint can be formed by a wide variety of hardening techniques. For instance, solder paste can be deposited into the through-hole and then hardened during a solder reflow operation. Alternatively, conductive adhesive can be deposited into the through-hole and then hardened during a curing operation.

The connection joint can contact and electrically connect the conductive trace, the pad and the metal base, or alternatively, contact and electrically connect the conductive trace and the pad and be spaced and separated from the metal base.

The connection joint can contact the metal base temporarily or permanently. For instance, the connection joint can contact only inner sidewalls of the metal base such that all of the metal base that contacts the connection joint is exposed to and removed by a subsequent wet chemical etch. In this instance, the connection joint contacts the metal base temporarily. Alternatively, the connection joint can contact a major surface of the metal base that faces away from the chip such that some of the metal base that contacts the connection joint is protected from a subsequent wet chemical etch and remains intact. In this instance, the connection joint contacts the metal base permanently.

After the connection joint is formed, further encapsulation can be performed. For instance, it may be desirable to provide further encapsulation to enhance the mechanical strength of the assembly in the event the encapsulant and/or insulative base is particularly thin or omitted. Likewise, further encapsulation can be used to cover the connection pint.

After the connection joint is formed, if a plating bus exists then it is disconnected from the conductive trace. The plating bus can be disconnected by mechanical sawing, laser cutting, chemical etching, and combinations thereof. If the plating bus is disposed about the periphery of the assembly but is not integral to the assembly, then the plating bus can be disconnected when the assembly is singulated from other assemblies. However, if the plating bus is integral to the assembly, or singulation has already occurred, then a photolithography step can be added to selectively cut related circuitry on the assembly that is dedicated to the plating bus since this circuitry would otherwise short the conductive traces together. Furthermore, the plating bus can be disconnected by etching the metal base.

After the connection joint is formed, a soldering material or solder ball can be deposited over the conductive trace by plating or printing or placement techniques if required for the next level assembly. However, the next level assembly may not require that the semiconductor chip assembly contain solder. For instance, in land grid array (LGA) packages, the soldering material is normally provided by the panel rather than the contact terminals on the semiconductor chip assembly.

The "upper" and "lower" surfaces of the chip and the "top" and "bottom" surfaces of the conductive trace do not depend on the orientation of the assembly, as will be readily apparent to those skilled in the art. For instance, the upper surface of the chip includes the pad and faces the bottom surface of the conductive trace, and the top surface of the conductive trace faces away from the chip, regardless of whether the assembly is inverted and/or mounted on a-printed circuit board. Similarly, the conductive trace is disposed "above" the chip when the bottom surface of the conductive trace faces the upper surface of the chip regardless of whether the assembly is inverted, rotated or slated. Likewise, the conductive trace is shown above the chip, the insulative base is shown above the conductive trace and the adhesive, and the metal base is shown above the conductive trace and the adhesive with a single orientation throughout the drawings for ease of comparison between the figures, although the assembly and its components may be inverted at various manufacturing stages.

The working format for the semiconductor chip assembly can be a single chip, a wafer, a strip or a panel based on the manufacturing design. For instance, when the working format is a wafer, numerous assemblies are simultaneously batch manufactured on a single wafer and then separated from one another during singulation. As another example, when the working format is a strip (or reel-to-reel) form, the chips are individually attached to the strip. Semiconductor chip assemblies manufactured using a strip can be chip scale packages, chip size packages, column grid arrays, or other structures. The wafer-based approach employs fewer steps and is less time consuming than the strip-based approach, however the strip-based approach is easier to control and has better dimensional stability than the wafer-based approach since aligning the conductive traces with the pads involves a single chip rather than the entire wafer.

Advantageously, the semiconductor chip assembly of the present invention is reliable and inexpensive. The adhesive, insulative base and encapsulant protect the chip from handling damage and provide a known dielectric barrier for the conductive trace. The adhesive, insulative base and encapsulant also provide mechanical support for the conductive trace after the metal base is etched. The adhesive, insulative base and encapsulant also protect the assembly from contaminants and unwanted solder reflow during the next level assembly. The mode of the connection shifts from the initial mechanical coupling to metallurgical coupling to assure sufficient metallurgical bond strength. Furthermore, the conductive trace can be mechanically and metallurgically coupled to the chip without wire bonding or TAB, although the process is flexible enough to accommodate these techniques if desired. The process is highly versatile and permits a wide variety of mature connection joint technologies to be used in a unique and improved manner. As a result, the assembly of the present invention significantly enhances throughput, yield and performance characteristics compared to conventional packaging techniques. Moreover, the assembly of the present invention is well-suited for use with materials compatible with copper chip requirements.

Various changes and modifications to the presently preferred embodiments described herein will be apparent to those skilled in the art. For instance, the materials, dimensions and shapes described above are merely exemplary. Such changes and modifications may be made without departing from the spirit and scope of the present invention as defined in the appended claims.

I claim:

1. A method of connecting a conductive trace to a semiconductor chip, comprising:

providing a semiconductor chip, a conductive trace and a metal base, wherein the chip includes a conductive pad, and the conductive trace is disposed between the metal base and the chip; then forming a through-hole that extends through the metal base and exposes the conductive trace and the pad; then forming a connection joint that contacts and electrically connects the conductive trace and the pad in the through-hole; and then etching the metal base, thereby reducing contact area between the metal base and another material.

2. The method of claim 1, including mechanically attaching the chip to the conductive trace using an insulative adhesive before forming the through-hole.

3. The method of claim 2, including forming the through-hole through the adhesive before forming the connection joint.

4. The method of claim 3, wherein the adhesive contacts and is sandwiched between the conducive trace and the pad, and the conductive trace and the pad are electrically isolated from one another after forming the through-hole and before forming the connection joint.

5. The method of claim 1, including:

providing a plating mask on the metal base, wherein the plating mask includes an opening that exposes a portion of the metal base; then electroplating the conductive trace on the exposed portion of the metal base through the opening in the plating mask; and then mechanically attaching the chip to the conductive trace.

6. The method of claim 1, including:

providing a structure that includes the conductive trace, an insulative base and the metal base, wherein the conductive trace and the metal base contact opposite sides of the insulative base; then mechanically attaching the chip to the structure, wherein the conductive trace contacts a side of the insulative base that faces towards the chip, and the metal base contacts a side of the insulative base that faces away from the chip; then forming the through-hole, wherein the through-hole extends through the insulative base; and then forming the connection joint, wherein the connection joint extends into the insulative base.

7. The method of claim 1, wherein forming the connection joint includes electroplating the connection joint on the conductive trace and the pad.

8. The method of claim 1, wherein forming the connection joint includes depositing a non-solidified material on the conductive trace and the pad and then hardening the non-solidified material.

9. The method of claim 1, wherein etching the metal base removes a portion of the metal base that contacts the material such that none of the metal base contacts the material.

10. The method of claim 1, wherein an assembly that includes the chip, the conductive trace and the connection joint is devoid of wire bonds and TAB leads.

11. A method of connecting a conductive trace to a semiconductor chip, comprising:

providing a semiconductor chip that includes a conductive pad;

providing a structure that includes a conductive trace and a metal base; then disposing an adhesive between the chip and the structure, thereby mechanically attaching the chip to the structure, wherein the conductive trace is disposed between the metal base and the chip, and the metal base covers the chip; then forming a through-hole that extends through the metal base and the adhesive and exposes the conductive trace and the pad; then forming a connection joint that contacts and electrically connects the conductive trace and the pad in the through-hole; and then etching the metal base, thereby reducing contact area between the metal base and another material.

12. The method of claim 11, wherein the adhesive contacts and is sandwiched between the conductive trace and the pad, and the conductive trace and the pad are electrically isolated from one another after forming the through-hole and before forming the connection joint.

13. The method of claim 11, wherein forming the through-hole includes applying a wet chemical etch to the metal base, and then applying a laser that ablates the adhesive.

14. The method of claim 11, wherein forming the connection joint includes electroplating the connection joint on the conductive trace and the pad.

15. The method of claim 11, wherein forming the connection joint includes depositing a non-solidified material that includes solder or conductive adhesive on the conductive trace and the pad and then hardening the non-solidified material.

16. The method of claim 11, wherein etching the metal base removes a portion of the metal base that contacts the material such that none of the metal base contacts the material.

17. The method of claim 11, wherein etching the metal base removes a portion of the metal base that overlaps the chip such that none of the metal base overlaps the chip.

18. The method of claim 11, including:

providing a plating mask on the metal base, wherein the plating mask includes an opening that exposes a portion of the metal base; and then electroplating the conductive trace on the exposed portion of the metal base through the opening in the plating mask.

19. The method of claim 11, including:

providing a structure that includes the conductive trace, an insulative base and the metal base, wherein the conductive trace and the metal base contact opposite sides of the insulative base; then mechanically attaching the chip to the structure using the adhesive, wherein the conductive trace contacts a side of the insulative base that faces towards the chip, and the metal base contacts a side of the insulative base that faces away from the chip; then forming the through-hole, wherein the through-hole extends through the insulative base; and then forming the connection joint, wherein the connection joint extends into the insulative base.

20. The method of claim 11, wherein an assembly that includes the chip, the conductive trace, the adhesive and the connection joint is devoid of wire bonds and TAB leads.

21. A method of connecting a conductive trace to a semiconductor chip, comprising:

providing a semiconductor chip that includes a conductive pad;

attaching a conductive trace to a metal base; then disposing an insulative adhesive between the chip and the conductive trace, thereby mechanically attaching the chip to the conductive trace such that the metal base is disposed on a side of the conductive trace that faces away from the chip; then forming a through-hole that extends through the metal base and the adhesive and exposes the conductive trace and the pad; then forming a connection joint that contacts and electrically connects the conductive trace and the pad in the through-hole; and then etching the metal base, thereby reducing contact area between the metal base and the conductive trace.

22. The method of claim 21, wherein disposing the adhesive includes contacting the adhesive to the metal base, the conductive trace and the chip.

23. The method of claim 21, wherein the adhesive is coplanar with and adjacent to a surface of the conductive trace that contacts the metal base and faces away from the chip after mechanically attaching the chip to the conductive trace and before forming the through-hole.

24. The method of claim 21, wherein attaching the conductive trace to the metal base includes:

providing a plating mask on the metal base, wherein the plating mask includes an opening that exposes a portion of the metal base; then electroplating the conductive trace on the exposed portion of the metal base through the opening in the plating mask; and then removing the plating mask.

25. The method of claim 21, wherein the conductive trace overlaps the pad after mechanically attaching the chip to the conductive trace.

26. The method of claim 21, wherein the conductive trace extends within and outside a periphery of the chip after mechanically attaching the chip to the conductive trace.

27. The method of claim 21, wherein forming the through-hole includes applying a wet chemical etch to the metal base.

28. The method of claim 21, wherein forming the through-hole includes applying a laser that ablates the adhesive.

29. The method of claim 21, wherein forming the through-hole includes applying a wet chemical etch to the metal base, and then applying a laser that ablates the adhesive.

30. The method of claim 21, wherein the through-hole is aligned with the pad.

31. The method of claim 21, wherein the through-hole does not extend through the conductive trace.

32. The method of claim 21, wherein forming the connection joint includes electroplating the connection joint on the conductive trace and the pad.

33. The method of claim 32, wherein forming the connection joint includes initially electroplating the connection joint on the conductive trace, and then electroplating the connection joint on the pad.

34. The method of claim 21, wherein forming the connection joint includes depositing a non-solidified material into the through-hole that contacts the conductive trace, the adhesive and the pad, and then hardening the non-solidified material.

35. The method of claim 34, wherein the non-solidified material includes solder or conductive adhesive.

36. The method of claim 21, wherein forming the connection joint includes depositing solder paste into the through-hole and then reflowing the solder paste.

37. The method of claim 21, wherein forming the connection joint includes depositing conductive adhesive into the through-hole and then curing the conductive adhesive.

38. The method of claim 21, wherein the connection joint contacts a surface of the conductive trace that is disposed above and overlaps and faces away from the pad.

39. The method of claim 21, wherein the connection joint contacts a peripheral sidewall of the conductive trace that is disposed above and overlaps and faces away from the pad.

40. The method of claim 21, wherein the connection joint contacts opposing peripheral sidewalls of the conductive trace that are disposed above and overlap and are orthogonal to the pad.

41. The method of claim 21, wherein the connection joint is the only electrical conductor external to the chip that contacts the pad.

42. The method of claim 21, wherein the connection joint and the adhesive are the only materials external to the chip that contact the pad.

43. The method of claim 21, wherein the connection joint and the adhesive are the only materials that contact both the conductive trace and the pad.

44. The method of claim 21, wherein forming the through-hole and the connection joint includes:
   forming a mask on a surface of the metal base that faces away from the chip;
   forming the through-hole through the mask, the metal base and the adhesive; then
   forming the connection joint, wherein the mask prevents the connection joint from contacting selected portions of the metal base; and then
   removing the mask.

45. The method of claim 21, wherein etching the metal base electrically isolates the pad from other conductive pads of the chip.

46. The method of claim 21, wherein etching the metal base removes a portion of the metal base that contacts the conductive trace such that none of the metal base contacts the conductive trace.

47. The method of claim 21, wherein etching the metal base removes a portion of the metal base that overlaps the chip such that none of the metal base overlaps the chip.

48. The method of claim 21, wherein etching the metal base removes the metal base.

49. The method of claim 21, including forming an encapsulant that contacts and covers a side of the chip that faces away from the conductive trace after mechanically attaching the chip to the conductive trace.

50. The method of claim 21, wherein an assembly that includes the chip, the conductive trace, the adhesive and the connection joint is devoid of wire bonds and TAB leads.

51. A method of connecting a conductive trace to a semiconductor chip, comprising:
   providing a semiconductor chip that includes a conductive pad;
   attaching a conductive trace to a metal base; then
   disposing an insulative adhesive between the chip and the conductive trace, thereby mechanically attaching the chip to the conductive trace such that the metal base is disposed on a side of the conductive trace that faces away from the chip, the metal base covers the chip, and the conductive trace extends within and outside a periphery of the chip and overlaps the pad; then
   forming a mask on a side of the metal base that faces away from the chip;
   forming a through-hole that extends through the mask, the metal base and the adhesive, does not extend through the conductive trace, and exposes the conductive trace and the pad; then
   forming a connection joint that contacts and electrically connects the conductive trace and the pad in the throughhole, wherein the mask prevents the connection joint from contacting selected portions of the metal base; then
   removing the mask; and then
   etching the metal base, thereby reducing contact area between the metal base and the conductive trace.

52. The method of claim 51, wherein attaching the conductive trace to the metal base includes:
   providing a plating mask on the metal base, wherein the plating mask includes an opening that exposes a portion of the metal base; then
   electroplating the conductive trace on the exposed portion of the metal base through the opening in the plating mask; and then
   removing the plating mask.

53. The method of claim 51, wherein forming the through-hole includes applying a wet chemical etch to the metal base using the mask as an etch mask, and then applying a laser that ablates the adhesive.

54. The method of claim 51, wherein forming the connection joint includes initially electroplating the connection joint on the conductive trace using the mask as a plating mask, and then electroplating the connection joint on the pad.

55. The method of claim 51, wherein forming the connection joint includes depositing a non-solidified material that includes solder or conductive adhesive into the through-hole that contacts the conductive trace, the adhesive and the pad in the through-hole using the mask as a deposition mask, and then hardening the non-solidified material.

56. The method of claim 51, wherein the connection joint contacts a surface of the conductive trace that is disposed above and overlaps and faces away from the pad, and the connection joint contacts opposing peripheral sidewalls of the conductive trace that are disposed above and overlap and are orthogonal to the pad.

57. The method of claim 51, wherein the connection joint is the only electrical conductor external to the chip that contacts the pad, the connection joint and the adhesive are the only materials external to the chip that contact the pad, and the connection joint and the adhesive are the only materials that contact both the conductive trace and the pad.

58. The method of claim 51, wherein etching the metal base electrically isolates the pad from other conductive pads of the chip.

59. The method of claim 51, wherein etching the metal base removes a portion of the metal base that contacts the conductive trace such that none of the metal base contacts the conductive trace.

60. The method of claim 51, wherein etching the metal base removes a portion of the metal base that overlaps the chip such that none of the metal base overlaps the chip.

61. A method of connecting a conductive trace to a semiconductor chip, comprising:
   providing a semiconductor chip that includes a conductive pad;
   providing a laminated structure that includes a conductive trace, an insulative base and a metal base; then
   disposing an insulative adhesive between the chip and the laminated structure, thereby mechanically attaching the chip to the laminated structure such that the metal base is disposed on a side of the insulative base that faces away from the chip, and the conductive trace is disposed on a side of the insulative base that faces towards the chip; then
   forming a through-hole that extends through the metal base, the insulative base and the adhesive and exposes the conductive trace and the pad; then
   forming a connection joint that contacts and electrically connects the conductive trace and the pad in the through-hole; and then
   etching the metal base, thereby reducing contact area between the metal base and the insulative base.

62. The method of claim 61, wherein disposing the adhesive includes contacting the adhesive to the conductive trace, the insulative base and the chip.

63. The method of claim 61, wherein the adhesive is coplanar with and adjacent to a surface of the conductive trace that contacts the insulative base and faces away from the chip after mechanically attaching the chip to the laminated structure and before forming the through-hole.

64. The method of claim 61, wherein forming the conductive trace includes:
   providing a metal layer in contact with the insulative base;
   forming an etch mask on the metal layer; and
   etching the metal layer using the etch mask to selectively protect the metal layer such that the conductive trace includes an unetched portion of the metal layer.

65. The method of claim 61, wherein the conductive trace overlaps the pad after mechanically attaching the chip to the laminated structure.

66. The method of claim 61, wherein the conductive trace extends within and outside a periphery of the chip after mechanically attaching the chip to the laminated structure.

67. The method of claim 61, wherein forming the through-hole includes applying a wet chemical etch to the metal base.

68. The method of claim 61, wherein forming the through-hole includes applying a laser that ablates the insulative base and the adhesive.

69. The method of claim 61, wherein forming the through-hole includes applying a wet chemical etch to the metal base, and then applying a laser that ablates the insulative base and the adhesive.

70. The method of claim 61, wherein the through-hole is aligned with the pad.

71. The method of claim 61, wherein the through-hole does not extend through the conductive trace.

72. The method of claim 61, wherein forming the connection joint includes electroplating the connection joint on the conductive trace and the pad.

73. The method of claim 72, wherein forming the connection joint includes electroplating the connection joint on the conductive trace, and then electroplating the connection joint on the pad.

74. The method of claim 61, wherein forming the connection joint includes depositing a non-solidified material into the through-hole that contacts the conductive trace, the insulative base, the adhesive and the pad, and then hardening the non-solidified material.

75. The method of claim 74, wherein the non-solidified material includes solder or conductive adhesive.

76. The method of claim 61, wherein forming the connection joint includes depositing solder paste into the through-hole and then reflowing the solder paste.

77. The method of claim 61, wherein forming the connection joint includes depositing conductive adhesive into the through-hole and then curing the conductive adhesive.

78. The method of claim 61, wherein the connection joint contacts a surface of the conductive trace that is disposed above and overlaps and faces away from the pad.

79. The method of claim 61, wherein the connection joint contacts a peripheral sidewall of the conductive trace that is disposed above and overlaps and faces away from the pad.

80. The method of claim 61, wherein the connection joint contacts opposing peripheral sidewalls of the conductive trace that are disposed above and overlap and are orthogonal to the pad.

81. The method of claim 61, wherein the connection joint is the only electrical conductor external to the chip that contacts the pad.

82. The method of claim 61, wherein the connection joint and the adhesive are the only materials external to the chip that contact the pad.

83. The method of claim 61, wherein the connection joint and the adhesive are the only materials that contact both the conductive trace and the pad.

84. The method of claim 61, wherein forming the through-hole and the connection joint includes:
   forming a mask on a surface of the metal base that faces away from the chip;
   forming the through-hole through the mask, the metal base, the insulative base and the adhesive; then
   forming the connection joint, wherein the mask prevents the connection joint from contacting selected portions of the metal base; and then
   removing the mask.

85. The method of claim 61, wherein etching the metal base electrically isolates the pad from other conductive pads of the chip.

86. The method of claim 61, wherein etching the metal base removes a portion of the metal base that contacts the insulative base such that none of the metal base contacts the insulative base.

87. The method of claim 61, wherein etching the metal base removes a portion of the metal base that overlaps the chip such that none of the metal base overlaps the chip.

88. The method of claim 61, wherein etching the metal base removes the metal base.

89. The method of claim 61, including forming an encapsulant that contacts and covers a side of the chip that faces away from the conductive trace after mechanically attaching the chip to the laminated structure.

90. The method of claim 61, wherein an assembly that includes the chip, the conductive trace, the adhesive and the connection pint is devoid of wire bonds and TAB leads.

91. A method of connecting a conductive trace to a semiconductor chip, comprising:
   providing a semiconductor chip that includes a conductive pad;
   providing a laminated structure that includes a conductive trace, an insulative base and a metal base; then disposing an insulative adhesive between the chip and the laminated structure, thereby mechanically attaching the chip to the laminated structure such that the metal base is disposed on a side of the insulative base that faces away from the chip, the metal base covers the chip, the conductive trace is disposed on a side of the insulative base that faces towards the chip, and the conductive trace extends within and outside a periphery of the chip and overlaps the pad; then forming a mask on a side of the metal base that faces away from the chip;

forming a through-hole that extends through the mask, the metal base, the insulative base and the adhesive, does not extend through the conductive trace, and exposes the conductive trace and the pad; then forming a connection joint that contacts and electrically connects the conductive trace and the pad in the through-hole, wherein the mask prevents the connection joint from contacting selected portions of the metal base; then removing the mask; and then etching the metal base, thereby reducing contact area between the metal base and the insulative base.

92. The method of claim 91, wherein forming the conductive trace includes:

providing a metal layer in contact with the insulative base;

forming an etch mask on the metal layer, and etching the metal layer using the etch mask to selectively protect the metal layer such that the conductive trace includes an unetched portion of the metal layer.

93. The method of claim 91, wherein forming the through-hole includes applying a wet chemical etch to the metal base using the mask as an etch mask, and then applying a laser that ablates the insulative base and the adhesive.

94. The method of claim 91, wherein forming the connection joint includes electroplating the connection joint on the conductive trace, and then electroplating the connection joint on the pad.

95. The method of claim 91, wherein forming the connection joint includes depositing a non-solidified material that includes solder or conductive adhesive into the through-hole that contacts the conductive trace, the insulative base, the adhesive and the pad in the through-hole using the mask as a deposition mask, and then hardening the non-solidified material.

96. The method of claim 91, wherein the connection joint contacts a surface of the conductive trace that is disposed above and overlaps and faces away from the pad, and the connection joint contacts opposing peripheral sidewalls of the conductive trace that are disposed above and overlap and are orthogonal to the pad.

97. The method of claim 91, wherein the connection joint is the only electrical conductor external to the chip that contacts the pad, the connection joint and the adhesive are the only materials external to the chip that contact the pad, and the connection joint and the adhesive are the only materials that contact both the conductive trace and the pad.

98. The method of claim 91, wherein etching the metal base electrically isolates the pad from other conductive pads of the chip.

99. The method of claim 91, wherein etching the metal base removes a portion of the metal base that contacts the insulative base such that none of the metal base contacts the insulative base.

100. The method of claim 91, wherein etching the metal base removes a portion of the metal base that overlaps the chip such that none of the metal base overlaps the chip.

101. A method of connecting a conductive trace to a semiconductor chip, comprising:

providing a semiconductor chip, a conductive trace and a metal base, wherein the chip includes a conductive pad, and the conductive trace is disposed between the metal base and the chip; then forming a through-hole that extends through the metal base and exposes the conductive trace and the pad; then forming a connection joint that contacts and electrically connects the metal base, the conductive trace and the pad in the through-hole; and then etching the metal base, thereby reducing contact area between the metal base and the connection joint.

102. The method of claim 101, including mechanically attaching the chip to the conductive trace using an insulative adhesive before forming the through-hole.

103. The method of claim 102, including forming the through-hole through the adhesive before forming the connection joint.

104. The method of claim 103, wherein the adhesive contacts and is sandwiched between the conductive trace and the pad, and the conductive trace and the pad are electrically isolated from one another after forming the through-hole and before forming the connection joint.

105. The method of claim 101, including:

providing a plating mask on the metal base, wherein the plating mask includes an opening that exposes a portion of the metal base; then electroplating the conductive trace on the exposed portion of the metal base through the opening in the plating mask; and then mechanically attaching the chip to the conductive trace.

106. The method of claim 101, including:

providing a structure that includes the conductive trace, an insulative base and the metal base, wherein the conductive trace and the metal base contact opposite sides of the insulative base; then mechanically attaching the chip to the structure, wherein the conductive trace contacts a side of the insulative base that faces towards the chip, and the metal base contacts a side of the insulative base that faces away from the chip; then forming the through-hole, wherein the through-hole extends through the insulative base; and then forming the connection joint, wherein the connection joint extends through the insulative base.

107. The method of claim 101, wherein forming the connection joint includes electroplating the connection joint on the metal base, the conductive trace and the pad.

108. The method of claim 101, wherein forming the connection joint includes depositing a non-solidified material on the metal base, the conductive trace and the pad and then hardening the non-solidified material.

109. The method of claim 101, wherein etching the metal base removes a portion of the metal base that contacts the connection joint such that none of the metal base contacts the connection joint.

110. The method of claim 101, wherein an assembly that includes the chip, the conductive trace and the connection joint is devoid of wire bonds and TAB leads.

111. A method of connecting a conductive trace to a semiconductor chip, comprising:

providing a semiconductor chip that includes a conductive pad;

providing a structure that includes a conductive trace and a metal base; then disposing an adhesive between the chip and the structure, thereby mechanically attaching the chip to the structure, wherein the conductive trace is disposed between the metal base and the chip, and the metal base covers the chip; then forming a through-hole that extends through the metal base and the adhesive and exposes the conductive trace and the pad; then forming a connection joint that contacts and electrically connects the metal base, the conductive trace and the pad in the through-hole; and then etching the metal base, thereby reducing contact area between the metal base and the connection joint.

112. The method of claim 111, wherein the adhesive contacts and is sandwiched between the conductive trace and the pad, and the conductive trace and the pad are electrically isolated from one another after forming the through-hole and before forming the connection joint.

113. The method of claim 111, wherein forming the through-hole includes applying a wet chemical etch to the metal base, and then applying a laser that ablates the adhesive.

114. The method of claim 111, wherein forming the connection joint includes electroplating the connection joint on the metal base, the conductive trace and the pad.

115. The method of claim 111, wherein forming the connection joint includes depositing a non-solidified material that includes solder or conductive adhesive on the metal base, the conductive trace and the pad and then hardening the non-solidified material.

116. The method of claim 111 wherein etching the metal base removes a portion of the metal base that contacts the connection joint such that none of the metal base contacts the connection joint.

117. The method of claim 111, wherein etching the metal base removes a portion of the metal base that overlaps the chip such that none of the metal base overlaps the chip.

118. The method of claim 111, including:

providing a plating mask on the metal base, wherein the plating mask includes an opening that exposes a portion of the metal base; and then electroplating the conductive trace on the exposed portion of the metal base through the opening in the plating mask.

119. The method of claim 111, including:

providing a structure that includes the conductive trace, an insulative base and the metal base, wherein the conductive trace and the metal base contact opposite sides of the insulative base; then mechanically attaching the chip to the structure using the adhesive, wherein the conductive trace contacts a side of the insulative base that faces towards the chip, and the metal base contacts a side of the insulative base that faces away from the chip; then forming the through-hole, wherein the through-hole extends through the insulative base; and then forming the connection joint, wherein the connection joint extends through the insulative base.

120. The method of claim 111, wherein an assembly that includes the chip, the conductive trace, the adhesive and the connection joint is devoid of wire bonds and TAB leads.

121. A method of connecting a conductive trace to a semiconductor chip, comprising:

providing a semiconductor chip that includes a conductive pad;

attaching a conductive trace to a metal base; then disposing an insulative adhesive between the chip and the conductive trace, thereby mechanically attaching the chip to the conductive trace such that the metal base is disposed on a side of the conductive trace that faces away from the chip; then forming a through-hole that extends through the metal base and the adhesive and exposes the conductive trace and the pad; then forming a connection joint that contacts and electrically connects the metal base, the conductive trace and the pad in the through-hole; and then etching the metal base, thereby reducing contact area between the metal base and the connection joint.

122. The method of claim 121, wherein disposing the adhesive includes contacting the adhesive to the metal base, the conductive trace and the chip.

123. The method of claim 121, wherein the adhesive is coplanar with and adjacent to a surface of the conductive trace that contacts the metal base and faces away from the chip after mechanically attaching the chip to the conductive trace and before forming the through-hole.

124. The method of claim 121, wherein attaching the conductive trace to the metal base includes:

providing a plating mask on the metal base, wherein the plating mask includes an opening that exposes a portion of the metal base; then electroplating the conductive trace on the exposed portion of the metal base through the opening in the plating mask; and then removing the plating mask.

125. The method of claim 121, wherein the conductive trace overlaps the pad after mechanically attaching the chip to the conductive trace.

126. The method of claim 121, wherein the conductive trace extends within and outside a periphery of the chip after mechanically attaching the chip to the conductive trace.

127. The method of claim 121, wherein forming the through-hole includes applying a wet chemical etch to the metal base.

128. The method of claim 121, wherein forming the through-hole includes applying a laser that ablates the adhesive.

129. The method of claim 121, wherein forming the throughhole includes applying a wet chemical etch to the metal base, and then applying a laser that ablates the adhesive.

130. The method of claim 121, wherein the through-hole is aligned with the pad.

131. The method of claim 121, wherein the through-hole does not extend through the conductive trace.

132. The method of claim 121, wherein forming the connection joint includes electroplating the connection joint on the metal base, the conductive trace and the pad.

133. The method of claim 132, wherein forming the connection joint includes initially electroplating the connection joint on the metal base and the conductive trace, and then electroplating the connection joint on the pad.

134. The method of claim 121, wherein forming the connection joint includes depositing a non-solidified material into the through-hole that contacts the metal base, the conductive trace, the adhesive and the pad, and then hardening the non-solidified material.

135. The method of claim 134, wherein the non-solidified material includes solder or conductive adhesive.

136. The method of claim 121, wherein forming the connection joint includes depositing solder paste into the through-hole and then reflowing the solder paste.

137. The method of claim 121, wherein forming the connection joint includes depositing conductive adhesive into the through-hole and then curing the conductive adhesive.

138. The method of claim 121, wherein the connection joint contacts a surface of the conductive trace that is disposed above and overlaps and faces away from the pad.

139. The method of claim 121, wherein the connection joint contacts a peripheral sidewall of the conductive trace that is disposed above and overlaps and faces away from the pad.

140. The method of claim 121, wherein the connection joint contacts opposing peripheral sidewalls of the conductive trace that are disposed above and overlap and are orthogonal to the pad.

141. The method of claim 121, wherein the connection joint is the only electrical conductor external to the chip that contacts the pad.

142. The method of claim 121, wherein the connection joint and the adhesive are the only materials external to the chip that contact the pad.

143. The method of claim 121, wherein the connection joint and the adhesive are the only materials that contact both the conductive trace and the pad.

144. The method of claim 121, wherein forming the through-hole and the connection joint includes:
forming a mask on a surface of the metal base that faces away from the chip;
forming the through-hole through the mask, the metal base and the adhesive; then
forming the connection joint, wherein the mask prevents the connection joint from contacting selected portions of the metal base; and then
removing the mask.

145. The method of claim 121, wherein etching the metal base electrically isolates the pad from other conductive pads of the chip.

146. The method of claim 121, wherein etching the metal base removes a portion of the metal base that contacts the connection joint such that none of the metal base contacts the connection joint.

147. The method of claim 121, wherein etching the metal base removes a portion of the metal base that overlaps the chip such that none of the metal base overlaps the chip.

148. The method of claim 121, wherein etching the metal base removes the metal base.

149. The method of claim 121, including forming an encapsulant that contacts and covers a side of the chip that faces away from the conductive trace after mechanically attaching the chip to the conductive trace.

150. The method of claim 121, wherein an assembly that includes the chip, the conductive trace, the adhesive and the connection joint is devoid of wire bonds and TAB leads.

151. A method of connecting a conductive trace to a semiconductor chip, comprising:
providing a semiconductor chip that includes a conductive pad;
attaching a conductive trace to a metal base; then
disposing an insulative adhesive between the chip and the conductive trace, thereby mechanically attaching the chip to the conductive trace such that the metal base is disposed on a side of the conductive trace that faces away from the chip, the metal base covers the chip, and the conductive trace extends within and outside a periphery of the chip and overlaps the pad; then
forming a mask on a side of the metal base that faces away from the chip;
forming a through-hole that extends through the mask, the metal base and the adhesive, does not extend through the conductive trace, and exposes the conductive trace and the pad; then
forming a connection joint that contacts and electrically connects the metal base, the conductive trace and the pad in the through-hole, wherein the mask prevents the connection joint from contacting selected portions of the metal base; then
removing the mask; and then
etching the metal base, thereby reducing contact area between the metal base and the connection joint.

152. The method of claim 151, wherein attaching the conductive trace to the metal base includes:
providing a plating mask on the metal base, wherein the plating mask includes an opening that exposes a portion of the metal base; then
electroplating the conductive trace on the exposed portion of the metal base through the opening in the plating mask; and then
removing the plating mask.

153. The method of claim 151, wherein forming the through-hole includes applying a wet chemical etch to the metal base using the mask as an etch mask, and then applying a laser that ablates the adhesive.

154. The method of claim 151, wherein forming the connection joint includes initially electroplating the connection joint on the metal base and the conductive trace using the mask as a plating mask, and then electroplating the connection joint on the pad.

155. The method of claim 151, wherein forming the connection joint includes depositing a non-solidified material that includes solder or conductive adhesive into the through-hole that contacts the metal base, the conductive trace, the adhesive and the pad in the through-hole using the mask as a deposition mask, and then hardening the, non-solidified material.

156. The method of claim 151, wherein the connection joint contacts a surface of the conductive trace that is disposed above and overlaps and faces away from the pad, and the connection joint contacts opposing peripheral sidewalls of the conductive trace that are disposed above and overlap and are orthogonal to the pad.

157. The method of claim 151, wherein the connection joint is the only electrical conductor external to the chip that contacts the pad, the connection joint and the adhesive are the only materials external to the chip that contact the pad, and the connection joint and the adhesive are the only materials that contact both the conductive trace and the pad.

158. The method of claim 151, wherein etching the metal base electrically isolates the pad from other conductive pads of the chip.

159. The method of claim 151, wherein etching the metal base removes a portion of the metal base that contacts the connection joint such that none of the metal base contacts the connection joint.

160. The method of claim 151, wherein etching the metal base removes a portion of the metal base that overlaps the chip such that none of the metal base overlaps the chip.

161. A method of connecting a conductive trace to a semiconductor chip, comprising:
providing a semiconductor chip that includes a conductive pad;

providing a laminated structure that includes a conductive trace, an insulative base and a metal base; then disposing an insulative adhesive between the chip and the laminated structure, thereby mechanically attaching the chip to the laminated structure such that the metal base is disposed on a side of the insulative base that faces away from the chip, and the conductive trace is disposed on a side of the insulative base that faces towards the chip; then forming a through-hole that extends through the metal base, the insulative base and the adhesive and exposes the conductive trace and the pad; then forming a connection joint that contacts and electrically connects the metal base, the conductive trace and the pad in the through-hole; and then etching the metal base, thereby reducing contact area between the metal base and the connection joint.

162. The method of claim 161, wherein disposing the adhesive includes contacting the adhesive to the conductive trace, the insulative base and the chip.

163. The method of claim 161, wherein the adhesive is coplanar with and adjacent to a surface of the conductive trace that contacts the insulative base and faces away from the chip after mechanically attaching the chip to the laminated structure and before forming the through-hole.

164. The method of claim 161, wherein forming the conductive trace includes:

providing a metal layer in contact with the insulative base;

forming an etch mask on the metal layer; and etching the metal layer using the etch mask to selectively protect the metal layer such that the conductive trace includes an unetched portion of the metal layer.

165. The method of claim 161, wherein the conductive trace overlaps the pad after mechanically attaching the chip to the laminated structure.

166. The method of claim 161, wherein the conductive trace extends within and outside a periphery of the chip after mechanically attaching the chip to the laminated structure.

167. The method of claim 161, wherein forming the through-hole includes applying a wet chemical etch to the metal base.

168. The method of claim 161, wherein forming the through-hole includes applying a laser that ablates the insulative base and the adhesive.

169. The method of claim 161, wherein forming the through-hole includes applying a wet chemical etch to the metal base, and then applying a laser that ablates the insulative base and the adhesive.

170. The method of claim 161, wherein the through-hole is aligned with the pad.

171. The method of claim 161, wherein the through-hole does not extend through the conductive trace.

172. The method of claim 161, wherein forming the connection joint includes electroplating the connection joint on the metal base, the conductive trace and the pad.

173. The method of claim 172, wherein forming the connection joint includes initially electroplating the connection joint on the metal base, then electroplating the connection joint on the conductive trace, and then electroplating the connection joint on the pad.

174. The method of claim 161, wherein forming the connection joint includes depositing a non-solidified material into the through-hole that contacts the metal base, the conductive trace, the insulative base, the adhesive and the pad, and then hardening the non-solidified material.

175. The method of claim 174, wherein the non-solidified material includes solder or conductive adhesive.

176. The method of claim 161, wherein forming the connection joint includes depositing solder paste into the through-hole and then reflowing the solder paste.

177. The method of claim 161, wherein forming the connection joint includes depositing conductive adhesive into the through-hole and then curing the conductive adhesive.

178. The method of claim 161, wherein the connection joint contacts a surface of the conductive trace that is disposed above and overlaps and faces away from the pad.

179. The method of claim 161, wherein the connection joint contacts a peripheral sidewall of the conductive trace that is disposed above and overlaps and faces away from the pad.

180. The method of claim 161, wherein the connection joint contacts opposing peripheral sidewalls of the conductive trace that are disposed above and overlap and are orthogonal to the pad.

181. The method of claim 161, wherein the connection joint is the only electrical conductor external to the chip that contacts the pad.

182. The method of claim 161, wherein the connection joint and the adhesive are the only materials external to the chip that contact the pad.

183. The method of claim 161, wherein the connection joint and the adhesive are the only materials that contact both the conductive trace and the pad.

184. The method of claim 161, wherein forming the through-hole and the connection joint includes:

forming a mask on a surface of the metal base that faces away from the chip;

forming the through-hole through the mask, the metal base, the insulative base and the adhesive; then forming the connection joint, wherein the mask prevents the connection joint from contacting selected portions of the metal base; and then removing the mask.

185. The method of claim 161, wherein etching the metal base electrically isolates the pad from other conductive pads of the chip.

186. The method of claim 161, wherein etching the metal base removes a portion of the metal base that contacts the connection joint such that none of the metal base contacts the connection joint.

187. The method of claim 161, wherein etching the metal base removes a portion of the metal base that overlaps the chip such that none of the metal base overlaps the chip.

188. The method of claim 161, wherein etching the metal base removes the metal base.

189. The method of claim 161, including forming an encapsulant that contacts and covers a side of the chip that faces away from the conductive trace after mechanically attaching the chip to the laminated structure.

190. The method of claim 161, wherein an assembly that includes the chip, the conductive trace, the adhesive and the connection joint is devoid of wire bonds and TAB leads.

191. A method of connecting a conductive trace to a semiconductor chip, comprising:

providing a semiconductor chip that includes a conductive pad;

providing a laminated structure that includes a conductive trace, an insulative base and a metal base; then disposing an insulative adhesive between the chip and the laminated structure, thereby mechanically attaching the chip to the laminated structure such that the metal base is disposed on a side of the insulative base that faces away from the chip, the metal base covers the chip, the conductive trace is disposed on a side of the insulative base that faces towards the chip, and the conductive trace extends within and outside a periphery of the chip and overlaps the pad; then forming a mask on a side of the metal base that faces away from the chip;

forming a through-hole that extends through the mask, the metal base, the insulative base and the adhesive, does not extend through the conductive trace, and exposes the conductive trace and the pad; then forming a connection joint that contacts and electrically connects the metal base, the conductive trace and the pad in the through-hole, wherein the mask prevents the connection joint from contacting selected portions of the metal base; then removing the mask; and then etching the metal base, thereby reducing contact area between the metal base and the connection joint.

192. The method of claim 191, wherein forming the conductive trace includes:

providing a metal layer in contact with the insulative base;

forming an etch mask on the metal layer, and etching the metal layer using the etch mask to selectively protect the metal layer such that the conductive trace includes an unetched portion of the metal layer.

193. The method of claim 191, wherein forming the through-hole includes applying a wet chemical etch to the metal base using the mask as an etch mask, and then applying a laser that ablates the insulative base and the adhesive.

194. The method of claim 191, wherein forming the connection joint includes initially electroplating the connection joint on the metal base using the mask as a plating mask, then electroplating the connection joint on the conductive trace, and then electroplating the connection joint on the pad.

195. The method of claim 191, wherein forming the connection joint includes depositing a non-solidified material that includes solder or conductive adhesive into the through-hole that contacts the metal base, the conductive trace, the insulative base, the adhesive and the pad in the through-hole using the mask as a deposition mask, and then hardening the non-solidified material.

196. The method of claim 191, wherein the connection joint contacts a surface of the conductive trace that is disposed above and overlaps and faces away from the pad, and the connection joint contacts opposing peripheral sidewalls of the conductive trace that are disposed above and overlap and are orthogonal to the pad.

197. The method of claim 191, wherein the connection joint is the only electrical conductor external to the chip that contacts the pad, the connection joint and the adhesive are the only materials external to the chip that contact the pad, and the connection joint and the adhesive are the only materials that contact both the conductive trace and the pad.

198. The method of claim 191, wherein etching the metal base electrically isolates the pad from other conductive pads of the chip.

199. The method of claim 191, wherein etching the metal base removes a portion of the metal base that contacts the connection joint such that none of the metal base contacts the connection joint.

200. The method of claim 191, wherein etching the metal base removes a portion of the metal base that overlaps the chip such that none of the metal base overlaps the chip.

* * * * *

UNITED STATES PATENT AND TRADEMARK OFFICE
CERTIFICATE OF CORRECTION

PATENT NO. : 6,908,788 B1
DATED : June 21, 2005
INVENTOR(S) : Charles W.C. Lin

It is certified that error appears in the above-identified patent and that said Letters Patent is hereby corrected as shown below:

Column 15,
Line 52, change "1F" to -- 11F --.

Column 29,
Line 23, change "faces away from" to -- is orthogonal to --.

Column 30,
Line 19, change "throughhole" to -- through-hole --.

Column 32,
Line 19, change "faces away from" to -- is orthogonal to --.

Column 37,
Line 13, change "faces away from" to -- is orthogonal to --.

Column 40,
Line 13, change "faces away from" to -- is orthogonal to --.

Signed and Sealed this

Twenty-seventh Day of September, 2005

JON W. DUDAS
*Director of the United States Patent and Trademark Office*